(12) United States Patent
Chen et al.

(10) Patent No.: US 8,375,280 B2
(45) Date of Patent: Feb. 12, 2013

(54) OPTIMUM DISTANCE SPECTRUM FEEDFORWARD TAIL-BITING CONVOLUTIONAL CODES

(75) Inventors: Tsao-Tsen (Jason) Chen, Älvsjö (SE); Shiau-He Shawn Tsai, Stockholm (SE); Per Ernström, Stockholm (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 902 days.

(21) Appl. No.: 12/260,340

(22) Filed: Oct. 29, 2008

(65) Prior Publication Data

US 2009/0150755 A1 Jun. 11, 2009

Related U.S. Application Data

(60) Provisional application No. 60/985,049, filed on Nov. 2, 2007.

(51) Int. Cl.
*G06F 11/00* (2006.01)
(52) U.S. Cl. .......................... 714/795; 714/786
(58) Field of Classification Search ........... 714/786–796
See application file for complete search history.

(56) References Cited

U.S. PATENT DOCUMENTS

| | | | |
|---|---|---|---|
| 4,747,104 A | 5/1988 | Piret | |
| 6,347,122 B1 * | 2/2002 | Chen et al. | 375/262 |
| 6,530,059 B1 | 3/2003 | Crozier et al. | |
| 7,197,685 B2 | 3/2007 | Limberg | |
| 7,606,336 B2 | 10/2009 | Lee et al. | |
| 7,853,859 B2 * | 12/2010 | Ojard | 714/790 |
| 7,983,363 B2 | 7/2011 | Jayaraman et al. | |
| 8,219,896 B2 * | 7/2012 | Chen et al. | 714/795 |
| 2003/0033565 A1 * | 2/2003 | Crozier et al. | 714/701 |
| 2007/0033509 A1 * | 2/2007 | Gupta | 714/795 |
| 2007/0089043 A1 | 4/2007 | Chae et al. | |
| 2007/0174757 A1 * | 7/2007 | Gho et al. | 714/795 |
| 2007/0245209 A1 | 10/2007 | Shi et al. | |
| 2009/0070658 A1 | 3/2009 | Patapoutian et al. | |
| 2009/0103659 A1 | 4/2009 | Chen et al. | |

(Continued)

FOREIGN PATENT DOCUMENTS

| EP | 0 920 138 A2 | 6/1999 |
|---|---|---|
| RU | 2 185 025 C2 | 7/2002 |

(Continued)

OTHER PUBLICATIONS

Ma et al., "On tail biting convolutional codes," IEEE Trans. Commun., vol. 34, pp. 104-111, Feb. 1986.

(Continued)

*Primary Examiner* — Scott Baderman
*Assistant Examiner* — Elmira Mehrmanesh
(74) *Attorney, Agent, or Firm* — Nixon & Vanderhye, P.C.

(57) ABSTRACT

A method of generating a set of generator polynomials for use as a tail biting convolution code to operate on data transmitted over a channel comprises: (1) selecting valid combinations of generator polynomials to include in a pool of potential codes, each valid combination being a potential code; (2) determining first lines of a weight spectrum for each potential code in the pool and including potential codes of the pool having best first lines in a candidate set; (3) determining best codes of the candidate set based on the first L number of lines in the weight spectrum; (4) selecting an optimum code(s) from the best codes; and (5) configuring a shift register circuit(s) of a data transceiver to implement the optimum code(s).

16 Claims, 9 Drawing Sheets

U.S. PATENT DOCUMENTS

2010/0169747 A1     7/2010    Chen et al.
2011/0060972 A1     3/2011    Shi et al.

FOREIGN PATENT DOCUMENTS

| | | |
|---|---|---|
| RU | 2 214 677 C2 | 10/2003 |
| WO | WO 99/18689 | 4/1999 |
| WO | 2009/058087 A1 | 5/2009 |

OTHER PUBLICATIONS

Mzyece et al, "Performance evaluation of suboptimal decoding schemes for tail biting convolutional codes in EDGE headers," IEE Electronics Letters, vol. 39, No. 17, pp. 1280-1281, Aug. 2003.

Cox et al, "An efficient adaptive circular viterbi algorithm for decoding generalized tailbiting convolutional codes," IEEE Trans. Veh. Technol., vol. 43, pp. 57-68, Feb. 1994.

Berrou et al, "Multiple parallel concatenation of circular recursive convolutional (CRSC) codes," Annals of Telecommunications, vol. 54, No. 3-4, pp. 166-172, Mar.-Apr. 1999.

Wang et al, "On MAP decoding for tail-biting convolutional codes," IEEE International Symposium on Information Theory (ISIT) 1997, pp. 225, Jun. 1997.

Ståhl et al, "Optimal and near-optimal encoders for short and moderate-length tail-biting trellises," IEEE Trans. Inform. Theory, vol. 45, pp. 2562-2571, Nov. 1999.

Shao et al, "Two decoding algorithms for tail-biting codes," IEEE Trans. Commun., vol. 51, No. 10, pp. 1658-1665, Oct. 2003.

Bahl et al, "Optimal decoding of linear codes for minimizing symbol error rate," IEEE Trans. Inform. Theory, vol. 20, pp. 284-287, Mar. 1974.

Anderson et al, "Tailbiting MAP decoders," IEEE J. Select. Areas Commun., vol. 16, pp. 297-302, Feb. 1998.

Chen et al, "Final report on 2005 WiMAX link simulation," 05/0363-6/FCP 101 3630 Uen, Ericsson Internal Technical Document, Mar. 200612260.

3GPP TS 36.212, "3$^{rd}$ Generation Partnership Project; Technical Specification Group Radio Access Network; Evolved Universal Terrestrial Radio Access (E-UTRA); Multiplexing and channel Coding (Release 8)", V8.0.0, Sep. 2007.

3GPP TS 45.003, "3$^{rd}$ Generation Partnership Project; Technical Specification Group GSM/EDGE Radio Access Network; Channel Coding (Release 7)", V7.1.0, Feb. 2007.

International Preliminary Report on Patentability mailed Jun. 9, 2011 in PCT Application No. PCT/SE2009/051326.

International Search Report mailed Dec. 23, 2010 in PCT Application PCT/SE2009/051326.

U.S. Office Action mailed Sep. 15, 2011 in U.S. Appl. No. 12/140,956.

Larsen, "Short convolutional codes with maximal free distance for rate 1/2, 1/3, and 1/4," IEEE Trans. Inform. Theory, vol. 19, pp. 371-372, May 1973.

Chang et al, "Some extended results on the search for good convolutional codes," IEEE Trans. Inform. Theory, vol. 43, pp. 1682-1697, Sep. 1997.

Ståhl et al, "A note on tailbiting codes and their feedback encoders," IEEE Trans. Inform. Theory, vol. 48, pp. 529-534, Feb. 2002.

Ould-Cheikh-Mouhamedou et al, "Distance measurement method for double binary turbo codes and a new interleaver design for DVB-RCS," IEEE Globecom 04, pp. 172-178.

Johannesson et al, "Fundamentals of convolutional coding". Piscataway, New Jersey: IEEE Press, 1999.

Lin et al, "Error control coding". Upper Saddle River, New Jersey: Pearson, 2004.

IEEE Std 802.16-2004, "IEEE Standard for Local and Metropolitan Area Networks—Part 16: Air Interface for Fixed Broadband Wireless Access Systems", Oct. 2004.

IEEE Std P802.16e-2005, "IEEE Standard for Local and Metropolitan Area Networks—Part 16: Air Interface for Fixed and Mobile Broadband Wireless Access Systems", Feb. 2006.

International Search Report mailed Feb. 27, 2009 in corresponding PCT application PCT/SE2008/051236.

Frenger et al, "Convolutional Codes with Optimum Distance Spectrum", IEEE Communications Letters, IEEE Service Center, Piscataway, NJ, vol. 3, No. 11, Nov. 1, 1999; pp. 317-319.

Lassign et al, "Packet Error Rates of Terminated and Tailbiting Convolutional Codes", PROC DSPCS '02, 2002, pp. 78-83.

Chen et al, "Improved Tail-Biting Convolutional Codes for 802.16e Frame Control Header", Wireless Conference, 2008, EW 2008, 14$^{th}$ European IEEE, Piscataway, NJ, Jun. 22, 2008, pp. 1-7.

Notice of Allowance mailed Mar. 23, 2012 in U.S. Appl. No. 12/140,956.

Danashgaran, "Linear Subcodes of Turbo Codes with Improved Distance Spectra", 2004, IEEE, vol. 50, pp. 3291-3294.

U.S. Office Action mailed Mar. 5, 2012 in U.S. Appl. No. 12/696,141.

English Translation of Russian Decision on Grant issued in Application No. 2010122339/08(031766) dated May 21, 2012.

* cited by examiner

OPTIMUM DISTANCE SPECTRUM FEEDFORWARD TAIL-BITING CONVOLUTIONAL CODES

This application claims the priority and benefit of U.S. Provisional Patent Application 60/985,049 filed Nov. 2, 2007, entitled "OPTIMUM DISTANCE SPECTRUM FEEDFORWARD TAIL-BITING CONVOLUTIONAL CODES", which is incorporated by reference herein in its entirety. This application is related to U.S. patent application Ser. No. 12/140,956, entitled REDUCED-COMPLEXITY DECODING ALGORITHMS FOR TAIL-BITING CONVOLUTIONAL CODES, which is incorporated by reference herein in its entirety

BACKGROUND

I. Technical Field

This invention pertains to convolutional coding, with particular but non-exclusive application to telecommunications.

II. Related Art and Other Considerations

In many environments data in various forms (e.g., various protocols, modulations, etc.) can be transmitted over a channel from a transmitter to a receiver. Depending on the type and circumstances of operation, some channels are more or less prone or susceptible to loss or degradation of the data being transmitted over the channel, with differing channels having differing degrees of potential loss or corruption. For example, a wireline channel typically has a relatively higher degree of integrity and reliability than a channel existing over a radio or interface.

Detection of loss or inaccurate transmission of data over a channel is possible when certain additional information in the form of an error detection code is added to the data stream. For example, at a transmitter a frame or block of data can have appended to it an error detection code in the form of (for example) a check character(s) or check sum which is computed or otherwise derived from the block. Upon reception of the block by the receiver, the receiver can independently recompute or re-derive the error detection code (e.g., the receiver's version of the check character(s) or check sum). If the recomputed or re-derived error detection code (e.g., check sum) is the same as the error detection code included in the received block or frame, the receiver can confirm that the block or frame is correctly decoded.

In addition to error detection techniques, error correcting techniques are also known. For example, error correction codes (generated by polynominals that operate over a frame or block of user data) can also be added to the data stream. Upon reception of the complete frame or block, using the known error correction code/technique the receiver can locate and correct certain errors in the data stream.

A convolutional code is a forward error-correction scheme, whereby the coded sequence is algorithmically achieved through the use of current data bits plus some of the previous data bits from the incoming stream. In telecommunications, a convolutional code is a type of error-correcting code in which (a) each m-bit information symbol (each m-bit string) to be encoded is transformed into an n-bit symbol, where m/n is the code rate ($n \leq m$) and (b) the transformation is a function of the last k information symbols. where k is the constraint length of the code. A trellis description of a convolutional encoder shows how each possible input to the encoder influences both the output and the state transitions of the encoder.

A convolutional code (CC) is called tail-biting (or circular) if the beginning state of its encoding trellis is always equal to the ending state of its encoding trellis after encoding. Tail-biting convolutional codes (TBCC) are simple and powerful forward error correction (FEC) codes, as described, e.g., in H. H. Ma and J. K. Wolf, "On tail biting convolutional codes," IEEE Trans. Commun., vol. 34, pp. 104-111, February 1986.

Tail-biting convolutional codes (TBCC) are employed in many environments, including telecommunication networks having an air, radio, or "wireless" interface. Tail-biting convolutional codes (TBCC) have been adopted as the mandatory channel codes for the data channels and the overhead channels (like frame control header) in 802.16 WiMAX (Worldwide Interoperability for Microwave Access) system. 802.16 WiMAX is described, e.g., in IEEE Std 802.16-2004, "IEEE Standard for Local and Metropolitan Area Networks—Part 16: Air Interface for Fixed Broadband Wireless Access Systems", October, 2004; and IEEE Std P802.16e-2005, "IEEE Standard for Local and Metropolitan Area Networks—Part 16: Air Interface for Fixed and Mobile Broadband Wireless Access Systems", February, 2006, both of which are incorporated herein by reference. They have also been adopted as the channel codes for the header channel in the EDGE system and for the control channel in the IS-54 system. For a description of the EDGE system, see, e.g., M. Mzyece and J. Dunlop, "Performance evaluation of suboptimal decoding schemes for tail biting convolutional codes in EDGE headers," IEE Electronics Letters, vol. 39, no. 17, pp. 1280-1281, August 2003, and 3GPP TS 45.003, "$3^{rd}$ Generation Partnership Project; Technical Specification Group GSM/EDGE Radio Access Network; Channel Coding (Release 7)", V7.1.0, 2007-02, both of which are incorporated herein by reference. For a description of the IS-54 system, see, e.g., R. V. Cox and C.-E. W. Sundberg, "An efficient adaptive circular viterbi algorithm for decoding generalized tailbiting convolutional codes," IEEE Trans. Veh. Technol., vol. 43, pp. 57-68, February 1994, incorporated herein by reference. Further, they have also been adopted for the LTE (Long-Term Evolution) system (See, 3GPP TS 36.212, "$3^{rd}$ Generation Partnership Project; Technical Specification Group Radio Access Network; Evolved Universal Terrestrial Radio Access (E-UTRA); Multiplexing and channel Coding (Release 8)", V8.0.0, 2007-09, e.g., which is incorporated herein by reference).

Thus, tail biting convolutional codes comprise one class of error correction codes, which adds redundancy bits to the information bits (information bits and redundancy bits together is called one codeword) for error correction. At a receiver, the decoder can try to correct the corrupted bits (if errors happen during the transmission) with the help from the redundancy bits (or the information bits together). For example, if payload (information bits) size is K=6 bits and the coding rate is ⅓, then the length of the codeword is 6*3=18 bits and actually 18−6=12 redundancy bits are added to the 6 information bits. There are in total 2^6=64 different codewords, corresponding to the 64 possible length-6 information bit vectors (from (0,0,0,0,0,0), (0,0,0,0,0,1), . . . , to (1,1,1,1, 1,1)).

The encoder structure of a rate 1/n feedforward convolutional code (CC) with overall constraint length v is shown in FIG. 1, where the content consisting of zeros and ones of the v number of shift-register elements is called the state of the encoder. The n number of generator polynomials specify the connections from the shift-registers to the n outputs. The n number of generator polynomials are represented by the set $G=(g_0, \ldots, g_{n-1})$, where $g_0=(g_0^{(0)}, g_0^{(1)}, \ldots, g_0^{(v)}), \ldots, g_{n-1}=(g_{n-1}^{(0)}, g_{n-1}^{(1)}, \ldots, g_{n-1}^{(v)})$. The coefficients $g_k^{(j)}$, for k=0, . . . , n-1 and j=0, . . . , v, is either 0 (no connection) or 1 (with connection). $U_i$ is the input bit at time i, and $(v_i^{(0)}, \ldots, v_i^{(n-1)})$ are the n output bits at time i. Thus, a convolutional code can be specified by its set of generator polynomials $G=(g_0, \ldots, g_{n-1})$.

A convolutional code (CC) is called tail-biting (or circular) if the beginning state of its encoding trellis is always equal to the ending state of its encoding trellis after encoding. For a feedforward CC, the beginning state is simply determined by the last v number of input bits, where v is the overall constraint length. For a feedback convolutional code (CC), the encoder structure has to comply with certain conditions so that the circular encoding is possible. In both cases (feedforward and feedback CC) the beginning state (also called the circular state) of the encoding trellis is determined from the input information bit vector. That is, the beginning state is not always equal to the all-zero state and depends on the values of the input bits. On the other hand, in the conventional zero-tail convolutional codes (ZTCC), the beginning state and the ending state are always equal to the all-zero state, and v number of redundant zero-tail bits are needed to return the encoder to the all-zero state.

An example encoder for the 802.16 Tail-biting convolutional codes (TBCC) is shown in FIG. 2. The encoder has code rate $1/n=\frac{1}{2}$, constraint length $v=6$, and $G=(g_0,g_1)$, where $g_0=(1, 1, 1, 1, 0, 0, 1)$ and $g_1=(1, 0, 1, 1, 0, 1, 1)$. In other words, the adder $A_{g_0}$ for the first polynomial $g_0$ is connected to receive the bit values from the first through fourth positions and the seventh position of the shift register chain of FIG. 2 (e.g., the first position being the input to shift register $U_{i-1}$; the second position being the output of shift register $U_{i-2}$; the third position being the output of shift register $U_{i-3}$; and so on to the seventh position being the output of shift register $U_{i-6}$). The adder $A_{g_1}$ for the second polynomial $g_1$ is connected to receive the bit values from the first, third, fourth, sixth, and seventh positions of the shift register chain of FIG. 2.

To represent the generator polynomials in a more compact way, the octal notation is usually used, where zeros (0) are appended on the right of the binary notation to make the total number of digits a multiple of 3. For example, two zeroes are appended to the right of $g_0$ to generate the binary vector $g_0'=(1, 1, 1, 1, 0, 0, 1, 0, 0)$. Then the digits in $g_0'$ are grouped with 3 digits per group and the result is $g_0''=(111, 100, 100)$. Finally each group in $g_0''$ is transformed to its equivalent octal notation and the result is (7, 4, 4). The generator polynomials depicted in FIG. 2 for the 802.16 TBCC in octal notation are thus given by $G=(744, 554)$. The more compact octal notation is typically used herein to represent the generator polynomials.

There are many advantages of using Tail-biting convolutional codes (TBCC) over the conventional zero-tail convolutional codes (ZTCC) and some block codes. Two example advantages are listed below:

Advantage 1. zero-tail convolutional codes (ZTCC) need to use v number of redundant zero-tail bits to terminate the encoding trellises to the all-zero state. In Tail-biting convolutional codes (TBCC), zero-tail bits are not needed and they can be replaced by payload bits to increase the spectral efficiency of the channel code.

Advantage 2. Many good block codes can be generated by equivalent Tail-biting convolutional codes (TBCC), and hence can be decoded by the more efficient soft-input soft-output decoding algorithms for trellis codes.

Performances of convolutional codes (CC) are determined by the generator polynomials and the resulting weight spectrum, and the constructions of convolutional codes (CC) with good weight spectrum are usually done by extensive computer searches (as described, e.g., in references [2]-[9], listed hereinafter).

The weight spectrum (or distance spectrum) of a code C is defined by Expression 1.

$$WS(C)=\{(d,n_d,b_d): d=d_f,d_f+1,\ldots\}$$ Expression 1

In Expression 1, $d_f$ is the free distance (or the minimum distance $d_{min}$), $n_d$ is the number of codewords with weight d, and $b_d$ is the total number of nonzero information bits associated with codewords with weight d. Each triple $(d,n_d,b_d)$ is called a line in the weight spectrum. If a convolutional code (CC) does not have a weight-$d_1$ codeword, then the corresponding line $(d_1,n_{d1},b_{d1})$ does not exist.

The performances of convolutional codes (CC) are characterized either by the decoder frame error rate (FER) or the bit error rate (BER). It can be shown that, for a rate $R=1/n$ Tail-biting convolutional codes (TBCC) with payload size K bits, the frame error rate (FER) and bit error rate (BER) can be upper bounded by Expression 2 and Expression 3.

$$P_{F,UB} = \sum_{d \geq df} n_d \cdot Q(\sqrt{2 \cdot d \cdot R \cdot (E_b/N_0)})$$ Expression 2

$$P_{B,UB} = \frac{1}{K} \cdot \sum_{d \geq df} b_d \cdot Q(\sqrt{2 \cdot d \cdot R \cdot (E_b/N_0)})$$ Expression 3

In the foregoing, $$Q(x) = \int_x^\infty \frac{1}{\sqrt{2\pi}} \exp(-z^2/2) dz$$

is the well-know Q-function. $E_b/N0$ is the energy per bit to the noise power spectral density ratio. $E_b/N0$ is used herein as the definition for signal to noise ratio (SNR). As can be seen from the above Expressions, the upper bound on the FER of a convolutional code (CC) can be reduced by minimizing the "multiplicity" $n_d$, and the upper bound on the BER can be reduced by minimizing the "bit multiplicity" $b_d$.

The search criteria for good convolutional codes (CC) can be roughly divided into the following two categories:

Category 1: Maximum Free Distance (MFD) Codes: The rule of thumb for finding good convolutional codes (CC) is to first find generator polynomials which will result in the maximum free distance (MFD) $d_f$ and the codes generated are called MFD codes (See, reference [2], listed hereinafter). If multiple generator polynomials have the same $d_f$, then the ones with minimum $n_d$ (or $b_d$) are selected and they are called MFD-FER codes (or MFD-BER codes). MFD codes are useful when the $E_b/N0$ value is so large (i.e., over the very high SNR region) that only the $d_f$ term (the first line in the weight spectrum) has a significant contribution to $P_{F,UB}$ (or $P_{B,UB}$).

Category 2: ODS (Optimum Distance Spectrum) Codes: A Convolutional Code (CC) C with weight spectrum $WS(C)=\{(d,n_d,b_d): d=d_f,d_f+1,\ldots\}$ has a superior FER (or BER (See, reference [4], listed hereinafter)) distance spectrum than that of a Convolutional Code (CC) $\overline{C}$ with weight spectrum $WS(\overline{C})=\{(d,\overline{n}_d,\overline{b}_d): d=d_f,d_f+1,\ldots\}$ if one of the conditions of Expression 4 or Expression 5 is satisfied.

$$df > \overline{d_f}$$ Expression 4 or $$df = \overline{d_f}$$ Expression 5 and there exists an integer $j>1$ such that $n_d=\overline{n}_d$ for $d=d_f, d_f+1, \ldots, d_f+j-1$ and $n_d<\overline{n}_d$ for $d=d_f+j$ (or $b_d=\overline{b}_d$ for $d=d_f, d_f+1, \ldots, d_f+j-1$ and $b_d<\overline{b}_d$ for $d=d_f+j$).

A Convolutional Code (CC) C is called ODS-FER code (or ODS-BER code) if it has a superior FER (or BER) distance spectrum than another code with the same code rate R and overall constraint length v.

From the above definitions it can be seen that an ODS code is always an MFD code, but not vice versa. For example, two MFD codes C and C with the same $(d_f, n_{d_f}, b_{d_f})$ may have quite different lines $(d, \bar{n}_d, b_d)$ for $d > d_f$ and have different performances. Therefore, from the performance perspective, the ODS criterion should be used to find good convolutional codes (CC).

For zero-tail convolutional codes (ZTCC), the code searches have been extensively studied before. For example, generator polynomials for some MFD ZTCC are reported in reference [2], listed hereinafter, and the generator polynomials for some ODS-BER ZTCC are reported in references [3],[4] and [9], listed hereinafter.

Due to different encoding structures, the weight spectrums of Tail-biting convolutional codes (TBCC) are usually very different than those of zero-tail convolutional codes (ZTCC) with the same generator polynomials, especially for short and medium-length encoder packets. Moreover, for short and medium-length encoder packets, the optimum generator polynomials (for either the MFD or the ODS criterion) will usually be different for different encoder packet lengths (See, e.g., references [8] and [9]). That is, the optimization (or selection) of the Tail-biting convolutional codes (TBCC) generator polynomials needs to be done for each packet length. For example, generator polynomials for some MFD-FER TBCC codes have been reported (see references [5],[8] and [9], listed hereinafter). For long encoder packets (typically over 30 or 40 bits), the weight spectrums of Tail-biting convolutional codes (TBCC) and zero-tail convolutional codes (ZTCC) with the same generator polynomials will become approximately the same, and generator polynomials optimized for zero-tail convolutional codes (ZTCC) may be directly used for Tail-biting convolutional codes (TBCC) without performance degradation.

There are problems with the selection of the generator polynomials for Tail-biting convolutional codes (TBCC) as currently used. Two general problems are briefly described below.:

Problem (1): Tail-biting convolutional codes (TBCC) are used by major wireless systems like EDGE, WiMAX and LTE. However, the generator polynomials of TBCC used by these systems are taken from the MFD zero-tail convolutional codes (ZTCC) or ODS zero-tail convolutional codes (ZTCC) and are not the optimum ones for Tail-biting convolutional codes (TBCC). This is mainly due to the unavailability of Tail-biting convolutional codes (TBCC) search results at the time when the corresponding standards were written. For LTE and EDGE systems, the impacts on performances by not using generator polynomials optimized for Tail-biting convolutional codes (TBCC) are very limited since the payload sizes used in these systems are relatively large. For WiMAX, since short payload sizes (12 bits or 24 bits) are used, performance degradations have been shown by us to be between 0.5 dB to 1 dB over the additive white Gaussian noise (AWGN) channel, and between 1 dB to 3.7 dB over the multipath fading channels.

Problem (2): The current available search results for the optimum generator polynomials for Tail-biting convolutional codes (TBCC) are MFD codes (See, references [5][8] and [9], listed hereinafter). From the above discussions, it is now understood that ODS codes should be used instead.

SUMMARY

In one of its aspects, the technology disclosed herein concerns a method of generating a set of generator polynomials for use as a tail biting convolution code to operate on data transmitted over a channel. In an example embodiment the method comprises: (1) selecting valid combinations of generator polynomials to include in a pool of potential codes, each valid combination being a potential code; (2) determining first lines of a weight spectrum for each potential code in the pool and including potential codes of the pool having best first lines in a candidate set; (3) determining best codes of the candidate set based on the first L number of lines in the weight spectrum; (4) selecting an optimum code(s) from the best codes; and (5) configuring a shift register circuit(s) of a data transceiver to implement the optimum code(s).

Optimum code(s) generated by the methods described herein can be expressed by a set of polynomials which are listed in Tables and/or stored in a memory.

In one of its implementations which concerns an ODS-FER operation, the method further comprises using a free distance parameter and a multiplicity parameter for selecting the optimum code(s) from the best codes. In an alternative implementation which concerns an ODS-BER operation, the method further comprises using a free distance parameter and a bit multiplicity parameter for selecting the optimum code(s) from the best codes.

In one of its aspects, the technology disclosed herein concerns a node of a communications network which participates in data transmissions over a channel. In an example embodiment the node comprises a transceiver for sending and receiving data over the channel and a shift register circuit configured to implement an optimum tail biting convolutional code for operating on the data transmitted over the channel. The optimum code can be expressed by a set of polynomials listed in Tables described herein and generated by acts of the aforesummarized method.

In an example implementation, the node further comprises plural shift register circuits and a code activator. Each of the plural shift register circuits is configured to implement a respective different one of plural optimum tail biting convolutional codes, each of the plural optimum tail biting convolutional codes being of a different rate and being expressed by a set of polynomials listed in any of several tables described herein. The code activator is configured to include one of the plural shift register circuits in a processing stream for a respective data transmission over the channel.

In another of its aspects, the technology disclosed herein concerns a method of operating a node of a communications network. The method comprises configuring a shift register circuit of the node to implement an optimum tail biting convolutional code expressed by a set of polynomials listed in any one of certain tables described herein; and using the optimum tail biting convolutional code to operate on data transmitted over a channel of the communications network.

In the methods and apparatus described herein, the shift register circuit can be configured in accordance with the optimum code either to function as an encoder to append error correction information to data transmitted over the channel.

In another of its aspects, the technology disclosed herein concerns a code generator comprising a computer which executes a computer program comprising instructions stored on a computer-readable medium, and a method performed by the execution. Execution of the instructions of the program results in performance of the acts of: (1) selecting valid combinations of generator polynomials to include in a pool of potential codes, each valid combination being a potential code; (2) determining first lines of a weight spectrum for each potential code in the pool and including potential codes of the pool having best first lines in a candidate set; (3) determining best codes of the candidate set based on the first L number of lines in the weight spectrum; (4) selecting an optimum code(s) from the best codes; and (5) outputting an identification of the optimum code(s).

The technology disclosed herein optimizes the performances of Tail-biting convolutional codes (TBCC) over short to medium-length encoder packets, codes with the best distance spectrum (ODS-FER codes or ODS-BER codes) being searched and tabulated. In an example embodiment, only the feedforward encoders are considered. In at least one of its aspects, the technology concerns ODS-FER and ODS-BER TBCC codes with short to medium-length encoder packets.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. That is, those skilled in the art will be able to devise various arrangements which, although not explicitly described or shown herein, embody the principles of the invention and are included within its spirit and scope. In some instances, detailed descriptions of well-known devices, circuits, and methods are omitted so as not to obscure the description of the present invention with unnecessary detail. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that block diagrams herein can represent conceptual views of illustrative circuitry embodying the principles of the technology. Similarly, it will be appreciated that any flow charts, state transition diagrams, pseudocode, and the like represent various processes which may be substantially represented in computer readable medium and so executed by a computer or processor, whether or not such computer or processor is explicitly shown.

The functions of the various elements including functional blocks labeled or described as "processors" or "controllers" may be provided through the use of dedicated hardware as well as hardware capable of executing software in association with appropriate software. When provided by a processor, the functions may be provided by a single dedicated processor, by a single shared processor, or by a plurality of individual processors, some of which may be shared or distributed. Moreover, explicit use of the term "processor" or "controller" should not be construed to refer exclusively to hardware capable of executing software, and may include, without limitation, digital signal processor (DSP) hardware, read only memory (ROM) for storing software, random access memory (RAM), and non-volatile storage.

Figure 3:
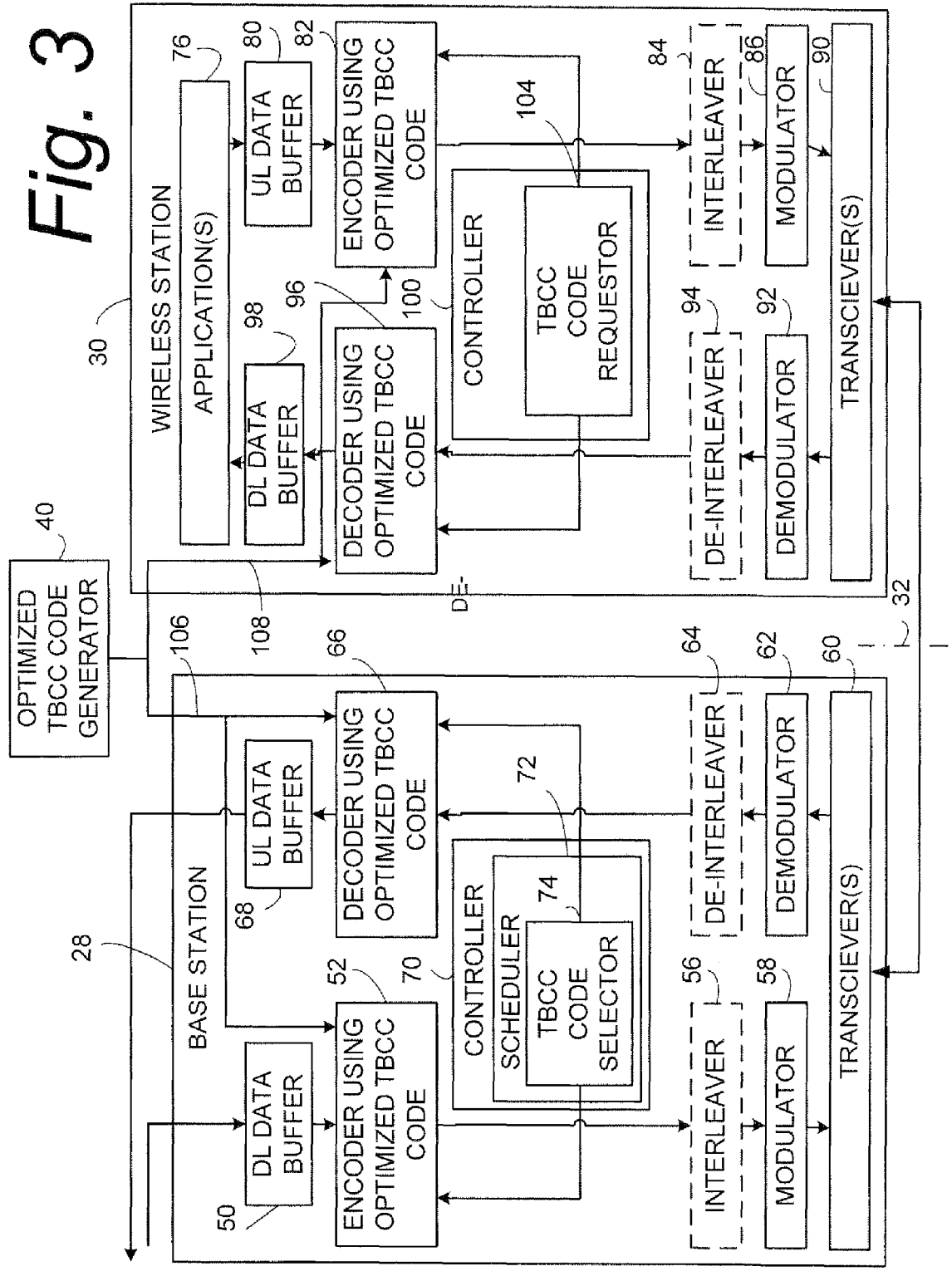
FIG. 3 is a diagrammatic view of portions of a communication network including a base station and a wireless station which communicate data over a channel using an optimized tail biting convolutional code.

FIG. 3 shows portions of an example communications network, particularly a communications network portion which includes, as two of its nodes, base station 28 and wireless station 30. In the example network scenario shown in FIG. 3, base station 28 and wireless station 30 communicate with each other over a channel 31 which exists on or over a network interface, which interface happens in the example of FIG. 3 to be a radio or air interface 32. It should be understood that, in other communication networks which are not wireless, that the channel 31 can be provided over a network interface which is other than wireless, e.g., a wired interface, for example.

As described herein, at least some of the data which is transmitted over network interface 32 is encoded using an optimized tail biting convolutional code. In an example implementation, the optimized tail biting convolutional code is generated by optimized tail biting convolutional code generator 40 using methods described herein with reference, for example, to FIG. 4. In other words, at least some of the data transmitted on channel 31 over network interface 32 on a downlink from base station 28 to wireless station 30 is encoded using the optimized tail biting convolutional code by base station 28, and therefore is decoded using the optimized tail biting convolutional code upon receipt by wireless station 30. Conversely, at least some of the data transmitted over network interface 32 on an uplink from wireless station 30 to base station 28 is encoded using the optimized tail biting convolutional code by wireless station 30, and therefore is decoded using the optimized tail biting convolutional code upon receipt by base station 28.

FIG. 3 further illustrates certain units or functionalities comprising base station 28. On its downlink side, base station 28 comprises base station downlink data buffer 50, base station error correction encoder 52; an optional base station interleaver 56; base station modulator 58; and base station transceiver(s) 60. On its uplink side, base station 28 comprises base station demodulator 62; an optional base station de-interleaver 64; base station error correction decoder 66;

and base station uplink data buffer 68. The base station 28 further comprises base station node controller 70, which in turn comprises (among other functionalities or units) base station scheduler 72. The base station scheduler 72 includes, among other entities or functionalities, TBCC code selector 74.

FIG. 3 also illustrates certain units or functionalities comprising wireless station 30. The wireless station 30 executes, via a controller or the like, certain applications (e.g., application programs 76). On its uplink side, wireless station 30 comprises wireless station uplink data buffer 80, wireless station error correction encoder 82; an optional wireless station interleaver 84; wireless station modulator 86; and wireless station transceiver(s) 90. On its downlink side, wireless station 30 comprises wireless station demodulator 92; an optional wireless station de-interleaver 94; wireless station error correction decoder 96; and wireless station uplink data buffer 98. The air interface 32 further comprises wireless station controller 100, which in turn comprises (among other functionalities or units) TBCC code requestor 104.

As mentioned above, when base station 28 and wireless station 30 are in communication over a channel existing over network interface 32, at least some of the data carried over the channel can be error correction encoded using the optimized tail biting convolutional code generated by optimized tail biting convolutional code generator 40. To this end, FIG. 3 shows by arrow 106 the loading of the optimized tail biting convolutional code into base station error correction encoder 52 and base station error correction decoder 66. FIG. 3 also shows by arrow 108 the loading of the optimized tail biting convolutional code into wireless station error correction encoder 82 and wireless station error correction decoder 96. For the encoding and decoding the data of the connection which exists between base station 28 and wireless station 30, the same optimized tail biting convolutional code is loaded into the encoders and decoders of both base station 28 and wireless station 30.

As explained hereinafter, the "loading" of the optimized tail biting convolutional code into an encoder can involve the configuring of shift register circuit(s) which comprise the encoder(s).

In one of its aspects, the technology disclosed herein concerns a method of generating a set of generator polynomials for use as a tail biting convolution code to operate on data transmitted over a channel. In particular the technology disclosed herein comprises an efficient method for computing a weight spectrum of Tail-biting convolutional codes (TBCC). The method of the technology disclosed herein is a modified version of an approach for computing a turbo code weight spectrum (See, reference [7], listed hereinafter).

Figure 4:
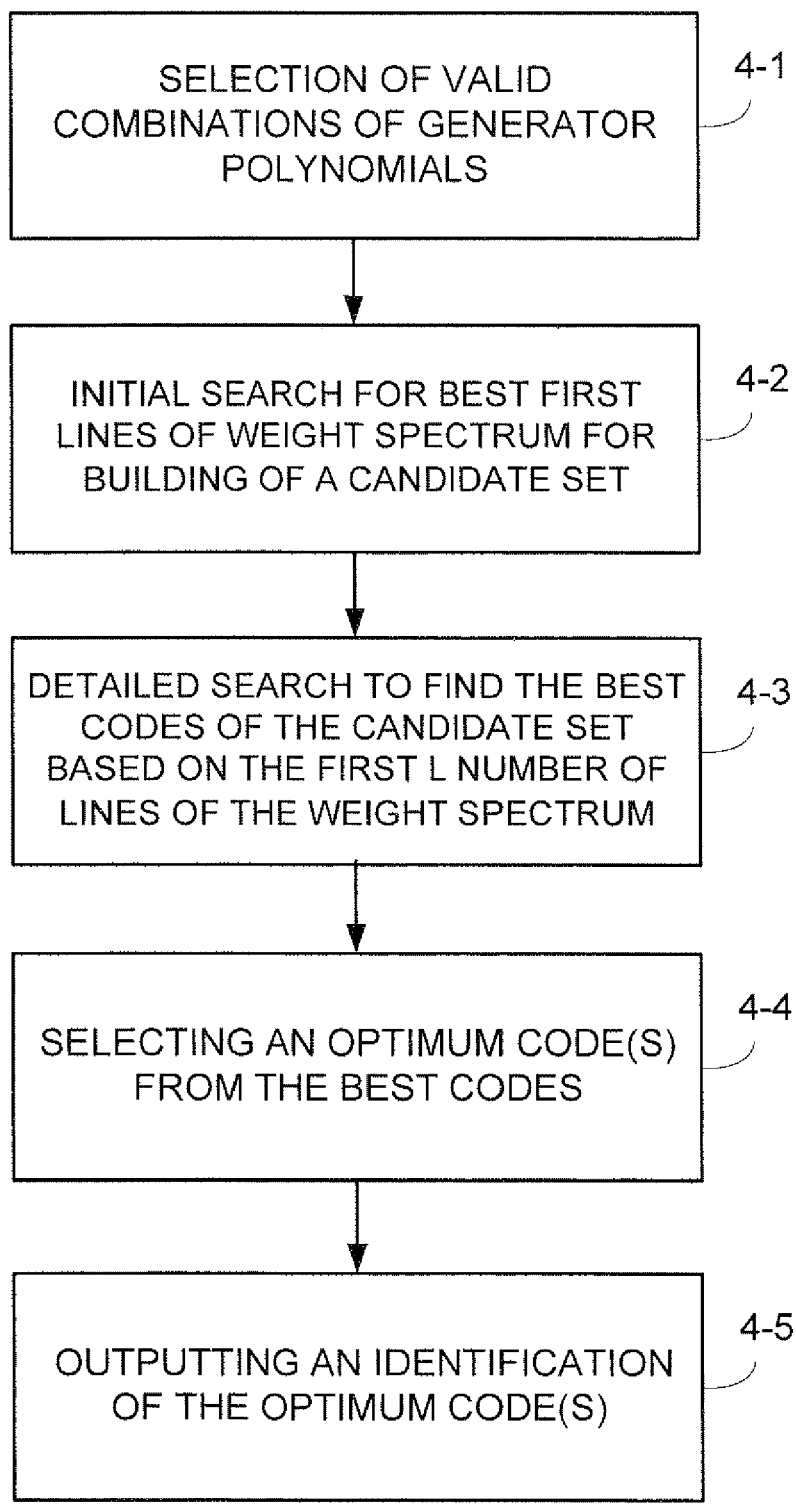
FIG. 4 is a flow chart showing basic, representative acts or steps which comprise a method of code determination according to the technology disclosed herein.

The method of generating an optimized tail biting convolutional code can be performed by a unit such as the optimized tail biting convolutional code generator 40 shown in FIG. 3. The optimized tail biting convolutional code generator 40 can be realized by (e.g., implemented using) a computer or processor which executes a computer program comprising instructions stored on a computer-readable medium. The basic, representative acts or steps for finding the ODS-FER TBCC codes and ODS-BER TBCC codes (as performed, e.g., by optimized tail biting convolutional code generator 40) are illustrated in FIG. 4 and described as follows:

Act 4-1 comprises selecting valid combinations of generator polynomials to include in a pool of potential codes, each valid combination being a potential code. For a combination of generator polynomials to be considered valid for the technology disclosed herein, certain criteria must be satisfied. Such criteria can be understood with reference to the structure of a shift register circuit which implements the tail biting convolutional code, for example the shift register circuit of FIG. 1. The criteria which must be satisfied in order to have a valid combination of generator polynomials includes the following: (1) at least one coefficient for the most-left-hand-side connections of the shift register circuit (e.g., $g_0^{(0)}, \ldots, g_{n-1}^{(0)}$ in FIG. 1) needs to be 1; (2) at least one coefficient for the most-right-hand-side connections of the shift register circuit (e.g., $g_0^{(v)}, \ldots, g_{n-1}^{(v)}$ in FIG. 1) needs to be 1; and (3) the polynomial 000 is invalid (e.g., ineligible). Moreover, all different permutations of the generator polynomials $g_0, g_1, \ldots, g_{n-1}$ that will generate the same code and are counted as one, are considered the same.

Act 4-2 comprises an initial search for best first lines of weight spectrum for building of a candidate set. In other words, act 4-2 comprises determining first lines of a weight spectrum for each potential code in the pool, and including potential codes of the pool having best first lines in a candidate set. In the initial search of act 4-2, the first line of the weight spectrum (the first line being the minimum distance terms $(d_f, n_{df}, b_{df})$) for each valid combination (e.g., valid set) of polynomials from act 4-1 is computed, and the best ones (e.g., the best first lines) in terms of MFD-FER (or MFD-BER) are put into a set know as the candidate set. The Tail-biting convolutional codes (TBCC) codes in the candidate set are actually MFD-FER TBCC (or MFD-BER TBCC).

Act 4-3 comprises a detailed search to find the best codes of the candidate set based on the first L number of lines of the weight spectrum. In other words, in the detailed search of act 4-3, the first L number of lines of the weight spectrum, {(d, $n_d, b_d$): d ranges from the first L codeword weights beginning from $d_f$}, are computed for all codes in the candidate set obtained from act 4-2. The best codes in terms of ODS-FER (or ODS-BER) are selected, and the resulting sets are ODS-FER TBCC (or ODS-BER TBCC). The code (or the set of generator polynomials) with the largest free distance $d_f$ will be selected. If there are multiple codes with the same $d_f$, then the codes with the smallest $n_{df}$ (or smallest $b_{df}$) are selected as the MFD-FER codes (or MFD-BER codes).

As a variation of the method of FIG. 4, certain checks can be implemented to reduce computational complexities of act 4-2 and act 4-3. The variation involves checking for the following two conditions:

Condition 1: If a new set of valid generator polynomials (whose weight spectrum is to be computed) G1 is equivalent to an existing set of generator polynomials G2 in the candidate set in the sense of weight spectrum, then the computation for the weight spectrum of G1 can be skipped. This condition can be detected by checking if the generator matrix of G1 can be obtained from the generator matrix of G2 by column permutation operations and/or row permutation operations (See, e.g., reference [9], listed hereinafter). The same rule can be applied to act 2-3.

Condition 2: During the computation of the weight spectrum for a new set of valid generator polynomials G1, if G1 has inferior FER (or BER) distance spectrum than that of any existing set of generator polynomials G2 in the candidate set, then the computation can be stopped early and G1 will not be included in the candidate set. The same rule can be applied to act 2-3.

Concerning act 4-2, it should be understood that G1 can refer to a valid set of polynomials that survive act 4-1 and G2 can refer to one set of generator polynomials in the candidate set (who survive act 4-2). In condition 1, G1 needs to be compared with all sets of polynomials in the candidate set to see if G1 is equivalent to any of them. In condition 2, G1 needs to be compared with one set of polynomials (since all sets of polynomials in the candidate set have the same first line weight spectrum) in the candidate set to see if G is inferior to any of them in terms of FER (or BER). Note that if G1 has better first line weight spectrum than that of the candidate set, the candidate set will be updated to G1; if G1 has the same first line weight spectrum as that of the candidate set, G1 will be added to the candidate set.

During act 4-3, G1 refers to a set of polynomials from the candidate set (who survive act 4-2), and G2 refers to one set of generator polynomials in the final set (who survive act 4-3). In condition 1, G1 needs to be compared with all sets of polynomials in the final set to see if G1 is equivalent to any of them. In condition 2, G1 needs to be compared with one set of polynomials (since all sets of polynomials in the final set have the same first L lines weight spectrum) in the final set to see if G1 is inferior to any of them in terms of FER (or BER). Note that if G1 has better first L lines weight spectrum than that of the final set, the final set will be updated to G1; if G1 has the same first L lines weight spectrum as that of the final set, G1 will be added to the final set.

In the search process comprising act 4-2 and act 4-3, the choice of whether to use MFD-FER or MFD-BER can be arbitrary as long as the choice (MFD-FER or MFD-BER) remains consistent for act 4-2 and act 4-3. If FER is to be minimized, then MFD-FER criterion should be used and codes marked with ODS-FER from the appropriate Table below should be used. Otherwise, if BER is to be minimized, then MFD-BER criterion should be used and codes marked with ODS-BER from the appropriate Table below should be used.

Act 4-4 comprises outputting an identification of the optimized tail biting convolutional code(s). The identification can be output in any suitable manner, such as displaying on a screen, printing or recording or affixing on/to any tangible medium, or storing in a memory, just to name a few examples. The identification can comprise an indication of the generator polynomials which comprise the optimized tail biting convolutional code. The description or indication for a generator polynomial of the optimized tail biting convolutional code can be expressed in the octal notation previously described herein.

One form of outputting the identification of the optimized tail biting convolutional code can include listing of the search results for generated optimized tail biting convolutional code in a table, the table providing optimized tail biting convolutional codes grouped by code rate and constraint length. The table can be stored in a memory or the like, such as a memory or a processor, a semiconductor memory, a non-volatile memory, for example.

As an example illustration of execution of act 4-1 of the method of FIG. 4, consider now a case of v=2 [and not using octal notation for the polynomials] and rate of ½. For rate 1/n code there are n polynomials to be chosen from the beginning pool of polynomials. For this example illustration, act 4-1, which comprises selection of valid combinations of generator polynomials, yields the following beginning pool of polynomials:

0,0,1
0,1,0
0,1,1
1,0,0
1,0,1
1,1,0
1,1,1

Since the rate is ½, then as many different two-way combinations of the polynomials as possible are constructed, e.g.:

0,0,1 and 0,0,1
0,0,1 and 0,1,0
0,0,1 and 0,1,1
0,0,1 and 1,0,0
0,0,1 and 1,0,1
0,0,1 and 1,1,0
0,0,1 and 1,1,1
0,1,0 and 0,1,0
0,1,0 and 0,1,1
0,1,0 and 1,0,0
0,1,0 and 1,0,1
0,1,0 and 1,1,0
0,1,0 and 1,1,1
0,1,1 and 0,1,1
0,1,1 and 1,0,0
0,1,1 and 1,0,1
0,1,1 and 1,1,0
0,1,1 and 1,1,1
1,0,0 and 1,0,0,
1,0,0 and 1,0,1
1,0,0 and 1,1,0
1,0,0 and 1,1,1
1,0,1 and 1,0,1
1,0,1 and 1,1,0
1,0,1 and 1,1,1
1,1,0 and 1,1,0
1,1,0 and 1,1,1
1,1,1 and 1,1,1

It will be recalled from the description of act 4-1 that (a) all different permutations of the generator polynomials that generate the same code are treated as one-in-the-same, and that (b) at least one coefficient for the most-left-hand-side connections $(g_0^{(0)}, \ldots, g_{n-1}^{(0)})$ needs to be 1, and at least one coefficient for the most-right-hand-side connections $(g_0^{(v)}, \ldots, g_{n-1}^{(v)})$ needs to be 1. For sake of discussion in this example, it will be assumed that all the codes developed above (each pair of ordered triples above) generates the same code. Concerning criteria (b), only the following unstruck triplets would survive:

0,0,1 and 1,0,0
0,0,1 and 1,0,1
0,0,1 and 1,1,0
0,0,1 and 1,1,1
0,1,0 and 1,0,1
0,1,0 and 1,1,1
0,1,1 and 1,0,0
0,1,1 and 1,0,1
0,1,1 and 1,1,0
0,1,1 and 1,1,1
1,0,0 and 1,0,1
1,0,0 and 1,1,1
1,0,1 and 1,0,1
1,0,1 and 1,1,0
1,0,1 and 1,1,1
1,1,0 and 1,1,1
1,1,1 and 1,1,1

The foregoing scenario illustrates an example of the beginning_pool of considered polynomials before actions (a) and (b) are considered. Note that, for constraint length v, each polynomial has (v+1) number of terms (0 or 1). The ensuing act 4-2 through act 4-4 would then be performed with respect to the surviving pool such as that listed above, with the best codes being selected and stored in a table.

Many different tables can be generated as act 4-4 using the technology disclosed herein, e.g., on the basis of the method described with reference to FIG. 4. Table 2-Table 21 show example new ODS feedforward Tail-biting convolutional codes (TBCC) of various rates and constraint lengths. Table 1 serves an index by which to reference Table 2-Table 21. That is, from Table 1 it can be determined which other Table to consult for a given rate and constraint length. In Table 1, columns 2-4 correspond to the rates of ¼, ⅓, and ½, respectively; while rows 2-8 correspond to constraint lengths of 2-8, respectively. For example, to find a suitable ODS feedforward Tail-biting convolutional codes (TBCC) generated by the technology disclosed herein and having a rate of ⅓ and a constraint length v=3, Table 8 would be consulted.

Table 2-Table 21 list only search results (e.g., sets of generator polynomials) which are believed not to have been previously reported in the literature. In this regard, since Tail-biting convolutional codes (TBCC) are specified by its set of generator polynomials, "sets of generator polynomials" are sometimes used herein to mean "codes".

Table 2-Table 21 are subject to the following comments and conditions, each of which is herein referred to as a "Table Note":

Table Note 1: In each of Table 2-Table 21, the letter "K" in the first column represents the number of payload bits; that is, the number of information bits to be encoded.

Table Note 2: In the searches performed according to the method of FIG. 4 and the technology disclosed herein, the ODS-BER TBCC (for a fixed code rate R, constraint length v, and payload size K) all have the same weight spectrum $WS(C)=\{(d,n_d,b_d): d=d_f, d_f+1, \ldots\}$. In these searches, the ODS-FER TBCC may not have the same weight spectrum WS(C). That is, the ODS-FER TBCC have the same partial weight spectrum $\{(d,n_d): d=d_f, d_f+1, \ldots\}$ but may have different partial weight spectrum $\{(d,b_d): d=d_f, d_f+1, \ldots\}$. In the case where ODS-FER TBCC do not have the same weight spectrum WS(C), only the ODS-FER TBCC with the best partial weight spectrum $\{(d,b_d): d=d_f, d_f+1, \ldots\}$ are selected. In the fifth column, ODS-FER denotes that the TBCC in the corresponding row have ODS-FER, ODS-BER denotes that the TBCC in the corresponding row have ODS-BER, and ODS-FER/BER denotes that the TBCC in the corresponding row have both ODS-FER and ODS-BER.

Table Note 3: For given payload size (K), coding rate (R) and constraint length (v), usually there are more than one sets of generator polynomials which generate the optimum distance spectrum (ODS) TBCC under the FER or BER criterion (see category 2 in page 3). In the Tables all sets of generator polynomials which generate the ODS-FER (or ODS-BER) codes are permutation equivalent; that is, the codes generated by these sets of generator polynomials are equivalent if permutation of codeword bits are allowed. For example, in Table 2, for K=8 there are 2 sets of generator polynomials which generate both the ODS-FER and ODS-BER code, so only one of them (3,5,7,7) is listed. In this case, only one set of generator polynomials (3,5,7,7) is used by (and stored at) both BS and UE. There are some (very few) cases where not all of the sets of generator polynomials are permutation equivalent. For example, in Table 9, for K=9 all sets (total 10) of generator polynomials which generate both the ODS-FER and ODS-BER code can be divided into 2 permutation equivalent groups, the first group with 6 sets of generator polynomials represented by (16,46,56), and the second group with 4 sets of generator polynomials represented by (26,52,56). In this case, 2 sets of generator polynomials (either (16,46,56) or (26,52,56)) can be used by both the base station 28 and the wireless station. Note that if (16,46,56) is used by the base station 28, then it also needs to be used by the wireless station; or if (26,52,56) is used by the base station, then it also needs to be used by the wireless station 30. Thus, the letter "G" in the second column of the tables is the set of generator polynomials. Usually more than one set of generator polynomials exist for each row. For two sets of generator polynomials G1 and G2 in the same row, if the generator matrix of G1 can be obtained from the generator matrix of G2 by column permutation operations and/or row permutation operations (See, reference [9] listed hereinafter), it is said that G1 is a permutation equivalent to G2 and only one of them is listed in the second column. Therefore, for each value of K, we divide the sets of generator polynomials into different permutation equivalent groups. The number of equivalent sets of generator polynomials in each group is listed under the fourth column of each table and labeled by "# permutation equivalent codes".

For example, suppose C1 is the set of codewords generated by the set of generator polynomials G1, and suppose the codeword length is 6. Then if each codeword is permuted (a,b,c,d,e,f) in C1 by a fixed permutation pattern to generate a permutated codeword, say (b,c,a,e,d,f), then the new set of permuted codewords C2 is permutation equivalent to C1. The codewords in C1 and C2 are actually the same but with different orderings of the codeword bits. As stated above, for sets of generator polynomials are permutation equivalent, only one such set is listed in the Tables below.

Table Note 4: The term "WS" in the third column of the tables stands for weight spectrum. Under this column only the first line of the weight spectrum $(d_f, n_{df}, b_{df})$ is listed.

In an example implementation, L is chosen to be 20 for the search of act 4-3. To find ODS codes, by definition all lines of the weight spectrum need to be computed at act 4-3. Most of the codes considered herein have less than 20 lines of the weight spectrum. Therefore, L can be chosen to be 20 to cover most of the cases. During act 4-3, if some code has more than 20 lines of the weight spectrum (for example, when the payload size K is very large), then only the first 20 lines are computed and are used in act 4-3 to see if the code is ODF-FER (or ODS-BER).

If the ODS-FER (or ODS-BER) codes found after act 4-3 have more than 20 lines of the weight spectrum, the extra lines beyond the first 20 lines will be computed to make sure the selected codes have the optimum weight spectrum.

The function Q(x), described previously, is a monotonically decreasing function, which means that Q(x)>Q(y) if y>x. For large Eb/N0 values (high SNR region), only the first few lines of the weight spectrum (with smaller values of d) will have significant contributions to $P_{F,UB}$ and $P_{B,UB}$. For the extremely large Eb/N0 value, only the first line of the weight spectrum will have significant contributions to $P_{F,UB}$ and $P_{B,UB}$, and this corresponds to the MFD-FER (or MFD-BER) criterion where we assume Eb/N0 value is very large. For the small and medium Eb/N0 values, all lines of the weight spectrum will contribute to $P_{F,UB}$ and $P_{B,UB}$. Therefore, for the MFD-FER (or MFD-BER) codes, it can only be guaranteed that they will have the smallest value of $P_{F,UB}$ (or $P_{B,UB}$) over the high SNR region. Over the small and medium SNR region, the MFD-FER (or MFD-BER) codes may not have the smallest value of $P_{F,UB}$ (or $P_{B,UB}$). However, as the low error rate transmission (that is, over the high SNR region) is the desired mode of transmission, it makes sense to optimize the codes over the high SNR region. Since ODS-FER (or ODS-BER) codes have the optimum first L lines (L=20 in this example) of the weight spectrum, they will have the smallest value of $P_{F,UB}$ (or $P_{B,UB}$) over most of the SNR region.

Advantageously, ODS-FER TBCC have the optimum weight spectrum for achieving lower FER, and ODS-BER TBCC have the optimum weight spectrum for achieving lower BER.

Figure 5:
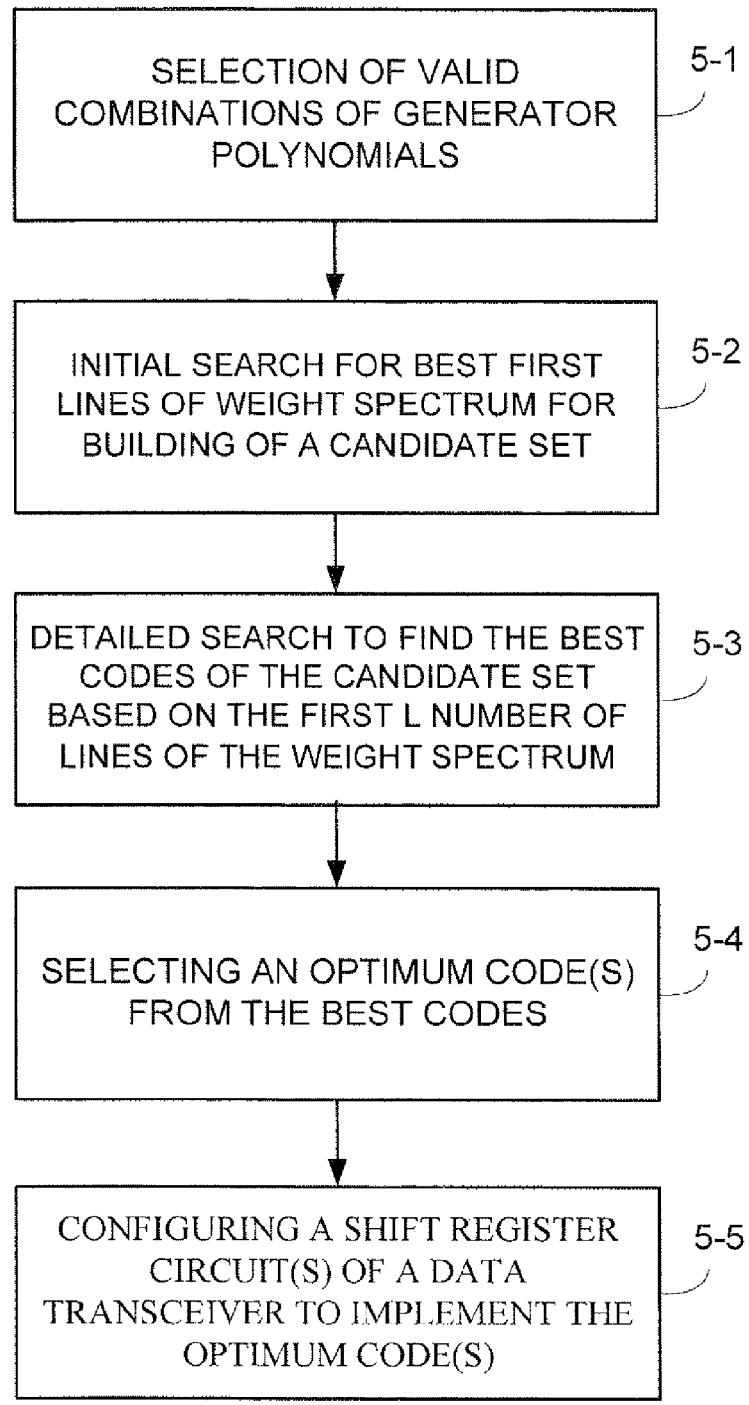
FIG. 5 is a flow chart showing basic, representative acts or steps which comprise a method of code determination and utililization according to the technology disclosed herein.

FIG. 5 shows a variation of the general method of FIG. 4, wherein acts 5-1 through 5-4 are essentially the same as acts 4-1 through 4-4, respectively, of FIG. 4. FIG. 5 differs from FIG. 4 by showing that, in one example method implementation, act 4-5 of FIG. 4 (the act of outputting the optimized tail biting convolutional code(s)) can comprise configuring a shift register circuit(s) of a data transceiver to implement the optimum code(s).

Figure 1:
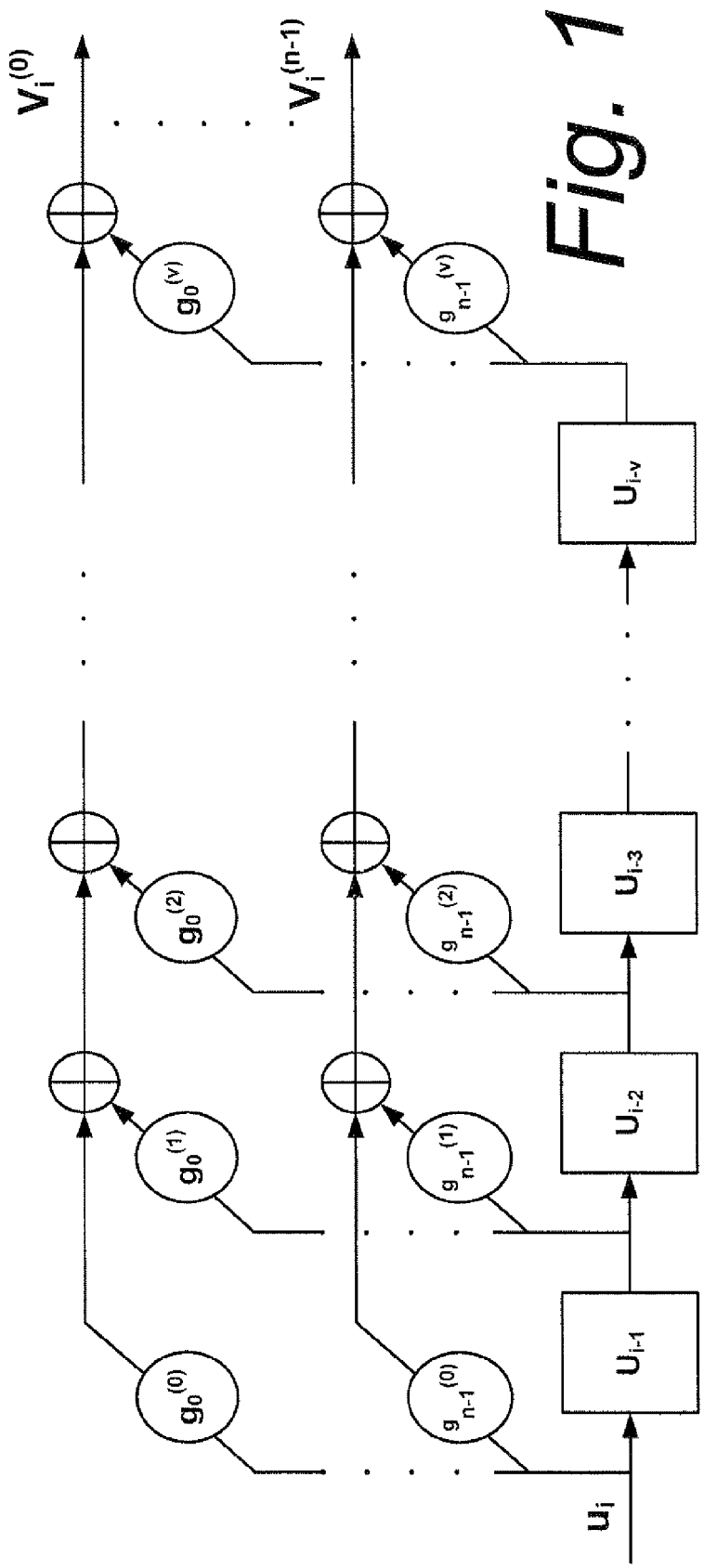
FIG. 1 is a diagrammatic view of encoder structure of a rate 1/n feedforward convolutional code with constraint length v.
Figure 2:
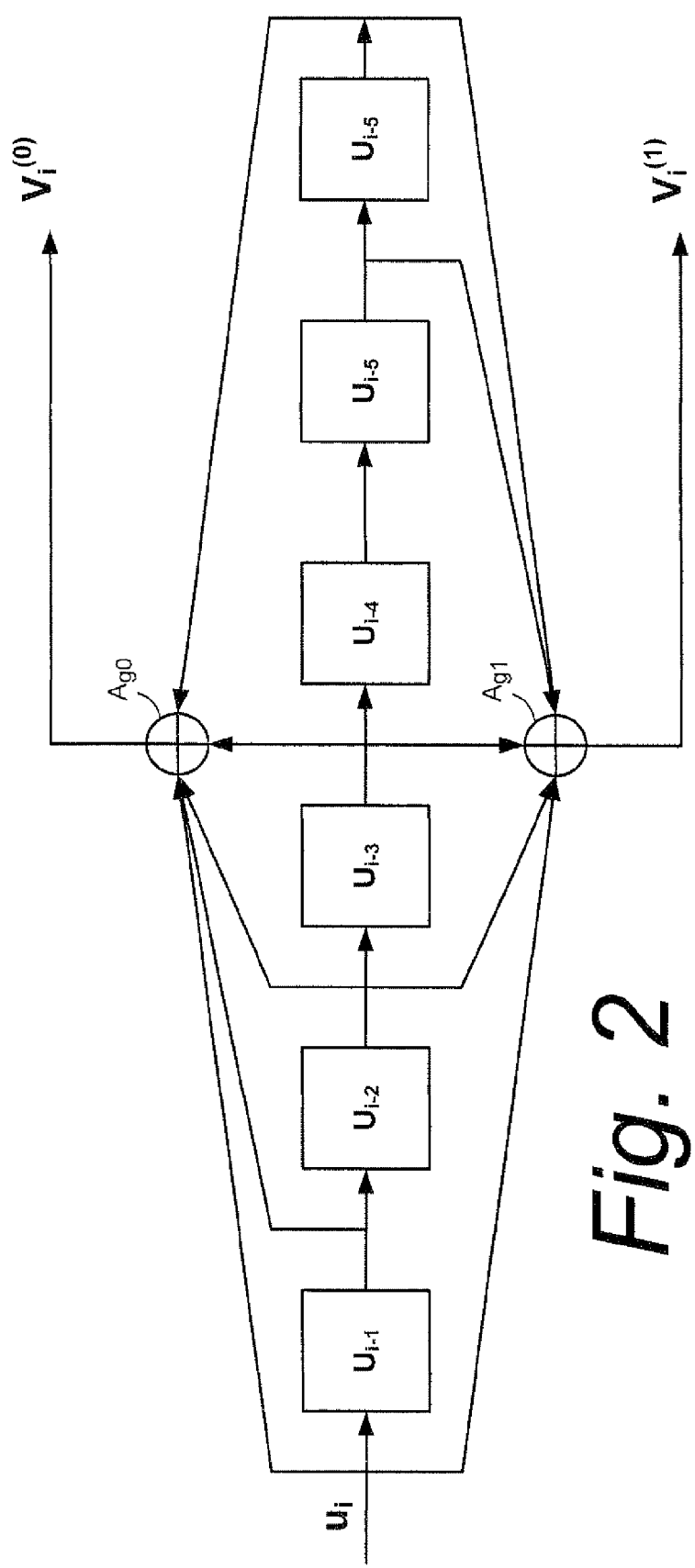
FIG. 2 is a diagrammatic view of an example encoder for 802.16 Tail-biting convolutional codes (TBCC) having code rate $1/n=\frac{1}{2}$, constraint length v=6, and $G=(g_0, g_1)$, where $g_0=$ (1, 1, 1, 1, 0, 0, 1) and $g_1=$(1, 0, 1, 1, 0, 1, 1).

The person skilled in the art will appreciate, particularly with reference to the preceding discussion of FIG. 1 and FIG. 2, how to configure a shift register circuit by connecting outputs of shift registers in order to implement the set of generator polynomials that comprise the optimized tail biting convolutional code. The shift register circuit which is configured to implement the optimized tail biting convolutional code can comprise, for example, one or more of base station error correction encoder 52 and base station error correction decoder 66 of base station 28 and wireless station error correction encoder 82 and wireless station error correction decoder 96 of wireless station 30. Since the mapping from one set of generator polynomials to the shift register encoder is illustrated in FIG. 1 and FIG. 2, and taking FIG. 2 as an example, implementation of a optimized tail biting convolutional code in a shift register circuit can be realized in three basic acts. A first act comprises taking the set of optimum generator polynomials from the Tables 2-21, such as the optimized tail biting convolutional code (744,554), for example. The second act comprises transforming the octal representation (e.g., 744,554) to binary representation, e.g., $g0=(1,1,1,1,0,0,1)$ and $g1=(1,0,1,1,0,1,1)$, where g0 is from 744, and g1 is from 554. The third act comprises configuring the connections (from shift registers to outputs) in the circuit according to g0 and g1, where 1=connection and 0=no connection. For example, g0 is for connections from the upper part of the shift registers to output Vi(0), and (from left to right) there are four connections followed by two "no connections" then ended by one connection.

Figure 6:
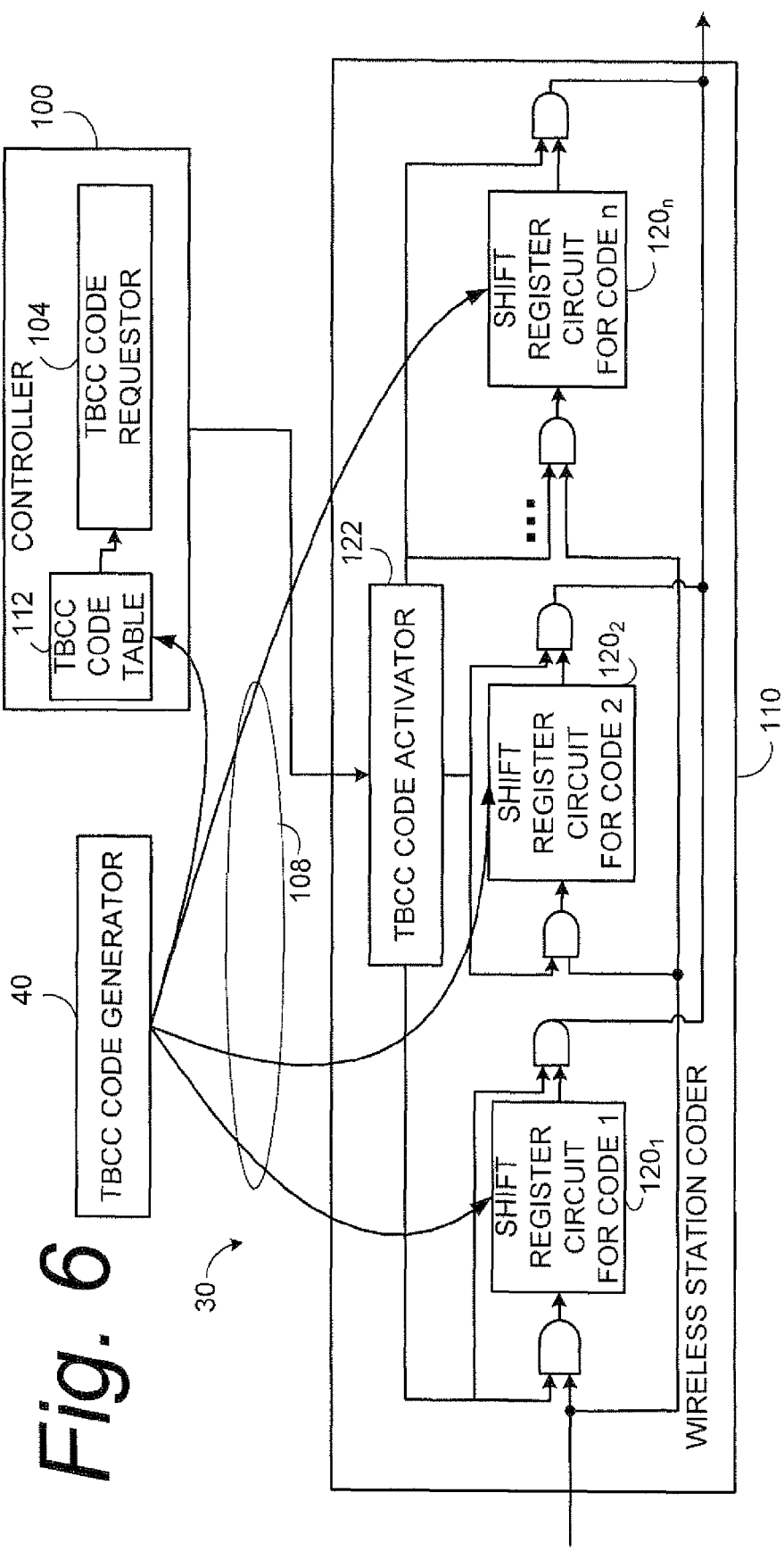
FIG. 6 is a diagrammatic view of a portion of a wireless station including a wireless station coder according to an example embodiment.

FIG. 6 illustrates portions of an example wireless station 30, and particularly portions of a wireless station coder 110 which operates in conjunction with wireless station controller 100. The wireless station coder 110 can comprise a portion of a baseband application specific integrated circuit (ASIC) which hosts, in addition to coding, other baseband processing functionalities. In the example embodiment shown in FIG. 6, wireless station controller 100 comprises not only TBCC code requestor 104, but also TBCC code table 112. The wireless station coder of FIG. 6 serves to illustrate the wireless station error correction encoder 82. As shown in FIG. 6, wireless station coder 110 comprises plural shift register circuits $120_1$-$120_n$ and code activator 122. Each of the plural shift register circuits $120_1$-$120_n$ is configured to implement a respective different one of plural optimum tail biting convolutional codes. Each of the plural optimum tail biting convolutional codes implemented by the respective shift register circuits $120_1$-$120_n$ is of a different rate and is expressed by a set of polynomials listed in any of Table 2-Table 21. FIG. 6 shows by arrow 108 that the configuration of the respective shift register circuits $120_1$-$120_n$ is based upon identification of different ones of the optimized tail biting convolutional codes generated by optimized tail biting convolutional code generator 40. The code activator 122 is configured to include one of the plural shift register circuits $120_1$-$120_n$ in a processing stream for a respective data transmission over the channel. The code activator 122 includes an appropriate one of the plural shift register circuits $120_1$-$120_n$ in the processing stream by operating AND gates so that an input signal to wireless station coder 110 is applied only to the one activated shift register circuits 120, and so that an output signal from the wireless station coder 110 is taken only from the activated shift register circuits 120.

Figure 7:
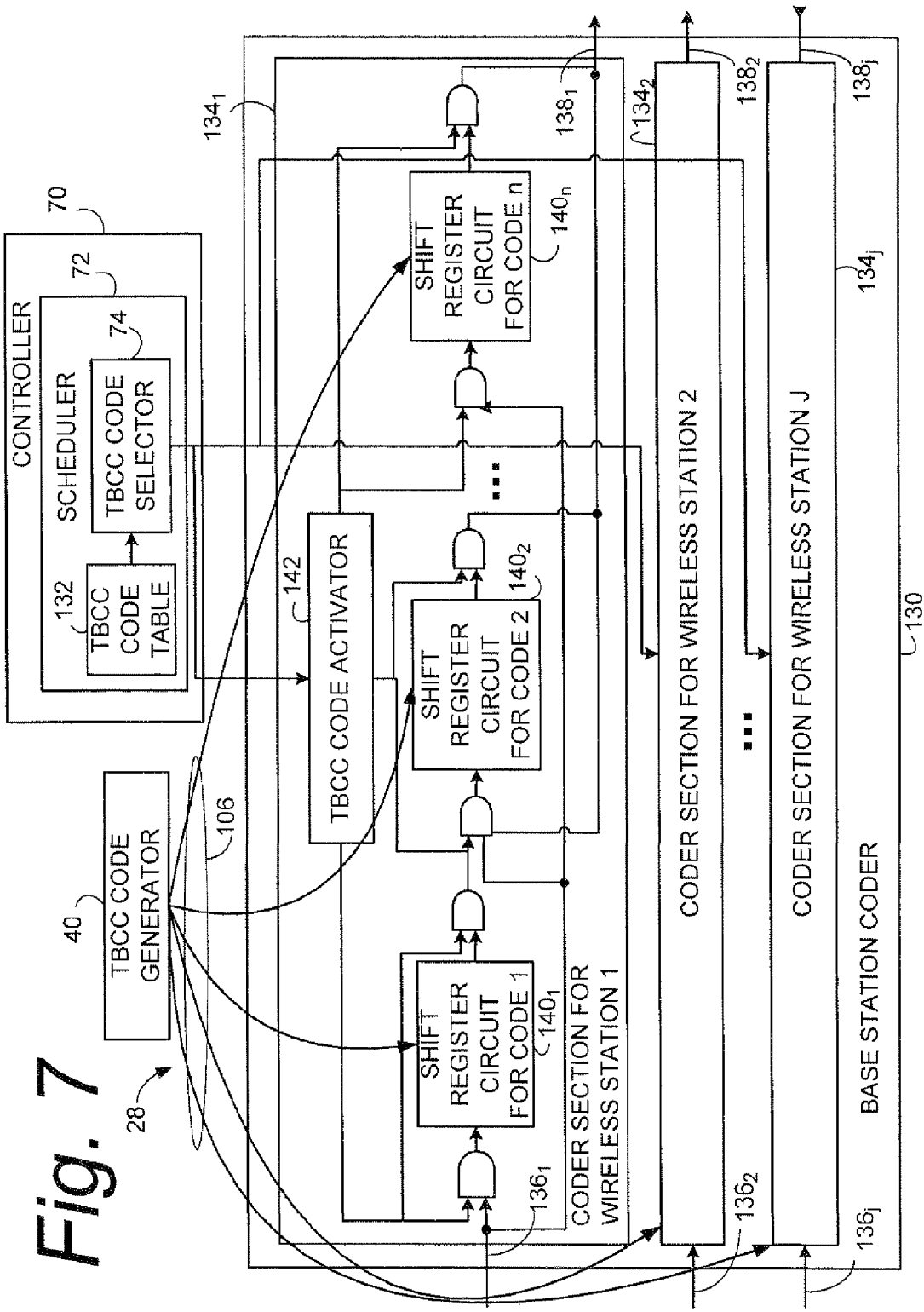
FIG. 7 is a diagrammatic view of a portion of a base station node including a base station coder according to an example embodiment.

FIG. 7 illustrates portions of an example base station 28, and particularly portions of a base station coder 130 and base station node controller 70. Base station node controller 70 comprises base station scheduler 72, which in turn comprises TBCC code selector 74 and TBCC code table 132.

The base station coder 130 can, at any one time, serve plural channels or even plural wireless stations by engaging in separately encodable connections, frames, or sessions with the plural wireless stations over network interface 32. For example, base station 28 may transmit multiple signals, like one control channel and one data channel, to a first wireless station at the same time, and the TBCCs (or other error correction code) in these channels may be different. For example, the base station 28 may use different tail biting convolutional codes (or different error correction codes) to protect the data of different wireless stations, as different wireless stations may have different applications or requirements. For example, a first wireless station may ask the base station to use a rate ½ TBCC with payload size 12 bits, while a second wireless station may ask the base station 28 to use a rate ¼ TBCC with payload size 24 bits. Another example is that a first wireless station may ask the base station to use a rate ½ TBCC with payload size 12 bits to transmit the short control channel, and the second wireless station may ask the base station to use a more powerful error correction codes (like turbo code) to transmit the long data channel with 5000 payload bits. Moreover, for a single wireless station a base station 28 may also use different tail biting convolutional codes (or different error correction codes) for different applications executed at the same wireless station.

Therefore in one example embodiment it is not be possible for multiple TBCCs (for multiple channels) to use the same shift registers but different output connections at the same time. Different channels may be encoded at different times (with reconfigurations between them), but this option is dependent upon the available processing time. In an example implementation, each wireless station 30 has one ASIC to do the baseband processing including channel encoder/decoder. The wireless station 30 may transmit multiple signals, like one control channel and one data channel, to base station 28.

In view of the foregoing, base station coder 130 is shown as comprising plural coder sections $134_1$ through $134_j$, each separate coder section 134 being assignable to or usable in conjunction with a different channel or wireless station or set of wireless stations. Each coder section can comprise a portion of a baseband application specific integrated circuit (ASIC) which hosts, in addition to coding, other baseband processing functionalities. The base station coder 130 of FIG. 7 with its plural coder sections $134_1$ through $134_j$ represents the base station error correction encoder 52 of FIG. 3. Since base station coder 130 serves plural channels or wireless stations, data in a data stream involving a first channel or wireless station can be applied to a first coder section $134_1$ as indicated by arrow $136_1$, be processed by a selected shift register circuit 140 of coder section $134_1$, and output from the selected shift register circuit 140 of coder section $134_1$ as indicated by arrow $138_1$. Similarly, data in a data stream involving a second channel or second wireless station can be applied to a second coder section $134_2$ as indicated by arrow $136_2$, be processed by a selected shift register circuit 140 of coder section $134_2$, and output from the selected shift register circuit 140 of coder section $134_2$ as indicated by arrow $138_2$, and so forth for each of the plural coder sections 134.

Each of the plural coder sections 134 of base station coder 130 comprise plural shift register circuits 140 and a TBCC code activator 142. For example, coder section $134_1$ is shown in FIG. 7 as comprising shift register circuits $140_1$-$140_n$. As in similar manner with the wireless station coder 110 of FIG. 6, each of the plural optimum tail biting convolutional codes implemented by the respective shift register circuits $140_1$-$140_n$ is of a different rate and is expressed by a set of polynomials listed in any of Table 2-Table 21. FIG. 7 shows by arrow 106 that the configuration of the respective shift register circuits $140_1$-$140_n$ is based upon identification of different ones of the optimized tail biting convolutional codes generated by optimized tail biting convolutional code generator 40. For each coder section 134, the code activator 142 is configured to include one of the plural shift register circuits $140_1$-$140_n$ in a processing stream for a respective data transmission over the channel. For each coder section 134, the code activator 142 includes an appropriate one of the plural shift register circuits $140_1$-$140_n$ in the processing stream by operating AND gates so that an input signal to base station coder 130 is applied only to the one activated shift register circuits 140, and so that an output signal from the base station coder 130 is taken only from the activated shift register circuits 140.

Now that the example embodiment of base station 28 of FIG. 7 and the example embodiment of wireless station 30 of FIG. 6 have been described, an example operation scenario involving both now follows. Suppose for example that there are four possible tail biting convolutional codes that can be used between base station 28 and wireless station 30. These four possible tail biting convolutional codes each have different rates, for example a first TBCC having a rate ⅕ (which is denoted by a rate value "00"); a second example TBCC having a rate ¼ (denoted by a rate value "01"); a third example TBCC having a rate ⅓ (denoted by a rate value of "10"); and a fourth example TBCC having a rate ½ (denoted by a rate value of "11"). Each of these TBCCs is an optimized tail biting convolutional codes and is obtained by the method of FIG. 3 and/or FIG. 4 and is expressed by a set of polynomials listed in any of Table 2-Table 21. It is assumed for simplicity these 4 TBCC have the same payload size and constraint length.

To accommodate these TBCC having different rates, in wireless station coder 110 the coder section $120_1$ is configured to implement the first TBCC having a rate ⅕, the coder section $120_2$ is configured to implement the second example TBCC having a rate ¼, a coder section $120_3$ is configured to implement the third example TBCC having a rate ⅓; and a coder section $120_4$ is configured to implement the fourth example TBCC having a rate ½. Similarly, in base station coder 130 an appropriate one of the coder sections 134 for the involved wireless station is configured to implement the four TBCCs of different rates. For example, in base station coder 130 the coder section $140_1$ is configured to implement the first TBCC having a rate ⅕, the coder section $140_2$ is configured to implement the second example TBCC having a rate ¼, a coder section $140_3$ is configured to implement the third example TBCC having a rate ⅓; and a coder section $140_4$ is configured to implement the fourth example TBCC having a rate ½.

In the scenario under discussion, wireless station 30 typically measures the strength of the signal it receives from base station 28, for example the symbol energy to noise power spectral density ratio Es/N0. Then the measurement (e.g. Es/N0) will be further processed by the wireless station 30 to decide which TBCC the wireless station 30 thinks should be used between base station 28 and wireless station 30. If wireless station 30 gets a very strong measurement (Es/N0 is larger than a threshold, meaning that the channel quality is very good and the weakest code is good enough for error protection), then the TBCC with rate ½ (the higher the rate, the weaker the code) is selected by TBCC code requestor 104, and a rate value of "11" is sent from the 104 of wireless station 30 to base station 28 through an appropriate message or channel, e.g., on the Channel Quality Indicator (CQI) channel. On the other hand, if wireless station 30 obtains a very weak measurement (Es/N0 is smaller than a threshold, meaning that the channel quality is very bad and the strongest code is needed for error protection), then the TBCC with the rate ⅕ is selected by TBCC code requestor 104 of wireless station 30, and a rate value of "00" is sent from wireless station 30 to base station 28 (e.g., through the CQI channel).

It will be appreciated that a message such as the CQI message may and like does also include other suggestions in addition to TBCC preference, such as (for example) the modulation order (2 for QPSK, 4 for 16QAM, 6 for 64-QAM, etc). Moreover, the rate value carried from TBCC code requestor 104 of wireless station 30 to base station 28 in a message (such as the CQI message) is just a suggestion from the TBCC code requestor 104 to the base station 28 about which TBCC the TBCC code requester 104 of the wireless station 30 thinks should be used.

Upon receipt of the suggestion from wireless station 30, and possibly in conjunction with CQI messages received from all wireless stations, the base station 28 makes its final decisions about which TBCC is to be used for each/which wireless station 30. The TBCC choice decided by the base station 28 may be different from the suggestion of the wireless station 30 as expressed in the CQI message. The TBCC code selector 74 of the base station 28 makes the decisions according to such factors as the available resources, the Quality of Service (QoS) requirements of different UEs, etc. The TBCC code selector 74 is able to make an intelligent decision regarding which particular TBCCs are possible at a particular wireless station in view of the fact that the base station scheduler 72 comprises TBCC code table 132. The TBCC code table 132 includes a listing of the wireless stations served by the base station 28, as well as an identification of the optimized tail biting convolutional codes available at (implemented or implementable in the shift register circuit(s)) the respective wireless stations 30.

As an example of TBCC code selection, a CQI from a first wireless station might request that a rate ¼ with payload size 10 bits and modulation order 2 (2 coded bits per symbol) be used. This means that the base station 28 needs to allocate 10*4/2=20 modulation symbols for the first wireless station. If the available resource is not enough (for example there are only 10 OFDM tones left in the base station 28 for the first wireless station (one OFDM tone transmits one modulation symbol), then the base station 28 will tell the first wireless station to use rate ½ instead, since only 10*2/2=10 modulation symbols is needed. As another example, if the first wireless station has a higher priority than a second wireless station (different QoS), then the base station 28 will first try to meet the request (CQI) from the first wireless station.

Upon making its TBCC selection for a particular wireless station, the TBCC code selector 74 directs the TBCC code activator 142 for the appropriate coder section 134 to activate the one of the shift register circuits 140 which corresponds to the selected tail biting convolutional code for that wireless station 30. Further, the decision of which TBCC to be used for each wireless station 30 is sent from the base station 28 to the wireless station through an appropriate message, such as the Media Access Control (MAC) management message in the UL-Media Access Protocol (MAP) channel (in WiMAX system). Upon receipt of the TBCC decision, the wireless station controller 100 directs the code activator 122 to activate the one of the shift register circuits 120 which corresponds to the selected tail biting convolutional code for that wireless station 30.

Figure 8:
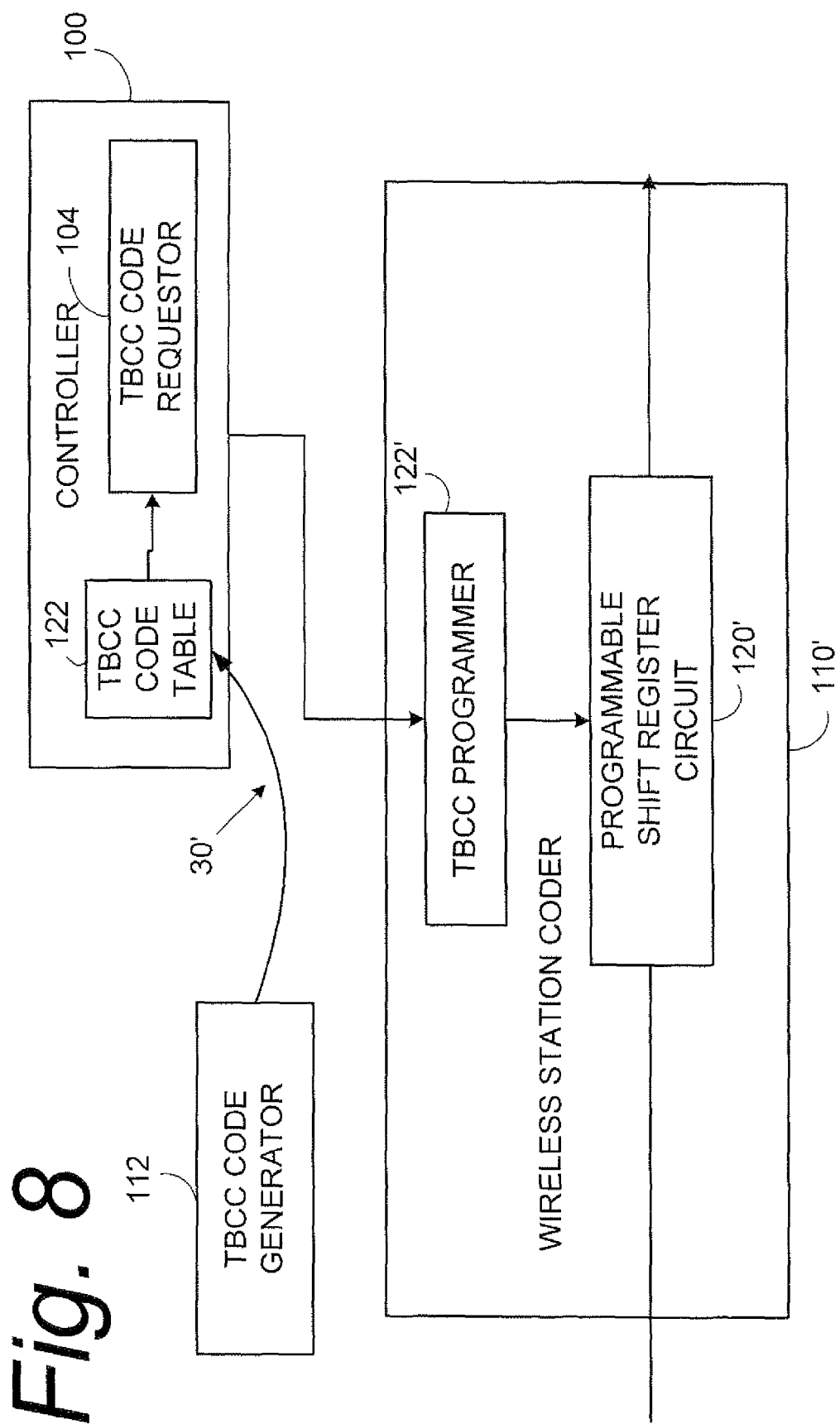
FIG. 8 is a diagrammatic view of a portion of a wireless station including a wireless station coder according to another example embodiment.
Figure 9:
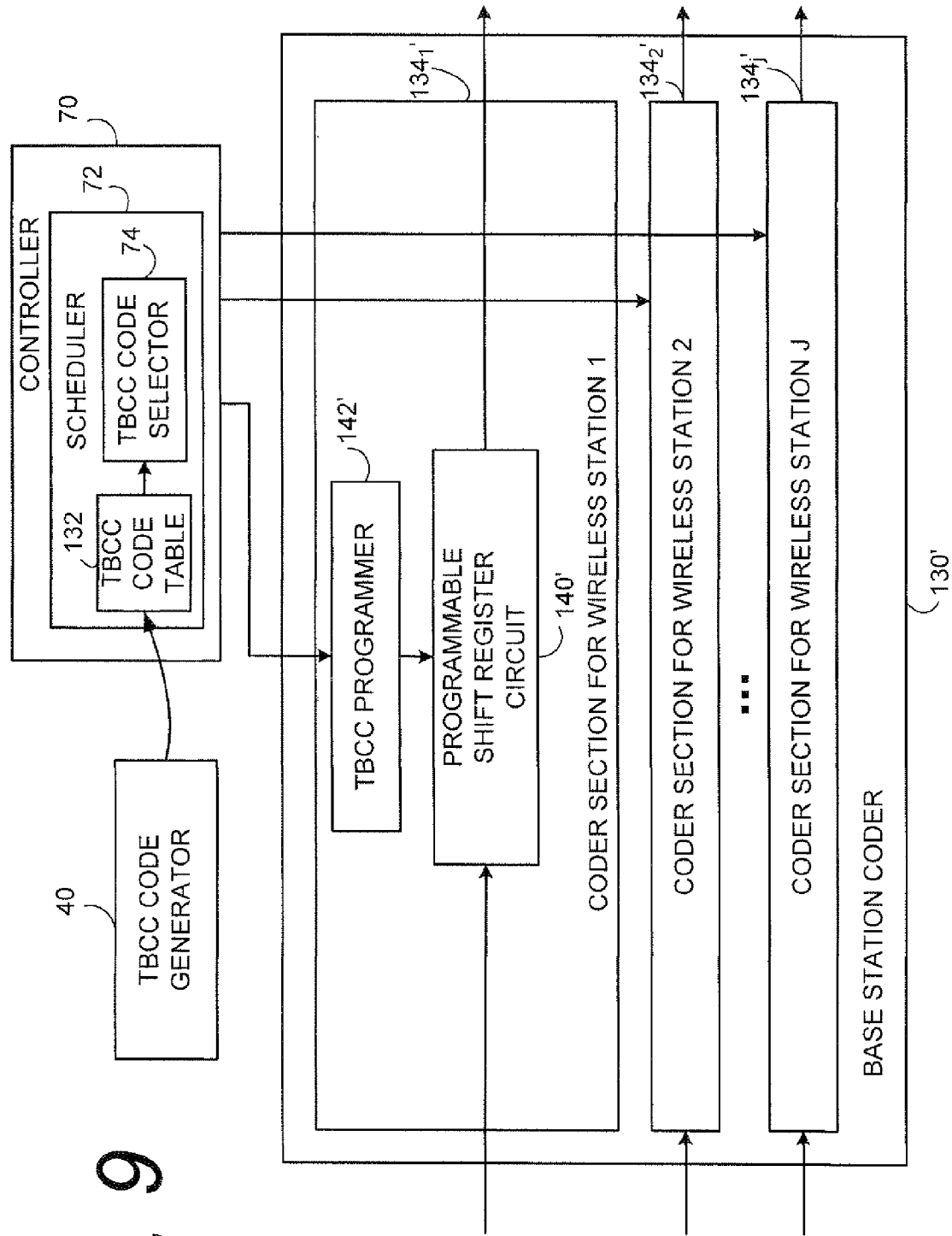
FIG. 9 is a diagrammatic view of a portion of a base station node including a base station coder according to another example embodiment.

Whereas the wireless station 30 of FIG. 6 and the base station 28 of FIG. 7 comprise coder sections which include plural dedicated shift register circuits (with each shift register circuit being configured in essentially dedicated manner to implement a specific optimized tail biting convolutional code), the wireless station 30' partially shown in FIG. 8 and base station 28' partially shown in FIG. 9 comprise coder sections which include a programmable shift register circuit that is changed for implementing different optimized tail biting convolutional codes at different times. In this regard, in wireless station 30' of FIG. 8 the wireless station coder 110' comprises programmable shift register circuit 120' and TBCC programmer 122'. Similarly, each coder section 134' of base station coder 130' of FIG. 9 comprises programmable shift register circuit 140' and TBCC programmer 142'.

The programmable shift register circuit 120' of the wireless station coder 110' of FIG. 8 and the programmable shift register circuit 140' of base station coder 130' of FIG. 9 can be reprogrammed essentially on the fly by the respective programmers 122' and 142' to implement a specific optimized tail biting convolutional code which, at any given moment, the coder section needs to utilize. In this regard, the outputs of the method of FIG. 3 as generated by optimized tail biting convolutional code generator 40 can be applied (e.g., stored) in TBCC code table 112 and TBCC code table 132, so that the respective controllers 100 and 70 can interact with the programmers 122' and 142' for implementing in the programmable shift register circuits the specific optimized tail biting convolutional code which is necessary at any given time. For example, a limited set of possible optimized tail biting convolutional codes generated by the method of FIG. 3 and/or FIG. 4 can be generated by optimized tail biting convolutional code generator 40 and their generator polynomials stored in TBCC code table 112 of wireless station 30' and in TBCC code table 132 of base station 28', so that base station 28' and wireless station 30' have pre-knowledge of the possible optimized tail biting convolutional codes to be used.

The configuration of output terminals of a shift register circuit for a TBCC coder is understood by the person skilled in the art from the descriptions of FIG. 1 and FIG. 2, and programmable shift register circuits are understood with reference to, for example, US Patent Publication 2008/0228951.

While the controllers and coders of both the base stations and wireless stations have been illustrated and described as being structurally distinct, it should be realized that functionalities may be shared. For example, the code tables and code requestor(s)/selector(s) mentioned herein can, instead of being separate from the coders, actually comprise ASICs or other circuitry that embody the shift resister circuit-hosting coders.

There are usually more than one control channels sent at the beginning of each frame, and frame control header (FCH) is one of them in WiMAX. Different control channels can send different messages for controlling different functionalities. The technology disclosed herein can be applied to channels whose payload sizes are not too big (less than about 40 bits), as TBCC are more efficient when payload size is small. So the technology disclosed herein can be applied to control channels and to the specific frame control headers, with there being essentially no difference in considerations or acts/steps performed.

References (All of which are Incorporated by Reference Herein)

[1] H. H. Ma and J. K. Wolf, "On tail biting convolutional codes," IEEE Trans. Commun., vol. 34, pp. 104-111, February 1986.

[2] K. J. Larsen, "Short convolutional codes with maximal free distance for rate ½, ⅓, and ¼," IEEE Trans. Inform. Theory, vol. 19, pp. 371-372, May 1973.

[3] J.-J. Chang, D.-J. Hwang and M.-C. Lin, "Some extended results on the search for good convolutional codes," IEEE Trans. Inform. Theory, vol. 43, pp. 1682-1697, September 1997.

[4] P. Frenger, P. Orten and T. Ottosson, "Convolutional codes with optimum distance spectrum," IEEE Commun. Letters, vol. 3, pp. 317-319, November 1999.

[5] P. Ståhl, J. B. Anderson and R. Johannesson, "Optimal and near-optimal encoders for short and moderate-length tail-biting trellises," IEEE Trans. Inform. Theory, vol. 45, pp. 2562-2571, November 1999.

[6] P. Ståhl, J. B. Anderson and R. Johannesson, "A note on tailbiting codes and their feedback encoders," IEEE Trans. Inform. Theory, vol. 48, pp. 529-534, February 2002.

[7] Y. Ould-Cheikh-Mouhamedou, S. Crozier and P. Kabal, "Distance measurement method for double binary turbo codes and a new interleaver design for DVB-RCS," IEEE Globecom 04, pp. 172-178.

[8] R. Johannesson and K. S. Zigangirov, Fundamentals of convolutional coding. Piscataway, N.J.: IEEE Press, 1999.

[9] S. Lin and D. J. Costello, Jr, Error control coding. Upper Saddle River, N.J.: Pearson, 2004.

[10] 3GPP TS 45.003, "$3^{rd}$ Generation Partnership Project; Technical Specification Group GSM/EDGE Radio Access Network; Channel Coding (Release 7)", V7.1.0, 2007-02.

[11] IEEE Std 802.16-2004, "IEEE Standard for Local and Metropolitan Area Networks—Part 16: Air Interface for Fixed Broadband Wireless Access Systems", October, 2004.

[12] IEEE Std P802.16e-2005, "IEEE Standard for Local and Metropolitan Area Networks—Part 16: Air Interface for Fixed and Mobile Broadband Wireless Access Systems", February, 2006.

[13] 3GPP TS 36.212, "$3^{rd}$ Generation Partnership Project; Technical Specification Group Radio Access Network; Evolved Universal Terrestrial Radio Access (E-UTRA); Multiplexing and channel Coding (Release 8)", V8.0.0, 2007-09.

[14] M. Mzyece and J. Dunlop, "Performance evaluation of suboptimal decoding schemes for tail biting convolutional codes in EDGE headers," IEE Electronics Letters, vol. 39, no. 17, pp. 1280-1281, August 2003.

[15] R. V. Cox and C.-E. W. Sundberg, "An efficient adaptive circular viterbi algorithm for decoding generalized tail-biting convolutional codes," IEEE Trans. Veh. Technol., vol. 43, pp. 57-68, February 1994.

TABLE 1

SUMMARY OF TABLES FOR THE ODS FEEDFORWARD TAIL-BITING CONVOLUTIONAL CODES (TBCC)

| Constraint length v | Rate ¼ | Rate ⅓ | Rate ½ | Rate ⅕ | Rate ⅖ |
|---|---|---|---|---|---|
| 2 | Table 2 | Table 7 | Table 13 | Table 20 | N/A |
| 3 | Table 3 | Table 8 | Table 14 | Table 20 | Table 21 |
| 4 | Table 4 | Table 9 | Table 15 | Table 20 | Table 21 |
| 5 | Table 5 | Table 10 | Table 16 | Table 20 | Table 21 |
| 6 | Table 6 | Table 11 | Table 17 | N/A | Table 21 |
| 7 | N/A | Table 12 | Table 18 | N/A | Table 21 |
| 8 | N/A | N/A | Table 19 | N/A | N/A |

TABLE 2

NEW ODS FEEDFORWARD TBCC WITH RATE ¼ AND CONSTRAINT LENGTH V = 2

| K | G | WS | # permutation equivalent codes | Note |
|---|---|---|---|---|
| 3 | (1, 1, 3, 5) | (6, 4, 6) | 30 | ODS-BER |
| 6 | (1, 3, 5, 7) | (8, 6, 6) | 6 | ODS-BER |
| 8 | (3, 5, 7, 7) | (10, 16, 24) | 2 | ODS-FER/BER |
| 9 | (3, 5, 7, 7) | (10, 18, 27) | 2 | ODS-FER/BER |

TABLE 3

NEW ODS FEEDFORWARD TBCC WITH RATE ¼ AND CONSTRAINT LENGTH V = 3

| K | G | WS | # permutation equivalent codes | Note |
|---|---|---|---|---|
| 3 | (4, 4, 14, 50) | (6, 4, 6) | 372 | ODS-BER |
| 9 | (44, 54, 64, 74) | (12, 12, 18) | 1 | ODS-BER |

TABLE 4

NEW ODS FEEDFORWARD TBCC WITH RATE ¼ AND CONSTRAINT LENGTH V = 4

| K | G | WS | # permutation equivalent codes | Note |
|---|---|---|---|---|
| 3 | (2, 2, 6, 42) | (6, 4, 6) | 5238 | ODS-BER |
| 5 | (2, 6, 16, 52) | (9, 10, 20) | 1058 | ODS-FER/BER |
| 6 | (2, 6, 26, 76) | (10, 9, 18) | 120 | ODS-FER/BER |
| 10 | (26, 36, 46, 56) | (14, 30, 60) | 8 | ODS-FER/BER |
| 11 | (46, 52, 56, 76) | (15, 22, 66) | 2 | ODS-BER |

TABLE 5

NEW ODS FEEDFORWARD TBCC WITH RATE ¼ AND CONSTRAINT LENGTH V = 5

| K | G | WS | # permutation equivalent codes | Note |
|---|---|---|---|---|
| 3 | (1, 1, 3, 41) | (6, 4, 6) | 78273 | ODS-BER |
| 5 | (1, 3, 7, 52) | (9, 10, 20) | 17596 | ODS-FER/BER |
| 6 | (1, 3, 13, 57) | (10, 9, 18) | 2352 | ODS-FER/BER |
| 8 | (1, 23, 45, 77) | (12, 8, 16) | 72 | ODS-FER/BER |
| 9 | (13, 17, 23, 56) | (14, 72, 261) | 60 | ODS-FER/BER |
| 10 | (27, 47, 57, 61) | (16, 285, 1350) | 4 | ODS-FER/BER |
| 14 | (45, 53, 73, 77) | (18, 84, 364) | 2 | ODS-BER |
| 16 | (47, 53, 67, 75) | (18, 48, 96) | 2 | ODS-FER |
| 16 | (45, 53, 73, 77) | (18, 48, 80) | 2 | ODS-BER |
| 17 | (47, 53, 67, 75) | (18, 51, 102) | 2 | ODS-FER |
| 17 | (45, 53, 73, 77) | (18, 51, 85) | 2 | ODS-BER |
| 18 | (47, 53, 67, 75) | (18, 54, 108) | 2 | ODS-FER |
| 18 | (45, 53, 73, 77) | (18, 54, 90) | 2 | ODS-BER |
| 19 | (45, 57, 67, 75) | (18, 57, 95) | 2 | ODS-FER/BER |
| 20 | (45, 57, 67, 75) | (18, 60, 100) | 2 | ODS-FER/BER |
| 21 | (45, 57, 67, 75) | (18, 63, 105) | 2 | ODS-FER/BER |
| 24 | (45, 57, 67, 75) | (18, 72, 120) | 2 | ODS-FER/BER |

TABLE 6

NEW ODS FEEDFORWARD TBCC WITH RATE ¼ AND CONSTRAINT LENGTH V = 6

| K | G | WS | # permutation equivalent codes | Note |
|---|---|---|---|---|
| 2 | (4, 4, 4, 410) | (5, 2, 2) | 1279360 | ODS-FER/BER |
| 3 | (4, 4, 14, 430) | (6, 3, 6) | 791712 | ODS-FER |
|   | (4, 4, 14, 410) | (6, 4, 6) | 1209060 | ODS-BER |
| 4 | (4, 14, 24, 414) | (8, 11, 24) | 460800 | ODS-FER/BER |
| 5 | (4, 14, 34, 444) | (9, 10, 20) | 281250 | ODS-FER/BER |
| 6 | (4, 14, 54, 570) | (10, 9, 18) | 36408 | ODS-FER/BER |
| 7 | (4, 34, 174, 524) | (12, 28, 84) | 6339 | ODS-FER/BER |
| 8 | (4, 34, 114, 674) | (12, 8, 16) | 1256 | ODS-FER/BER |
| 9 | (4, 274, 454, 764) | (14, 72, 234) | 112 | ODS-FER/BER |
| 10 | (4, 374, 454, 534) | (16, 285, 1140) | 28 | ODS-FER/BER |
| 11 | (204, 214, 724, 774) | (16, 66, 286) | 12 | ODS-FER/BER |
| 12 | (424, 474, 704, 724) | (17, 60, 324) | 2 | ODS-FER |
| 12 | (224, 324, 354, 554) | (17, 72, 312) | 16 | ODS-BER |
| 13 | (134, 564, 634, 724) | (19, 325, 1963) | 6 | ODS-FER/BER |
| 14 | (114, 534, 664, 764) | (19, 182, 1106) | 6 | ODS-FER/BER |
| 15 | (464, 534, 564, 674) | (20, 285, 1815) | 2 | ODS-FER |
| 15 | (444, 654, 674, 734) | (20, 288, 1800) | 2 | ODS-BER |
| 16 | (454, 554, 724, 774) | (20, 64, 224) | 2 | ODS-FER/BER |
| 17 | (454, 474, 724, 754) | (20, 34, 51) | 2 | ODS-FER/BER |
| 18 | (474, 554, 624, 764) | (20, 36, 54) | 2 | ODS-FER |
| 18 | (454, 474, 724, 754) | (20, 36, 54) | 2 | ODS-BER |
| 20 | (474, 554, 624, 764) | (20, 40, 60) | 2 | ODS-FER/BER |

TABLE 7

NEW ODS FEEDFORWARD TBCC WITH RATE ⅓ AND CONSTRAINT LENGTH V = 2

| K | G | WS | # permutation equivalent codes | Note |
|---|---|---|---|---|
| 3 | (1, 1, 5) | (4, 3, 3) | 12 | ODS-FER/BER |

TABLE 8

NEW ODS FEEDFORWARD TBCC WITH RATE ⅓ AND CONSTRAINT LENGTH V = 3

| K | G | WS | # permutation equivalent codes | Note |
|---|---|---|---|---|
| 7 | (4, 54, 74) | (8, 35, 91) | 8 | ODS-BER |
| 9 | (34, 54, 74) | (8, 9, 18) | 4 | ODS-FER |
| 9 | (24, 54, 64) | (8, 9, 9) | 2 | ODS-BER |

TABLE 9

NEW ODS FEEDFORWARD TBCC WITH RATE ⅓ AND CONSTRAINT LENGTH V = 4

| K | G | WS | # permutation equivalent codes | Note |
|---|---|---|---|---|
| 6 | (2, 16, 56) | (8, 45, 120) | 30 | ODS-FER/BER |
| 7 | (2, 46, 76) | (8, 21, 56) | 10 | ODS-FER/BER |
| 8 | (2, 56, 66) | (8, 1, 8) | 10 | ODS-FER/BER |
| 9 | (16, 46, 56) | (10, 99, 405) | 6 | ODS-FER/BER |
|   | (26, 52, 56) |  | 4 |  |
| 10 | (46, 66, 72) | (10, 46, 240) | 2 | ODS-FER |
| 10 | (26, 36, 46) | (10, 52, 220) | 8 | ODS-BER |
| 11 | (46, 62, 76) | (10, 11, 22) | 1 | ODS-FER |
| 11 | (16, 56, 72) | (10, 11, 22) | 3 | ODS-BER |
| 12 | (46, 52, 72) | (10, 12, 12) | 2 | ODS-BER |
| 15 | (46, 56, 72) | (11, 15, 15) | 2 | ODS-FER/BER |

TABLE 10

NEW ODS FEEDFORWARD TBCC WITH RATE ⅓ AND CONSTRAINT LENGTH V = 5

| K | G | WS | # permutation equivalent codes | Note |
|---|---|---|---|---|
| 6 | (1, 7, 53) | (8, 45, 120) | 156 | ODS-FER/BER |
| 7 | (1, 7, 57) | (8, 21, 56) | 124 | ODS-FER/BER |
| 8 | (1, 27, 66) | (8, 1, 8) | 52 | ODS-FER/BER |
| 9 | (1, 47, 75) | (10, 99, 333) | 24 | ODS-FER/BER |
| 10 | (33, 43, 53) | (10, 21, 90) | 4 | ODS-FER/BER |
| 12 | (13, 37, 53) | (12, 202, 1008) | 12 | ODS-BER |
| 17 | (47, 57, 65) | (13, 34, 68) | 2 | ODS-BER |

TABLE 11

NEW ODS FEEDFORWARD TBCC WITH RATE ⅓ AND CONSTRAINT LENGTH V = 6

| K | G | WS | # permutation equivalent codes | Note |
|---|---|---|---|---|
| 3 | (4, 4, 410) | (4, 3, 3) | 42984 | ODS-FER/BER |
| 6 | (4, 34, 530) | (8, 45, 120) | 1326 | ODS-FER/BER |
| 7 | (4, 34, 534) | (8, 21, 56) | 751 | ODS-FER/BER |
| 8 | (4, 134, 614) | (8, 1, 8) | 314 | ODS-FER/BER |
| 9 | (4, 74, 554) | (10, 99, 306) | 112 | ODS-FER/BER |
| 10 | (154, 214, 530) | (10, 21, 90) | 40 | ODS-FER |
| 10 | (4, 314, 674) | (10, 26, 80) | 28 | ODS-BER |
| 13 | (434, 574, 664) | (12, 39, 338) | 2 | ODS-FER |
| 13 | (104, 554, 574) | (12, 39, 156) | 6 | ODS-BER |
| 17 | (474, 634, 654) | (14, 51, 306) | 2 | ODS-FER |
| 17 | (574, 654, 764) | (14, 51, 170) | 1 | ODS-BER |
| 21 | (464, 564, 674) | (15, 84, 210) | 2 | ODS-BER |
| 22 | (474, 564, 664) | (15, 66, 154) | 2 | ODS-BER |

TABLE 12

NEW ODS FEEDFORWARD TBCC WITH RATE ⅓ AND CONSTRAINT LENGTH V = 7

| K | G | WS | # permutation equivalent codes | Note |
|---|---|---|---|---|
| 4 | (2, 6, 406) | (6, 12, 24) | 200704 | ODS-FER/BER |
| 5 | (2, 16, 422) | (7, 15, 35) | 49000 | ODS-FER/BER |
| 6 | (2, 16, 452) | (8, 45, 120) | 10584 | ODS-FER/BER |
| 7 | (2, 16, 534) | (8, 21, 56) | 6318 | ODS-FER/BER |
| 8 | (2, 56, 432) | (8, 1, 8) | 1224 | ODS-FER/BER |
| 9 | (2, 36, 466) | (10, 99, 306) | 736 | ODS-FER/BER |
| 10 | (2, 216, 566) | (10, 21, 70) | 128 | ODS-FER/BER |
| 11 | (2, 456, 722) | (11, 33, 121) | 8 | ODS-FER/BER |
| 12 | (26, 126, 646) | (12, 178, 948) | 48 | ODS-FER |
| 12 | (2, 336, 516) | (12, 186, 732) | 32 | ODS-BER |
| 13 | (126, 232, 532) | (12, 39, 208) | 20 | ODS-FER |
| 13 | (276, 442, 776) | (12, 39, 130) | 4 | ODS-BER |
| 14 | (226, 422, 476) | (13, 112, 672) | 4 | ODS-FER |
| 14 | (566, 716, 736) | (13, 112, 616) | 2 | ODS-BER |
| 15 | (156, 332, 452) | (14, 330, 2535) | 12 | ODS-FER |
| 15 | (146, 316, 722) | (14, 375, 2280) | 12 | ODS-BER |
| 16 | (316, 336, 452) | (14, 64, 480) | 8 | ODS-FER/BER |
| 17 | (266, 512, 746) | (15, 238, 1700) | 4 | ODS-FER/BER |
| 18 | (256, 662, 746) | (16, 837, 7146) | 4 | ODS-FER/BER |
| 19 | (232, 632, 766) | (16, 342, 2090) | 4 | ODS-FER/BER |
| 20 | (452, 476, 756) | (16, 130, 1120) | 2 | ODS-FER |
| 20 | (456, 476, 666) | (16, 180, 920) | 2 | ODS-BER |
| 21 | (526, 572, 636) | (16, 63, 378) | 2 | ODS-FER |
| 21 | (422, 726, 736) | (16, 84, 273) | 2 | ODS-BER |
| 22 | (456, 626, 772) | (16, 22, 44) | 2 | ODS-FER |
| 22 | (476, 572, 632) | (16, 22, 44) | 2 | ODS-BER |
| 24 | (472, 562, 676) | (16, 24, 48) | 2 | ODS-FER |
| 24 | (462, 532, 736) | (16, 27, 48) | 2 | ODS-BER |
| 25 | (462, 532, 736) | (16, 25, 25) | 2 | ODS-FER/BER |
| 26 | (462, 532, 736) | (16, 26, 26) | 2 | ODS-FER/BER |

TABLE 13

NEW ODS FEEDFORWARD TBCC WITH RATE ½ AND CONSTRAINT LENGTH V = 2

| K | G | WS | # permutation equivalent codes | Note |
|---|---|---|---|---|
| 2 | (1, 4) | (2, 2, 2) | 5 | ODS-BER |
| 5 | (1, 7) | (4, 15, 30) | 3 | ODS-BER |
| 7 | (3, 7) | (4, 7, 14) | 2 | ODS-FER/BER |

TABLE 14

NEW ODS FEEDFORWARD TBCC WITH RATE ½ AND CONSTRAINT LENGTH V = 3

| K | G | WS | # permutation equivalent codes | Note |
|---|---|---|---|---|
| 2 | (4, 40) | (2, 2, 2) | 19 | ODS-BER |
| 5 | (4, 74) | (4, 10, 20) | 4 | ODS-FER/BER |
| 6 | (14, 70) | (4, 9, 24) | 2 | ODS-BER |
| 7 | (4, 74) | (4, 7, 14) | 4 | ODS-FER/BER |
| 12 | (34, 54) | (6, 64, 192) | 4 | ODS-BER |

TABLE 15

NEW ODS FEEDFORWARD TBCC WITH RATE ½ AND CONSTRAINT LENGTH V = 4

| K | G | WS | # permutation equivalent codes | Note |
|---|---|---|---|---|
| 2 | (2, 40) | (2, 2, 2) | 74 | ODS-BER |
| 5 | (2, 56) | (4, 10, 20) | 17 | ODS-FER/BER |
| 6 | (2, 56) | (4, 6, 12) | 10 | ODS-FER/BER |
| 7 | (2, 66) | (4, 7, 14) | 7 | ODS-FER/BER |
| 8 | (2, 56) | (5, 24, 56) | 10 | ODS-FER/BER |
| 9 | (16, 54) | (6, 102, 450) | 4 | ODS-FER/BER |
| 10 | (16, 54) | (6, 90, 390) | 4 | ODS-FER/BER |
| 16 | (46, 66) | (7, 64, 256) | 2 | ODS-BER |
| 18 | (46, 56) | (7, 54, 126) | 2 | ODS-FER/BER |
| 19 | (46, 66) | (7, 38, 76) | 2 | ODS-BER |
| 20 | (46, 66) | (7, 40, 80) | 2 | ODS-BER |
| 22 | (46, 66) | (7, 44, 88) | 2 | ODS-BER |
| 23 | (46, 66) | (7, 46, 92) | 2 | ODS-BER |

TABLE 16

NEW ODS FEEDFORWARD TBCC WITH RATE ½ AND CONSTRAINT LENGTH V = 5

| K | G | WS | # permutation equivalent codes | Note |
|---|---|---|---|---|
| 2 | (1, 40) | (2, 2, 2) | 292 | ODS-BER |
| 6 | (1, 53) | (4, 6, 12) | 16 | ODS-FER/BER |
| 7 | (1, 53) | (4, 7, 14) | 28 | ODS-FER/BER |
| 8 | (1, 53) | (5, 24, 56) | 16 | ODS-FER/BER |
| 9 | (7, 54) | (6, 102, 450) | 16 | ODS-FER/BER |
| 10 | (13, 53) | (6, 40, 180) | 6 | ODS-FER/BER |
| 12 | (23, 47) | (6, 20, 120) | 4 | ODS-FER/BER |
| 18 | (37, 53) | (8, 117, 684) | 4 | ODS-BER |
| 20 | (43, 73) | (8, 100, 340) | 2 | ODS-BER |
| 21 | (23, 67) | (8, 84, 189) | 4 | ODS-BER |
| 22 | (57, 63) | (8, 44, 132) | 2 | ODS-FER |
| 23 | (45, 77) | (8, 46, 92) | 2 | ODS-FER/BER |

TABLE 17

NEW ODS FEEDFORWARD TBCC WITH RATE ½ AND CONSTRAINT LENGTH V = 6

| K | G | WS | # permutation equivalent codes | Note |
|---|---|---|---|---|
| 5 | (4, 464) | (4, 10, 20) | 225 | ODS-FER/BER |
| 6 | (4, 530) | (4, 6, 12) | 82 | ODS-FER/BER |
| 7 | (4, 434) | (4, 7, 14) | 54 | ODS-FER/BER |
| 8 | (4, 434) | (5, 24, 56) | 50 | ODS-FER/BER |
| 9 | (4, 474) | (6, 102, 306) | 28 | ODS-FER/BER |
| 11 | (274, 574) | (7, 176, 880) | 4 | ODS-FER/BER |
|  | (474, 674) |  | 2 |  |
| 13 | (134, 670) | (7, 117, 611) | 4 | ODS-FER/BER |
| 15 | (114, 714) | (8, 450, 3120) | 6 | ODS-FER/BER |
| 17 | (374, 444) | (8, 187, 1156) | 2 | ODS-BER |
| 19 | (464, 744) | (8, 19, 190) | 2 | ODS-FER |
| 19 | (634, 734) | (8, 38, 190) | 2 | ODS-BER |

TABLE 18

NEW ODS FEEDFORWARD TBCC WITH RATE ½ AND CONSTRAINT LENGTH V = 7

| K | G | WS | # permutation equivalent codes | Note |
|---|---|---|---|---|
| 2 | (2, 400) | (2, 2, 2) | 4624 | ODS-BER |
| 6 | (2, 452) | (4, 6, 12) | 324 | ODS-FER/BER |
| 7 | (2, 434) | (4, 7, 14) | 348 | ODS-FER/BER |
| 8 | (2, 426) | (5, 24, 56) | 68 | ODS-FER/BER |
| 9 | (2, 456) | (6, 102, 306) | 40 | ODS-FER/BER |
| 10 | (2, 476) | (6, 40, 120) | 16 | ODS-FER/BER |
| 11 | (2, 556) | (7, 176, 616) | 16 | ODS-FER/BER |
| 13 | (56, 670) | (7, 117, 611) | 6 | ODS-FER/BER |
| 14 | (76, 654) | (8, 546, 3640) | 2 | ODS-FER/BER |
|  | (112, 472) |  | 6 |  |
|  | (256, 626) |  | 4 |  |
|  | (266, 602) |  | 4 |  |
|  | (316, 412) |  | 4 |  |
| 15 | (376, 412) | (8, 450, 2955) | 4 | ODS-FER/BER |
| 16 | (36, 564) | (8, 238, 1776) | 2 | ODS-FER/BER |
| 17 | (146, 534) | (8, 153, 1190) | 4 | ODS-FER |
| 17 | (176, 444) | (8, 187, 1156) | 2 | ODS-BER |
| 18 | (336, 646) | (8, 54, 468) | 4 | ODS-FER |
| 18 | (336, 676) | (8, 81, 432) | 4 | ODS-FER |
| 19 | (556, 736) | (8, 19, 152) | 2 | ODS-FER |
| 21 | (326, 576) | (10, 1722, 15771) | 4 | ODS-BER |
| 22 | (236, 626) | (10, 1298, 13112) | 4 | ODS-FER |
| 22 | (272, 634) | (10, 1364, 12914) | 4 | ODS-BER |
| 24 | (236, 652) | (10, 744, 6624) | 4 | ODS-BER |
| 26 | (276, 722) | (10, 143, 1118) | 4 | ODS-BER |
| 27 | (316, 466) | (10, 162, 567) | 4 | ODS-BER |
| 28 | (506, 772) | (10, 84, 224) | 2 | ODS-BER |
| 31 | (532, 746) | (10, 31, 124) | 2 | ODS-FER |
| 31 | (446, 756) | (10, 31, 62) | 2 | ODS-BER |
| 32 | (532, 746) | (10, 32, 128) | 2 | ODS-FER |
| 33 | (532, 746) | (10, 33, 132) | 2 | ODS-FER |
| 33 | (452, 766) | (10, 33, 66) | 2 | ODS-BER |
| 34 | (532, 746) | (10, 34, 136) | 2 | ODS-FER |
| 35 | (532, 746) | (10, 35, 140) | 2 | ODS-FER |
| 35 | (452, 766) | (10, 35, 70) | 2 | ODS-BER |
| 36 | (532, 746) | (10, 36, 144) | 2 | ODS-FER |
| 36 | (452, 766) | (10, 36, 72) | 2 | ODS-BER |
| 37 | (532, 746) | (10, 37, 148) | 2 | ODS-FER |
| 38 | (532, 746) | (10, 38, 152) | 2 | ODS-FER |

TABLE 19

NEW ODS FEEDFORWARD TBCC WITH RATE ½ AND CONSTRAINT LENGTH V = 8

| K | G | WS | # permutation equivalent codes | Note |
|---|---|---|---|---|
| 5 | (1, 407) | (4, 10, 20) | 3600 | ODS-FER/BER |
| 6 | (1, 423) | (4, 6, 12) | 1296 | ODS-FER/BER |
| 7 | (1, 415) | (4, 7, 14) | 1323 | ODS-FER/BER |
| 8 | (1, 426) | (5, 24, 56) | 624 | ODS-FER/BER |
| 9 | (1, 447) | (6, 102, 306) | 79 | ODS-FER/BER |
| 10 | (1, 476) | (6, 40, 120) | 4 | ODS-FER/BER |
| 11 | (1, 556) | (7, 176, 616) | 4 | ODS-FER/BER |
| 12 | (1, 573) | (8, 759, 3036) | 18 | ODS-FER/BER |
| 14 | (1, 727) | (8, 546, 2184) | 9 | ODS-FER/BER |
| 15 | (177, 412) | (8, 450, 2955) | 4 | ODS-FER/BER |
| 16 | (55, 727) | (8, 238, 1744) | 4 | ODS-FER |
| 16 | (1, 557) | (8, 372, 1456) | 18 | ODS-BER |
| 17 | (433, 473) | (8, 153, 952) | 2 | ODS-FER/BER |
| 18 | (647, 657) | (8, 54, 324) | 2 | ODS-FER |
| 18 | (537, 737) | (8, 63, 324) | 2 | ODS-BER |
| 19 | (357, 737) | (8, 19, 38) | 4 | ODS-FER/BER |
| 20 | (303, 433) | (9, 240, 2160) | 4 | ODS-FER/BER |
| 21 | (227, 615) | (10, 1680, 15729) | 4 | ODS-FER/BER |
| 22 | (133, 463) | (10, 1298, 11704) | 6 | ODS-BER |
| 24 | (475, 507) | (10, 456, 4320) | 2 | ODS-BER |

TABLE 19-continued

NEW ODS FEEDFORWARD TBCC WITH RATE ½
AND CONSTRAINT LENGTH V = 8

| K | G | WS | # permutation equivalent codes | Note |
|---|---|----|------|------|
| 27 | (67, 745) | (10, 54, 162) | 8 | ODS-BER |
| 28 | (233, 635) | (11, 644, 7308) | 4 | ODS-BER |
| 29 | (233, 565) | (11, 319, 3277) | 4 | ODS-FER/BER |
| 32 | (235, 557) | (12, 1568, 15840) | 4 | ODS-BER |

TABLE 19-continued

NEW ODS FEEDFORWARD TBCC WITH RATE ½
AND CONSTRAINT LENGTH V = 8

| K | G | WS | # permutation equivalent codes | Note |
|---|---|----|------|------|
| 38 | (457, 755) | (12, 380, 1520) | 2 | ODS-FER/BER |
| 39 | (463, 755) | (12, 429, 1482) | 2 | ODS-BER |
| 40 | (463, 755) | (12, 440, 1520) | 2 | ODS-BER |

TABLE 20

NEW ODS FEEDFORWARD TBCC WITH RATE ⅕
AND VARIOUS CONSTRAINT LENGTHS.

| K | V | G | WS | # permutation equivalent codes | Note |
|---|---|---|----|------|------|
| 12 | 2 | (5, 5, 7, 7, 7) | (13, 12, 12) | 1 | ODS-FER/BER |
| 12 | 3 | (54, 54, 64, 74, 74) | (16, 12, 24) | 2 | ODS-FER/BER |
| 12 | 4 | (52, 56, 66, 72, 76) | (20, 72, 216) | 1 | ODS-FER/BER |
| 12 | 5 | (37, 47, 55, 57, 65) | (22, 108, 504) | 4 | ODS-FER/BER |

Table 21 below sets forth new ODS feedforward TBCC with rate ⅔ and various constraint lengths. TBCC in this table are obtained by searching the rate ⅓ TBCC with all possible puncturing patterns p1=[1 1; 1 1; 1 0], p2=[1 1; 1 0; 1 1] and p3=[1 0; 1 1; 1 1]. Each puncturing pattern is a 3-by-2 matrix and 0 means puncturing and 1 means no puncturing. The number of columns of puncturing patterns is 3 since there are 3 output bits for each input bit for the rate ⅓ code. The number of rows of puncturing patterns is 2 and is the periodicity of the puncturing pattern. For example, if p1 is used, then the third output bit from the input bit at odd time instant (assuming the time instants for input bits are 0, 1, . . . , k-1) is punctured and is not transmitted.

TABLE 21

NEW ODS FEEDFORWARD TBCC WITH RATE ⅔
AND VARIOUS CONSTRAINT LENGTHS.

| K | V | G | WS | # permutation equivalent codes | Note |
|---|---|---|----|------|------|
| 12 | 3 | (54, 64, 74) p1 | (8, 51, 192) | 1 | ODS-FER/BER |
| 12 | 4 | (46, 56, 76) p1 | (8, 15, 66) | 1 | ODS-FER/BER |
|    |   | (62, 72, 76) p1 |              | 1 |   |
| 12 | 5 | (43, 57, 64) p1 | (9, 78, 456) | 1 | ODS-FER/BER |
|    |   | (13, 61, 75) p3 |              | 3 |   |
|    |   | (32, 43, 57) p3 |              | 2 |   |
|    | 5 | (23, 55, 56) p2 | (8, 6, 36)   | 4 | ODS-FER if p2 is used |
|    | 5 | (15, 57, 62) p2 | (8, 6, 6)    | 3 | ODS-BER if p2 is used |
| 12 | 6 | (464, 474, 670) p1 | (9, 72, 342) | 1 | ODS-FER/BER |
|    |   | (544, 730, 744) p2 |              | 1 |   |
|    |   | (334, 464, 474) p3 |              | 2 |   |
| 12 | 7 | (232, 236, 670) p1 | (9, 72, 342) | 5 | ODS-FER/BER |
|    |   | (232, 334, 474) p2 |              | 3 |   |
|    |   | (262, 730, 744) p2 |              | 1 |   |
|    |   | (156, 232, 474) p3 |              | 6 |   |
|    |   | (354, 362, 544) p3 |              | 1 |   |

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method of generating a set of generator polynomials for use as a tail biting convolution code to operate on data transmitted over a channel, the method comprising: (1) selecting valid combinations of generator polynomials to include in a pool of potential codes, each valid combination being a potential code; (2) determining first lines of a weight spectrum for each potential code in the pool and including potential codes of the pool having best first lines in a candidate set; (3) determining best codes of the candidate set based on a first L number of lines in the weight spectrum, L being an integer greater than one; (4) selecting an optimum code(s) from the best codes; (5) configuring a shift register circuit(s) of a data transceiver to implement the optimum code(s).

2. The method of claim 1, further comprising using a free distance parameter and a multiplicity parameter for selecting the optimum code(s) from the best codes.

3. The method of claim 1, further comprising using a free distance parameter and a bit multiplicity parameter for selecting the optimum code(s) from the best codes.

4. The method of claim 1, further comprising using the shift register circuit configured in accordance with the optimum code to append error correction information to data transmitted over the channel.

5. A node of a communications network which participates in data transmissions over a channel, the node comprising: a transceiver configured to send and receive data over the channel; a shift register circuit configured to implement an optimum tail biting convolutional code for operating on the data transmitted over the channel, the optimum code having been generated by performing the acts of claim 1.

6. The apparatus of claim 5, further comprising: plural shift register circuits, each of the shift register circuits being configured to implement a respective different one of plural optimum tail biting convolutional codes, each of the plural optimum tail biting convolutional codes being of a different rate and having been generated by performing the acts of claim 1; a code activator configured to include one of the plural shift register circuits in a processing stream for a respective data transmission over the channel.

7. The apparatus of claim 5, wherein the shift register circuit comprises an encoder configured to append error correction information to data transmitted over the channel.

8. The method of claim 1, wherein the optimum code is expressed by a set of polynomials listed in any of Table 2-Table 21, polynomials being shown in octal notation in column G of Table 2-Table 21:

TABLE 1

NEW ODS FEEDFORWARD TBCC WITH RATE ¼ AND CONSTRAINT LENGTH V = 2

| K | G | WS | # permutation equivalent codes | Note |
|---|---|---|---|---|
| 3 | (1, 1, 3, 5) | (6, 4, 6) | 30 | ODS-BER |
| 6 | (1, 3, 5, 7) | (8, 6, 6) | 6 | ODS-BER |
| 8 | (3, 5, 7, 7) | (10, 16, 24) | 2 | ODS-FER/BER |
| 9 | (3, 5, 7, 7) | (10, 18, 27) | 2 | ODS-FER/BER |

TABLE 2

NEW ODS FEEDFORWARD TBCC WITH RATE ¼ AND CONSTRAINT LENGTH V = 3

| K | G | WS | # permutation equivalent codes | Note |
|---|---|---|---|---|
| 3 | (4, 4, 14, 50) | (6, 4, 6) | 372 | ODS-BER |
| 9 | (44, 54, 64, 74) | (12, 12, 18) | 1 | ODS-BER |

TABLE 3

NEW ODS FEEDFORWARD TBCC WITH RATE ¼ AND CONSTRAINT LENGTH V = 4

| K | G | WS | # permutation equivalent codes | Note |
|---|---|---|---|---|
| 3 | (2, 2, 6, 42) | (6, 4, 6) | 5238 | ODS-BER |
| 5 | (2, 6, 16, 52) | (9, 10, 20) | 1058 | ODS-FER/BER |
| 6 | (2, 6, 26, 76) | (10, 9, 18) | 120 | ODS-FER/BER |
| 10 | (26, 36, 46, 56) | (14, 30, 60) | 8 | ODS-FER/BER |
| 11 | (46, 52, 56, 76) | (15, 22, 66) | 2 | ODS-BER |

TABLE 4

NEW ODS FEEDFORWARD TBCC WITH RATE ¼ AND CONSTRAINT LENGTH V = 5

| K | G | WS | # permutation equivalent codes | Note |
|---|---|---|---|---|
| 3 | (1, 1, 3, 41) | (6, 4, 6) | 78273 | ODS-BER |
| 5 | (1, 3, 7, 52) | (9, 10, 20) | 17596 | ODS-FER/BER |
| 6 | (1, 3, 13, 57) | (10, 9, 18) | 2352 | ODS-FER/BER |
| 8 | (1, 23, 45, 77) | (12, 8, 16) | 72 | ODS-FER/BER |
| 9 | (13, 17, 23, 56) | (14, 72, 261) | 60 | ODS-FER/BER |
| 10 | (27, 47, 57, 61) | (16, 285, 1350) | 4 | ODS-FER/BER |
| 14 | (45, 53, 73, 77) | (18, 84, 364) | 2 | ODS-BER |
| 16 | (47, 53, 67, 75) | (18, 48, 96) | 2 | ODS-FER |
| 16 | (45, 53, 73, 77) | (18, 48, 80) | 2 | ODS-BER |
| 17 | (47, 53, 67, 75) | (18, 51, 102) | 2 | ODS-FER |
| 17 | (45, 53, 73, 77) | (18, 51, 85) | 2 | ODS-BER |
| 18 | (47, 53, 67, 75) | (18, 54, 108) | 2 | ODS-FER |
| 18 | (45, 53, 73, 77) | (18, 54, 90) | 2 | ODS-BER |
| 19 | (45, 57, 67, 75) | (18, 57, 95) | 2 | ODS-FER/BER |
| 20 | (45, 57, 67, 75) | (18, 60, 100) | 2 | ODS-FER/BER |
| 21 | (45, 57, 67, 75) | (18, 63, 105) | 2 | ODS-FER/BER |
| 24 | (45, 57, 67, 75) | (18, 72, 120) | 2 | ODS-FER/BER |

TABLE 5

NEW ODS FEEDFORWARD TBCC WITH RATE ¼ AND CONSTRAINT LENGTH V = 6

| K | G | WS | # permutation equivalent codes | Note |
|---|---|---|---|---|
| 2 | (4, 4, 4, 410) | (5, 2, 2) | 1279360 | ODS-FER/BER |
| 3 | (4, 4, 14, 430) | (6, 3, 6) | 791712 | ODS-FER |
|   | (4, 4, 14, 410) | (6, 4, 6) | 1209060 | ODS-BER |
| 4 | (4, 14, 24, 414) | (8, 11, 24) | 460800 | ODS-FER/BER |
| 5 | (4, 14, 34, 444) | (9, 10, 20) | 281250 | ODS-FER/BER |
| 6 | (4, 14, 54, 570) | (10, 9, 18) | 36408 | ODS-FER/BER |
| 7 | (4, 34, 174, 524) | (12, 28, 84) | 6339 | ODS-FER/BER |
| 8 | (4, 34, 114, 674) | (12, 8, 16) | 1256 | ODS-FER/BER |

TABLE 5-continued

NEW ODS FEEDFORWARD TBCC WITH RATE ¼ AND CONSTRAINT LENGTH V = 6

| K | G | WS | # permutation equivalent codes | Note |
|---|---|---|---|---|
| 9 | (4, 274, 454, 764) | (14, 72, 234) | 112 | ODS-FER/BER |
| 10 | (4, 374, 454, 534) | (16, 285, 1140) | 28 | ODS-FER/BER |
| 11 | (204, 214, 724, 774) | (16, 66, 286) | 12 | ODS-FER/BER |
| 12 | (424, 474, 704, 724) | (17, 60, 324) | 2 | ODS-FER |
| 12 | (224, 324, 354, 554) | (17, 72, 312) | 16 | ODS-BER |
| 13 | (134, 564, 634, 724) | (19, 325, 1963) | 6 | ODS-FER/BER |
| 14 | (114, 534, 664, 764) | (19, 182, 1106) | 6 | ODS-FER/BER |
| 15 | (464, 534, 564, 674) | (20, 285, 1815) | 2 | ODS-FER |
| 15 | (444, 654, 674, 734) | (20, 288, 1800) | 2 | ODS-BER |
| 16 | (454, 554, 724, 774) | (20, 64, 224) | 2 | ODS-FER/BER |
| 17 | (454, 474, 724, 754) | (20, 34, 51) | 2 | ODS-FER/BER |
| 18 | (474, 554, 624, 764) | (20, 36, 54) | 2 | ODS-FER |
| 18 | (454, 474, 724, 754) | (20, 36, 54) | 2 | ODS-BER |
| 20 | (474, 554, 624, 764) | (20, 40, 60) | 2 | ODS-FER/BER |

TABLE 6

NEW ODS FEEDFORWARD TBCC WITH RATE ⅓ AND CONSTRAINT LENGTH V = 2

| K | G | WS | # permutation equivalent codes | Note |
|---|---|---|---|---|
| 3 | (1, 1, 5) | (4, 3, 3) | 12 | ODS-FER/BER |

TABLE 7

NEW ODS FEEDFORWARD TBCC WITH RATE ⅓ AND CONSTRAINT LENGTH V = 3

| K | G | WS | # permutation equivalent codes | Note |
|---|---|---|---|---|
| 7 | (4, 54, 74) | (8, 35, 91) | 8 | ODS-BER |
| 9 | (34, 54, 74) | (8, 9, 18) | 4 | ODS-FER |
| 9 | (24, 54, 64) | (8, 9, 9) | 2 | ODS-BER |

TABLE 8

NEW ODS FEEDFORWARD TBCC WITH RATE ⅓ AND CONSTRAINT LENGTH V = 4

| K | G | WS | # permutation equivalent codes | Note |
|---|---|---|---|---|
| 6 | (2, 16, 56) | (8, 45, 120) | 30 | ODS-FER/BER |
| 7 | (2, 46, 76) | (8, 21, 56) | 10 | ODS-FER/BER |
| 8 | (2, 56, 66) | (8, 1, 8) | 10 | ODS-FER/BER |
| 9 | (16, 46, 56) | (10, 99, 405) | 6 | ODS-FER/BER |
| | (26, 52, 56) | | 4 | |
| 10 | (46, 66, 72) | (10, 46, 240) | 2 | ODS-FER |
| 10 | (26, 36, 46) | (10, 52, 220) | 8 | ODS-BER |
| 11 | (46, 62, 76) | (10, 11, 22) | 1 | ODS-FER |
| 11 | (16, 56, 72) | (10, 11, 22) | 3 | ODS-BER |
| 12 | (46, 52, 72) | (10, 12, 12) | 2 | ODS-BER |
| 15 | (46, 56, 72) | (11, 15, 15) | 2 | ODS-FER/BER |

TABLE 9

NEW ODS FEEDFORWARD TBCC WITH RATE ⅓ AND CONSTRAINT LENGTH V = 5

| K | G | WS | # permutation equivalent codes | Note |
|---|---|---|---|---|
| 6 | (1, 7, 53) | (8, 45, 120) | 156 | ODS-FER/BER |
| 7 | (1, 7, 57) | (8, 21, 56) | 124 | ODS-FER/BER |
| 8 | (1, 27, 66) | (8, 1, 8) | 52 | ODS-FER/BER |
| 9 | (1, 47, 75) | (10, 99, 333) | 24 | ODS-FER/BER |
| 10 | (33, 43, 53) | (10, 21, 90) | 4 | ODS-FER/BER |
| 12 | (13, 37, 53) | (12, 202, 1008) | 12 | ODS-BER |
| 17 | (47, 57, 65) | (13, 34, 68) | 2 | ODS-BER |

TABLE 10

NEW ODS FEEDFORWARD TBCC WITH RATE ⅓ AND CONSTRAINT LENGTH V = 6

| K | G | WS | # permutation equivalent codes | Note |
|---|---|---|---|---|
| 3 | (4, 4, 410) | (4, 3, 3) | 42984 | ODS-FER/BER |
| 6 | (4, 34, 530) | (8, 45, 120) | 1326 | ODS-FER/BER |
| 7 | (4, 34, 534) | (8, 21, 56) | 751 | ODS-FER/BER |
| 8 | (4, 134, 614) | (8, 1, 8) | 314 | ODS-FER/BER |
| 9 | (4, 74, 554) | (10, 99, 306) | 112 | ODS-FER/BER |
| 10 | (154, 214, 530) | (10, 21, 90) | 40 | ODS-FER |
| 10 | (4, 314, 674) | (10, 26, 80) | 28 | ODS-BER |
| 13 | (434, 574, 664) | (12, 39, 338) | 2 | ODS-FER |
| 13 | (104, 554, 574) | (12, 39, 156) | 6 | ODS-BER |
| 17 | (474, 634, 654) | (14, 51, 306) | 2 | ODS-FER |
| 17 | (574, 654, 764) | (14, 51, 170) | 1 | ODS-BER |
| 21 | (464, 564, 674) | (15, 84, 210) | 2 | ODS-BER |
| 22 | (474, 564, 664) | (15, 66, 154) | 2 | ODS-BER |

TABLE 11

NEW ODS FEEDFORWARD TBCC WITH RATE ⅓ AND CONSTRAINT LENGTH V = 7

| K | G | WS | # permutation equivalent codes | Note |
|---|---|---|---|---|
| 4 | (2, 6, 406) | (6, 12, 24) | 200704 | ODS-FER/BER |
| 5 | (2, 16, 422) | (7, 15, 35) | 49000 | ODS-FER/BER |
| 6 | (2, 16, 452) | (8, 45, 120) | 10584 | ODS-FER/BER |
| 7 | (2, 16, 534) | (8, 21, 56) | 6318 | ODS-FER/BER |
| 8 | (2, 56, 432) | (8, 1, 8) | 1224 | ODS-FER/BER |
| 9 | (2, 36, 466) | (10, 99, 306) | 736 | ODS-FER/BER |
| 10 | (2, 216, 566) | (10, 21, 70) | 128 | ODS-FER/BER |
| 11 | (2, 456, 722) | (11, 33, 121) | 8 | ODS-FER/BER |
| 12 | (26, 126, 646) | (12, 178, 948) | 48 | ODS-FER |
| 12 | (2, 336, 516) | (12, 186, 732) | 32 | ODS-BER |
| 13 | (126, 232, 532) | (12, 39, 208) | 20 | ODS-FER |
| 13 | (276, 442, 776) | (12, 39, 130) | 4 | ODS-BER |
| 14 | (226, 422, 476) | (13, 112, 672) | 4 | ODS-FER |
| 14 | (566, 716, 736) | (13, 112, 616) | 2 | ODS-BER |
| 15 | (156, 332, 452) | (14, 330, 2535) | 12 | ODS-FER |
| 15 | (146, 316, 722) | (14, 375, 2280) | 12 | ODS-BER |
| 16 | (316, 336, 452) | (14, 64, 480) | 8 | ODS-FER/BER |
| 17 | (266, 512, 746) | (15, 238, 1700) | 4 | ODS-FER/BER |
| 18 | (256, 662, 746) | (16, 837, 7146) | 4 | ODS-FER/BER |
| 19 | (232, 632, 766) | (16, 342, 2090) | 4 | ODS-FER/BER |
| 20 | (452, 476, 756) | (16, 130, 1120) | 2 | ODS-FER |
| 20 | (456, 476, 666) | (16, 180, 920) | 2 | ODS-BER |
| 21 | (526, 572, 636) | (16, 63, 378) | 2 | ODS-FER |
| 21 | (422, 726, 736) | (16, 84, 273) | 2 | ODS-BER |
| 22 | (456, 626, 772) | (16, 22, 44) | 2 | ODS-FER |
| 22 | (476, 572, 632) | (16, 22, 44) | 2 | ODS-BER |

TABLE 11-continued

NEW ODS FEEDFORWARD TBCC WITH RATE ⅓ AND CONSTRAINT LENGTH V = 7

| K | G | WS | # permutation equivalent codes | Note |
|---|---|---|---|---|
| 24 | (472, 562, 676) | (16, 24, 48) | 2 | ODS-FER |
| 24 | (462, 532, 736) | (16, 27, 48) | 2 | ODS-BER |
| 25 | (462, 532, 736) | (16, 25, 25) | 2 | ODS-FER/BER |
| 26 | (462, 532, 736) | (16, 26, 26) | 2 | ODS-FER/BER |

TABLE 12

NEW ODS FEEDFORWARD TBCC WITH RATE ½ AND CONSTRAINT LENGTH V = 2

| K | G | WS | # permutation equivalent codes | Note |
|---|---|---|---|---|
| 2 | (1, 4) | (2, 2, 2) | 5 | ODS-BER |
| 5 | (1, 7) | (4, 15, 30) | 3 | ODS-BER |
| 7 | (3, 7) | (4, 7, 14) | 2 | ODS-FER/BER |

TABLE 13

NEW ODS FEEDFORWARD TBCC WITH RATE ½ AND CONSTRAINT LENGTH V = 3

| K | G | WS | # permutation equivalent codes | Note |
|---|---|---|---|---|
| 2 | (4, 40) | (2, 2, 2) | 19 | ODS-BER |
| 5 | (4, 74) | (4, 10, 20) | 4 | ODS-FER/BER |
| 6 | (14, 70) | (4, 9, 24) | 2 | ODS-BER |
| 7 | (4, 74) | (4, 7, 14) | 4 | ODS-FER/BER |
| 12 | (34, 54) | (6, 64, 192) | 4 | ODS-BER |

TABLE 14

NEW ODS FEEDFORWARD TBCC WITH RATE ½ AND CONSTRAINT LENGTH V = 4

| K | G | WS | # permutation equivalent codes | Note |
|---|---|---|---|---|
| 2 | (2, 40) | (2, 2, 2) | 74 | ODS-BER |
| 5 | (2, 56) | (4, 10, 20) | 17 | ODS-FER/BER |
| 6 | (2, 56) | (4, 6, 12) | 10 | ODS-FER/BER |
| 7 | (2, 66) | (4, 7, 14) | 7 | ODS-FER/BER |
| 8 | (2, 56) | (5, 24, 56) | 10 | ODS-FER/BER |
| 9 | (16, 54) | (6, 102, 450) | 4 | ODS-FER/BER |
| 10 | (16, 54) | (6, 90, 390) | 4 | ODS-FER/BER |
| 16 | (46, 66) | (7, 64, 256) | 2 | ODS-BER |
| 18 | (46, 56) | (7, 54, 126) | 2 | ODS-FER/BER |
| 19 | (46, 66) | (7, 38, 76) | 2 | ODS-BER |
| 20 | (46, 66) | (7, 40, 80) | 2 | ODS-BER |
| 22 | (46, 66) | (7, 44, 88) | 2 | ODS-BER |
| 23 | (46, 66) | (7, 46, 92) | 2 | ODS-BER |

TABLE 15

NEW ODS FEEDFORWARD TBCC WITH RATE ½ AND CONSTRAINT LENGTH V = 5

| K | G | WS | # permutation equivalent codes | Note |
|---|---|---|---|---|
| 2 | (1, 40) | (2, 2, 2) | 292 | ODS-BER |
| 6 | (1, 53) | (4, 6, 12) | 16 | ODS-FER/BER |
| 7 | (1, 53) | (4, 7, 14) | 28 | ODS-FER/BER |
| 8 | (1, 53) | (5, 24, 56) | 16 | ODS-FER/BER |
| 9 | (7, 54) | (6, 102, 450) | 16 | ODS-FER/BER |
| 10 | (13, 53) | (6, 40, 180) | 6 | ODS-FER/BER |
| 12 | (23, 47) | (6, 20, 120) | 4 | ODS-FER/BER |
| 18 | (37, 53) | (8, 117, 684) | 4 | ODS-BER |
| 20 | (43, 73) | (8, 100, 340) | 2 | ODS-BER |
| 21 | (23, 67) | (8, 84, 189) | 4 | ODS-BER |
| 22 | (57, 63) | (8, 44, 132) | 2 | ODS-FER |
| 23 | (45, 77) | (8, 46, 92) | 2 | ODS-FER/BER |

TABLE 16

NEW ODS FEEDFORWARD TBCC WITH RATE ½ AND CONSTRAINT LENGTH V = 6

| K | G | WS | # permutation equivalent codes | Note |
|---|---|---|---|---|
| 5 | (4, 464) | (4, 10, 20) | 225 | ODS-FER/BER |
| 6 | (4, 530) | (4, 6, 12) | 82 | ODS-FER/BER |
| 7 | (4, 434) | (4, 7, 14) | 54 | ODS-FER/BER |
| 8 | (4, 434) | (5, 24, 56) | 50 | ODS-FER/BER |
| 9 | (4, 474) | (6, 102, 306) | 28 | ODS-FER/BER |
| 11 | (274, 574) | (7, 176, 880) | 4 | ODS-FER/BER |
|  | (474, 674) |  | 2 |  |
| 13 | (134, 670) | (7, 117, 611) | 4 | ODS-FER/BER |
| 15 | (114, 714) | (8, 450, 3120) | 6 | ODS-FER/BER |
| 17 | (374, 444) | (8, 187, 1156) | 2 | ODS-BER |
| 19 | (464, 744) | (8, 19, 190) | 2 | ODS-FER |
| 19 | (634, 734) | (8, 38, 190) | 2 | ODS-BER |

TABLE 17

NEW ODS FEEDFORWARD TBCC WITH RATE ½ AND CONSTRAINT LENGTH V = 7

| K | G | WS | # permutation equivalent codes | Note |
|---|---|---|---|---|
| 2 | (2, 400) | (2, 2, 2) | 4624 | ODS-BER |
| 6 | (2, 452) | (4, 6, 12) | 324 | ODS-FER/BER |
| 7 | (2, 434) | (4, 7, 14) | 348 | ODS-FER/BER |
| 8 | (2, 426) | (5, 24, 56) | 68 | ODS-FER/BER |
| 9 | (2, 456) | (6, 102, 306) | 40 | ODS-FER/BER |
| 10 | (2, 476) | (6, 40, 120) | 16 | ODS-FER/BER |
| 11 | (2, 556) | (7, 176, 616) | 16 | ODS-FER/BER |
| 13 | (56, 670) | (7, 117, 611) | 6 | ODS-FER/BER |
| 14 | (76, 654) | (8, 546, 3640) | 2 | ODS-FER/BER |
|  | (112, 472) |  | 6 |  |
|  | (256, 626) |  | 4 |  |
|  | (266, 602) |  | 4 |  |
|  | (316, 412) |  | 4 |  |
| 15 | (376, 412) | (8, 450, 2955) | 4 | ODS-FER/BER |
| 16 | (36, 564) | (8, 238, 1776) | 2 | ODS-FER/BER |
| 17 | (146, 534) | (8, 153, 1190) | 4 | ODS-FER |
| 17 | (176, 444) | (8, 187, 1156) | 2 | ODS-BER |
| 18 | (336, 646) | (8, 54, 468) | 4 | ODS-FER |

TABLE 17-continued

NEW ODS FEEDFORWARD TBCC WITH RATE ½ AND CONSTRAINT LENGTH V = 7

| K | G | WS | # permutation equivalent codes | Note |
|---|---|---|---|---|
| 18 | (336, 676) | (8, 81, 432) | 4 | ODS-FER |
| 19 | (556, 736) | (8, 19, 152) | 2 | ODS-FER |
| 21 | (326, 576) | (10, 1722, 15771) | 4 | ODS-BER |
| 22 | (236, 626) | (10, 1298, 13112) | 4 | ODS-FER |
| 22 | (272, 634) | (10, 1364, 12914) | 4 | ODS-BER |
| 24 | (236, 652) | (10, 744, 6624) | 4 | ODS-BER |
| 26 | (276, 722) | (10, 143, 1118) | 4 | ODS-BER |
| 27 | (316, 466) | (10, 162, 567) | 4 | ODS-BER |
| 28 | (506, 772) | (10, 84, 224) | 2 | ODS-BER |
| 31 | (532, 746) | (10, 31, 124) | 2 | ODS-FER |
| 31 | (446, 756) | (10, 31, 62) | 2 | ODS-BER |
| 32 | (532, 746) | (10, 32, 128) | 2 | ODS-FER |
| 33 | (532, 746) | (10, 33, 132) | 2 | ODS-FER |
| 33 | (452, 766) | (10, 33, 66) | 2 | ODS-BER |
| 34 | (532, 746) | (10, 34, 136) | 2 | ODS-FER |
| 35 | (532, 746) | (10, 35, 140) | 2 | ODS-FER |
| 35 | (452, 766) | (10, 35, 70) | 2 | ODS-BER |
| 36 | (532, 746) | (10, 36, 144) | 2 | ODS-FER |
| 36 | (452, 766) | (10, 36, 72) | 2 | ODS-BER |
| 37 | (532, 746) | (10, 37, 148) | 2 | ODS-FER |
| 38 | (532, 746) | (10, 38, 152) | 2 | ODS-FER |

TABLE 19

NEW ODS FEEDFORWARD TBCC WITH RATE ½ AND CONSTRAINT LENGTH V = 8

| K | G | WS | # permutation equivalent codes | Note |
|---|---|---|---|---|
| 5 | (1, 407) | (4, 10, 20) | 3600 | ODS-FER/BER |
| 6 | (1, 423) | (4, 6, 12) | 1296 | ODS-FER/BER |
| 7 | (1, 415) | (4, 7, 14) | 1323 | ODS-FER/BER |
| 8 | (1, 426) | (5, 24, 56) | 624 | ODS-FER/BER |
| 9 | (1, 447) | (6, 102, 306) | 79 | ODS-FER/BER |
| 10 | (1, 476) | (6, 40, 120) | 4 | ODS-FER/BER |
| 11 | (1, 556) | (7, 176, 616) | 4 | ODS-FER/BER |
| 12 | (1, 573) | (8, 759, 3036) | 18 | ODS-FER/BER |
| 14 | (1, 727) | (8, 546, 2184) | 9 | ODS-FER/BER |
| 15 | (177, 412) | (8, 450, 2955) | 4 | ODS-FER/BER |
| 16 | (55, 727) | (8, 238, 1744) | 4 | ODS-FER |
| 16 | (1, 557) | (8, 372, 1456) | 18 | ODS-BER |
| 17 | (433, 473) | (8, 153, 952) | 2 | ODS-FER/BER |
| 18 | (647, 657) | (8, 54, 324) | 2 | ODS-FER |
| 18 | (537, 737) | (8, 63, 324) | 2 | ODS-BER |
| 19 | (357, 737) | (8, 19, 38) | 4 | ODS-FER/BER |
| 20 | (303, 433) | (9, 240, 2160) | 4 | ODS-FER/BER |
| 21 | (227, 615) | (10, 1680, 15729) | 4 | ODS-FER/BER |
| 22 | (133, 463) | (10, 1298, 11704) | 6 | ODS-BER |
| 24 | (475, 507) | (10, 456, 4320) | 2 | ODS-BER |
| 27 | (67, 745) | (10, 54, 162) | 8 | ODS-BER |
| 28 | (233, 635) | (11, 644, 7308) | 4 | ODS-BER |
| 29 | (233, 565) | (11, 319, 3277) | 4 | ODS-FER/BER |
| 32 | (235, 557) | (12, 1568, 15840) | 4 | ODS-BER |
| 38 | (457, 755) | (12, 380, 1520) | 2 | ODS-FER/BER |
| 39 | (463, 755) | (12, 429, 1482) | 2 | ODS-BER |
| 40 | (463, 755) | (12, 440, 1520) | 2 | ODS-BER |

TABLE 20

NEW ODS FEEDFORWARD TBCC WITH RATE ⅓ AND VARIOUS CONSTRAINT LENGTHS.

| K | V | G | WS | # permutation equivalent codes | Note |
|---|---|---|---|---|---|
| 12 | 2 | (5, 5, 7, 7) | (13, 12, 12) | 1 | ODS-FER/BER |
| 12 | 3 | (54, 54, 64, 74, 74) | (16, 12, 24) | 2 | ODS-FER/BER |
| 12 | 4 | (52, 56, 66, 72, 76) | (20, 72, 216) | 1 | ODS-FER/BER |
| 12 | 5 | (37, 47, 55, 57, 65) | (22, 108, 504) | 4 | ODS-FER/BER |

TABLE 21

NEW ODS FEEDFORWARD TBCC WITH RATE ⅔ AND VARIOUS CONSTRAINT LENGTHS.

| K | V | G | WS | # permutation equivalent codes | Note |
|---|---|---|---|---|---|
| 12 | 3 | (54, 64, 74) p1 | (8, 51, 192) | 1 | ODS-FER/BER |
| 12 | 4 | (46, 56, 76) p1 (62, 72, 76) p1 | (8, 15, 66) | 1 1 | ODS-FER/BER |
| 12 | 5 | (43, 57, 64) p1 (13, 61, 75) p3 (32, 43, 57) p3 | (9, 78, 456) | 1 3 2 | ODS-FER/BER |
|  | 5 | (23, 55, 56) p2 | (8, 6, 36) | 4 | ODS-FER if p2 is used |
|  | 5 | (15, 57, 62) p2 | (8, 6, 6) | 3 | ODS-BER if p2 is used |
| 12 | 6 | (464, 474, 670) p1 (544, 730, 744) p2 (334, 464, 474) p3 | (9, 72, 342) | 1 1 2 | ODS-FER/BER |
| 12 | 7 | (232, 236, 670) p1 (232, 334, 474) p2 (262, 730, 744) p2 (156, 232, 474) p3 (354, 362, 544) p3 | (9, 72, 342) | 5 3 1 6 1. | ODS-FER/BER |

9. A code generator comprising a computer which executes a computer program comprising instructions stored on a computer-readable medium which, when executed, performs the acts of: (1) selecting valid combinations of generator polynomials to include in a pool of potential codes, each valid combination being a potential code; (2) determining first lines of a weight spectrum for each potential code in the pool and including potential codes of the pool having best first lines in a candidate set; (3) determining best codes of the candidate set based on a first L number of lines in the weight spectrum, L being an integer greater than one; (4) selecting an optimum code(s) from the best codes; (5) outputting an identification of the optimum code(s).

10. The generator of claim 9, wherein when executed the instructions further perform the act of using a free distance parameter and a multiplicity parameter for selecting the optimum code(s) from the best codes.

11. The generator of claim 9, wherein when executed the instructions further perform the act of using a free distance parameter and a bit multiplicity parameter for selecting the optimum code(s) from the best codes.

12. A node of a communications network which participates in data transmissions over a channel, the node comprising: a transceiver for sending and receiving data over the channel; a shift register circuit configured to implement an optimum tail biting convolutional code for operating on the data transmitted over the channel, the optimum code being expressed by a set of polynomials listed in any of Table 2-Table 21, polynomials being shown in octal notation in column G of Table 2-Table 21:

TABLE 2

NEW ODS FEEDFORWARD TBCC WITH RATE ¼ AND CONSTRAINT LENGTH V = 2

| K | G | WS | # permutation equivalent codes | Note |
|---|---|---|---|---|
| 3 | (1, 1, 3, 5) | (6, 4, 6) | 30 | ODS-BER |
| 6 | (1, 3, 5, 7) | (8, 6, 6) | 6 | ODS-BER |
| 8 | (3, 5, 7, 7) | (10, 16, 24) | 2 | ODS-FER/BER |
| 9 | (3, 5, 7, 7) | (10, 18, 27) | 2 | ODS-FER/BER |

TABLE 3

NEW ODS FEEDFORWARD TBCC WITH RATE ¼ AND CONSTRAINT LENGTH V = 3

| K | G | WS | # permutation equivalent codes | Note |
|---|---|---|---|---|
| 3 | (4, 4, 14, 50) | (6, 4, 6) | 372 | ODS-BER |
| 9 | (44, 54, 64, 74) | (12, 12, 18) | 1 | ODS-BER |

TABLE 4

NEW ODS FEEDFORWARD TBCC WITH RATE ¼ AND CONSTRAINT LENGTH V = 4

| K | G | WS | # permutation equivalent codes | Note |
|---|---|---|---|---|
| 3 | (2, 2, 6, 42) | (6, 4, 6) | 5238 | ODS-BER |
| 5 | (2, 6, 16, 52) | (9, 10, 20) | 1058 | ODS-FER/BER |
| 6 | (2, 6, 26, 76) | (10, 9, 18) | 120 | ODS-FER/BER |
| 10 | (26, 36, 46, 56) | (14, 30, 60) | 8 | ODS-FER/BER |
| 11 | (46, 52, 56, 76) | (15, 22, 66) | 2 | ODS-BER |

TABLE 5

NEW ODS FEEDFORWARD TBCC WITH RATE ¼ AND CONSTRAINT LENGTH V = 5

| K | G | WS | # permutation equivalent codes | Note |
|---|---|---|---|---|
| 3 | (1, 1, 3, 41) | (6, 4, 6) | 78273 | ODS-BER |
| 5 | (1, 3, 7, 52) | (9, 10, 20) | 17596 | ODS-FER/BER |
| 6 | (1, 3, 13, 57) | (10, 9, 18) | 2352 | ODS-FER/BER |
| 8 | (1, 23, 45, 77) | (12, 8, 16) | 72 | ODS-FER/BER |
| 9 | (13, 17, 23, 56) | (14, 72, 261) | 60 | ODS-FER/BER |
| 10 | (27, 47, 57, 61) | (16, 285, 1350) | 4 | ODS-FER/BER |
| 14 | (45, 53, 73, 77) | (18, 84, 364) | 2 | ODS-BER |
| 16 | (47, 53, 67, 75) | (18, 48, 96) | 2 | ODS-FER |
| 16 | (45, 53, 73, 77) | (18, 48, 80) | 2 | ODS-BER |
| 17 | (47, 53, 67, 75) | (18, 51, 102) | 2 | ODS-FER |
| 17 | (45, 53, 73, 77) | (18, 51, 85) | 2 | ODS-BER |
| 18 | (47, 53, 67, 75) | (18, 54, 108) | 2 | ODS-FER |
| 18 | (45, 53, 73, 77) | (18, 54, 90) | 2 | ODS-BER |
| 19 | (45, 57, 67, 75) | (18, 57, 95) | 2 | ODS-FER/BER |
| 20 | (45, 57, 67, 75) | (18, 60, 100) | 2 | ODS-FER/BER |
| 21 | (45, 57, 67, 75) | (18, 63, 105) | 2 | ODS-FER/BER |
| 24 | (45, 57, 67, 75) | (18, 72, 120) | 2 | ODS-FER/BER |

TABLE 6

NEW ODS FEEDFORWARD TBCC WITH RATE ¼ AND CONSTRAINT LENGTH V = 6

| K | G | WS | # permutation equivalent codes | Note |
|---|---|---|---|---|
| 2 | (4, 4, 4, 410) | (5, 2, 2) | 1279360 | ODS-FER/BER |
| 3 | (4, 4, 14, 430) | (6, 3, 6) | 791712 | ODS-FER |
|   | (4, 4, 14, 410) | (6, 4, 6) | 1209060 | ODS-BER |
| 4 | (4, 4, 14, 24, 414) | (8, 11, 24) | 460800 | ODS-FER/BER |
| 5 | (4, 14, 34, 444) | (9, 10, 20) | 281250 | ODS-FER/BER |
| 6 | (4, 14, 54, 570) | (10, 9, 18) | 36408 | ODS-FER/BER |
| 7 | (4, 34, 174, 524) | (12, 28, 84) | 6339 | ODS-FER/BER |
| 8 | (4, 34, 114, 674) | (12, 8, 16) | 1256 | ODS-FER/BER |
| 9 | (4, 274, 454, 764) | (14, 72, 234) | 112 | ODS-FER/BER |
| 10 | (4, 374, 454, 534) | (16, 285, 1140) | 28 | ODS-FER/BER |
| 11 | (204, 214, 724, 774) | (16, 66, 286) | 12 | ODS-FER/BER |
| 12 | (424, 474, 704, 724) | (17, 60, 324) | 2 | ODS-FER |
| 12 | (224, 324, 354, 554) | (17, 72, 312) | 16 | ODS-BER |
| 13 | (134, 564, 634, 724) | (19, 325, 1963) | 6 | ODS-FER/BER |
| 14 | (114, 534, 664, 764) | (19, 182, 1106) | 6 | ODS-FER/BER |
| 15 | (464, 534, 564, 674) | (20, 285, 1815) | 2 | ODS-FER |
| 15 | (444, 654, 674, 734) | (20, 288, 1800) | 2 | ODS-BER |
| 16 | (454, 554, 724, 774) | (20, 64, 224) | 2 | ODS-FER/BER |
| 17 | (454, 474, 724, 754) | (20, 34, 51) | 2 | ODS-FER/BER |
| 18 | (474, 554, 624, 764) | (20, 36, 54) | 2 | ODS-FER |
| 18 | (454, 474, 724, 754) | (20, 36, 54) | 2 | ODS-BER |
| 20 | (474, 554, 624, 764) | (20, 40, 60) | 2 | ODS-FER/BER |

TABLE 7

NEW ODS FEEDFORWARD TBCC WITH RATE ⅓ AND CONSTRAINT LENGTH V = 2

| K | G | WS | # permutation equivalent codes | Note |
|---|---|---|---|---|
| 3 | (1, 1, 5) | (4, 3, 3) | 12 | ODS-FER/BER |

TABLE 8

NEW ODS FEEDFORWARD TBCC WITH RATE ⅓ AND CONSTRAINT LENGTH V = 3

| K | G | WS | # permutation equivalent codes | Note |
|---|---|---|---|---|
| 7 | (4, 54, 74) | (8, 35, 91) | 8 | ODS-BER |
| 9 | (34, 54, 74) | (8, 9, 18) | 4 | ODS-FER |
| 9 | (24, 54, 64) | (8, 9, 9) | 2 | ODS-BER |

TABLE 9

NEW ODS FEEDFORWARD TBCC WITH RATE ⅓ AND CONSTRAINT LENGTH V = 4

| K | G | WS | # permutation equivalent codes | Note |
|---|---|---|---|---|
| 6 | (2, 16, 56) | (8, 45, 120) | 30 | ODS-FER/BER |
| 7 | (2, 46, 76) | (8, 21, 56) | 10 | ODS-FER/BER |
| 8 | (2, 56, 66) | (8, 1, 8) | 10 | ODS-FER/BER |
| 9 | (16, 46, 56) | (10, 99, 405) | 6 | ODS-FER/BER |
|   | (26, 52, 56) |   | 4 |   |
| 10 | (46, 66, 72) | (10, 46, 240) | 2 | ODS-FER |
| 10 | (26, 36, 46) | (10, 52, 220) | 8 | ODS-BER |
| 11 | (46, 62, 76) | (10, 11, 22) | 1 | ODS-FER |
| 11 | (16, 56, 72) | (10, 11, 22) | 3 | ODS-BER |
| 12 | (46, 52, 72) | (10, 12, 12) | 2 | ODS-BER |
| 15 | (46, 56, 72) | (11, 15, 15) | 2 | ODS-FER/BER |

TABLE 10

NEW ODS FEEDFORWARD TBCC WITH RATE ⅓ AND CONSTRAINT LENGTH V = 5

| K | G | WS | # permutation equivalent codes | Note |
|---|---|---|---|---|
| 6 | (1, 7, 53) | (8, 45, 120) | 156 | ODS-FER/BER |
| 7 | (1, 7, 57) | (8, 21, 56) | 124 | ODS-FER/BER |
| 8 | (1, 27, 66) | (8, 1, 8) | 52 | ODS-FER/BER |
| 9 | (1, 47, 75) | (10, 99, 333) | 24 | ODS-FER/BER |
| 10 | (33, 43, 53) | (10, 21, 90) | 4 | ODS-FER/BER |
| 12 | (13, 37, 53) | (12, 202, 1008) | 12 | ODS-BER |
| 17 | (47, 57, 65) | (13, 34, 68) | 2 | ODS-BER |

TABLE 11

NEW ODS FEEDFORWARD TBCC WITH RATE ⅓ AND CONSTRAINT LENGTH V = 6

| K | G | WS | # permutation equivalent codes | Note |
|---|---|---|---|---|
| 3 | (4, 4, 410) | (4, 3, 3) | 42984 | ODS-FER/BER |
| 6 | (4, 34, 530) | (8, 45, 120) | 1326 | ODS-FER/BER |
| 7 | (4, 34, 534) | (8, 21, 56) | 751 | ODS-FER/BER |
| 8 | (4, 134, 614) | (8, 1, 8) | 314 | ODS-FER/BER |
| 9 | (4, 74, 554) | (10, 99, 306) | 112 | ODS-FER/BER |
| 10 | (154, 214, 530) | (10, 21, 90) | 40 | ODS-FER |
| 10 | (4, 314, 674) | (10, 26, 80) | 28 | ODS-BER |
| 13 | (434, 574, 664) | (12, 39, 338) | 2 | ODS-FER |
| 13 | (104, 554, 574) | (12, 39, 156) | 6 | ODS-BER |
| 17 | (474, 634, 654) | (14, 51, 306) | 2 | ODS-FER |

TABLE 11-continued

NEW ODS FEEDFORWARD TBCC WITH RATE ⅓ AND CONSTRAINT LENGTH V = 6

| K | G | WS | # permutation equivalent codes | Note |
|---|---|---|---|---|
| 17 | (574, 654, 764) | (14, 51, 170) | 1 | ODS-BER |
| 21 | (464, 564, 674) | (15, 84, 210) | 2 | ODS-BER |
| 22 | (474, 564, 664) | (15, 66, 154) | 2 | ODS-BER |

TABLE 12

NEW ODS FEEDFORWARD TBCC WITH RATE ⅓ AND CONSTRAINT LENGTH V = 7

| K | G | WS | # permutation equivalent codes | Note |
|---|---|---|---|---|
| 4 | (2, 6, 406) | (6, 12, 24) | 200704 | ODS-FER/BER |
| 5 | (2, 16, 422) | (7, 15, 35) | 49000 | ODS-FER/BER |
| 6 | (2, 16, 452) | (8, 45, 120) | 10584 | ODS-FER/BER |
| 7 | (2, 16, 534) | (8, 21, 56) | 6318 | ODS-FER/BER |
| 8 | (2, 56, 432) | (8, 1, 8) | 1224 | ODS-FER/BER |
| 9 | (2, 36, 466) | (10, 99, 306) | 736 | ODS-FER/BER |
| 10 | (2, 216, 566) | (10, 21, 70) | 128 | ODS-FER/BER |
| 11 | (2, 456, 722) | (11, 33, 121) | 8 | ODS-FER/BER |
| 12 | (26, 126, 646) | (12, 178, 948) | 48 | ODS-FER |
| 12 | (2, 336, 516) | (12, 186, 732) | 32 | ODS-BER |
| 13 | (126, 232, 532) | (12, 39, 208) | 20 | ODS-FER |
| 13 | (276, 442, 776) | (12, 39, 130) | 4 | ODS-BER |
| 14 | (226, 422, 476) | (13, 112, 672) | 4 | ODS-FER |
| 14 | (566, 716, 736) | (13, 112, 616) | 2 | ODS-BER |
| 15 | (156, 332, 452) | (14, 330, 2535) | 12 | ODS-FER |
| 15 | (146, 316, 722) | (14, 375, 2280) | 12 | ODS-BER |
| 16 | (316, 336, 452) | (14, 64, 480) | 8 | ODS-FER/BER |
| 17 | (266, 512, 746) | (15, 238, 1700) | 4 | ODS-FER/BER |
| 18 | (256, 662, 746) | (16, 837, 7146) | 4 | ODS-FER/BER |
| 19 | (232, 632, 766) | (16, 342, 2090) | 4 | ODS-FER/BER |
| 20 | (452, 476, 756) | (16, 130, 1120) | 2 | ODS-FER |
| 20 | (456, 476, 666) | (16, 180, 920) | 2 | ODS-BER |
| 21 | (526, 572, 636) | (16, 63, 378) | 2 | ODS-FER |
| 21 | (422, 726, 736) | (16, 84, 273) | 2 | ODS-BER |
| 22 | (456, 626, 772) | (16, 22, 44) | 2 | ODS-FER |
| 22 | (476, 572, 632) | (16, 22, 44) | 2 | ODS-BER |
| 24 | (472, 562, 676) | (16, 24, 48) | 2 | ODS-FER |
| 24 | (462, 532, 736) | (16, 27, 48) | 2 | ODS-BER |
| 25 | (462, 532, 736) | (16, 25, 25) | 2 | ODS-FER/BER |
| 26 | (462, 532, 736) | (16, 26, 26) | 2 | ODS-FER/BER |

TABLE 13

NEW ODS FEEDFORWARD TBCC WITH RATE ½ AND CONSTRAINT LENGTH V = 2

| K | G | WS | # permutation equivalent codes | Note |
|---|---|---|---|---|
| 2 | (1, 4) | (2, 2, 2) | 5 | ODS-BER |
| 5 | (1, 7) | (4, 15, 30) | 3 | ODS-BER |
| 7 | (3, 7) | (4, 7, 14) | 2 | ODS-FER/BER |

TABLE 14

NEW ODS FEEDFORWARD TBCC WITH RATE ½ AND CONSTRAINT LENGTH V = 3

| K | G | WS | # permutation equivalent codes | Note |
|---|---|---|---|---|
| 2 | (4, 40) | (2, 2, 2) | 19 | ODS-BER |
| 5 | (4, 74) | (4, 10, 20) | 4 | ODS-FER/BER |
| 6 | (14, 70) | (4, 9, 24) | 2 | ODS-BER |
| 7 | (4, 74) | (4, 7, 14) | 4 | ODS-FER/BER |
| 12 | (34, 54) | (6, 64, 192) | 4 | ODS-BER |

TABLE 15

NEW ODS FEEDFORWARD TBCC WITH RATE ½ AND CONSTRAINT LENGTH V = 4

| K | G | WS | # permutation equivalent codes | Note |
|---|---|---|---|---|
| 2 | (2, 40) | (2, 2, 2) | 74 | ODS-BER |
| 5 | (2, 56) | (4, 10, 20) | 17 | ODS-FER/BER |
| 6 | (2, 56) | (4, 6, 12) | 10 | ODS-FER/BER |
| 7 | (2, 66) | (4, 7, 14) | 7 | ODS-FER/BER |
| 8 | (2, 56) | (5, 24, 56) | 10 | ODS-FER/BER |
| 9 | (16, 54) | (6, 102, 450) | 4 | ODS-FER/BER |
| 10 | (16, 54) | (6, 90, 390) | 4 | ODS-FER/BER |
| 16 | (46, 66) | (7, 64, 256) | 2 | ODS-BER |
| 18 | (46, 56) | (7, 54, 126) | 2 | ODS-FER/BER |
| 19 | (46, 66) | (7, 38, 76) | 2 | ODS-BER |
| 20 | (46, 66) | (7, 40, 80) | 2 | ODS-BER |
| 22 | (46, 66) | (7, 44, 88) | 2 | ODS-BER |
| 23 | (46, 66) | (7, 46, 92) | 2 | ODS-BER |

TABLE 16

NEW ODS FEEDFORWARD TBCC WITH RATE ½ AND CONSTRAINT LENGTH V = 5

| K | G | WS | # permutation equivalent codes | Note |
|---|---|---|---|---|
| 2 | (1, 40) | (2, 2, 2) | 292 | ODS-BER |
| 6 | (1, 53) | (4, 6, 12) | 16 | ODS-FER/BER |
| 7 | (1, 53) | (4, 7, 14) | 28 | ODS-FER/BER |
| 8 | (1, 53) | (5, 24, 56) | 16 | ODS-FER/BER |
| 9 | (7, 54) | (6, 102, 450) | 16 | ODS-FER/BER |
| 10 | (13, 53) | (6, 40, 180) | 6 | ODS-FER/BER |
| 12 | (23, 47) | (6, 20, 120) | 4 | ODS-FER/BER |
| 18 | (37, 53) | (8, 117, 684) | 4 | ODS-BER |
| 20 | (43, 73) | (8, 100, 340) | 2 | ODS-BER |
| 21 | (23, 67) | (8, 84, 189) | 4 | ODS-BER |
| 22 | (57, 63) | (8, 44, 132) | 2 | ODS-FER |
| 23 | (45, 77) | (8, 46, 92) | 2 | ODS-FER/BER |

TABLE 17

NEW ODS FEEDFORWARD TBCC WITH RATE ½ AND CONSTRAINT LENGTH V = 6

| K | G | WS | # permutation equivalent codes | Note |
|---|---|---|---|---|
| 5 | (4, 464) | (4, 10, 20) | 225 | ODS-FER/BER |
| 6 | (4, 530) | (4, 6, 12) | 82 | ODS-FER/BER |
| 7 | (4, 434) | (4, 7, 14) | 54 | ODS-FER/BER |
| 8 | (4, 434) | (5, 24, 56) | 50 | ODS-FER/BER |
| 9 | (4, 474) | (6, 102, 306) | 28 | ODS-FER/BER |
| 11 | (274, 574) | (7, 176, 880) | 4 | ODS-FER/BER |
|    | (474, 674) |                | 2 |             |
| 13 | (134, 670) | (7, 117, 611) | 4 | ODS-FER/BER |
| 15 | (114, 714) | (8, 450, 3120) | 6 | ODS-FER/BER |
| 17 | (374, 444) | (8, 187, 1156) | 2 | ODS-BER |
| 19 | (464, 744) | (8, 19, 190) | 2 | ODS-FER |
| 19 | (634, 734) | (8, 38, 190) | 2 | ODS-BER |

TABLE 18

NEW ODS FEEDFORWARD TBCC WITH RATE ½ AND CONSTRAINT LENGTH V = 7

| K | G | WS | # permutation equivalent codes | Note |
|---|---|---|---|---|
| 2 | (2, 400) | (2, 2, 2) | 4624 | ODS-BER |
| 6 | (2, 452) | (4, 6, 12) | 324 | ODS-FER/BER |
| 7 | (2, 434) | (4, 7, 14) | 348 | ODS-FER/BER |
| 8 | (2, 426) | (5, 24, 56) | 68 | ODS-FER/BER |
| 9 | (2, 456) | (6, 102, 306) | 40 | ODS-FER/BER |
| 10 | (2, 476) | (6, 40, 120) | 16 | ODS-FER/BER |
| 11 | (2, 556) | (7, 176, 616) | 16 | ODS-FER/BER |
| 13 | (56, 670) | (7, 117, 611) | 6 | ODS-FER/BER |
| 14 | (76, 654) | (8, 546, 3640) | 2 | ODS-FER/BER |
|    | (112, 472) |               | 6 |   |
|    | (256, 626) |               | 4 |   |
|    | (266, 602) |               | 4 |   |
|    | (316, 412) |               | 4 |   |
| 15 | (376, 412) | (8, 450, 2955) | 4 | ODS-FER/BER |
| 16 | (36, 564) | (8, 238, 1776) | 2 | ODS-FER/BER |
| 17 | (146, 534) | (8, 153, 1190) | 4 | ODS-FER |
| 17 | (176, 444) | (8, 187, 1156) | 2 | ODS-BER |
| 18 | (336, 646) | (8, 54, 468) | 4 | ODS-FER |
| 18 | (336, 676) | (8, 81, 432) | 4 | ODS-FER |
| 19 | (556, 736) | (8, 19, 152) | 2 | ODS-FER |
| 21 | (326, 576) | (10, 1722, 15771) | 4 | ODS-BER |
| 22 | (236, 626) | (10, 1298, 13112) | 4 | ODS-FER |
| 22 | (272, 634) | (10, 1364, 12914) | 4 | ODS-BER |
| 24 | (236, 652) | (10, 744, 6624) | 4 | ODS-BER |
| 26 | (276, 722) | (10, 143, 1118) | 4 | ODS-BER |
| 27 | (316, 466) | (10, 162, 567) | 4 | ODS-BER |
| 28 | (506, 772) | (10, 84, 224) | 2 | ODS-BER |
| 31 | (532, 746) | (10, 31, 124) | 2 | ODS-FER |
| 31 | (446, 756) | (10, 31, 62) | 2 | ODS-BER |
| 32 | (532, 746) | (10, 32, 128) | 2 | ODS-FER |
| 33 | (532, 746) | (10, 33, 132) | 2 | ODS-FER |
| 33 | (452, 766) | (10, 33, 66) | 2 | ODS-BER |
| 34 | (532, 746) | (10, 34, 136) | 2 | ODS-FER |
| 35 | (532, 746) | (10, 35, 140) | 2 | ODS-FER |
| 35 | (452, 766) | (10, 35, 70) | 2 | ODS-BER |
| 36 | (532, 746) | (10, 36, 144) | 2 | ODS-FER |
| 36 | (452, 766) | (10, 36, 72) | 2 | ODS-BER |
| 37 | (532, 746) | (10, 37, 148) | 2 | ODS-FER |
| 38 | (532, 746) | (10, 38, 152) | 2 | ODS-FER |

TABLE 19

NEW ODS FEEDFORWARD TBCC WITH RATE ½ AND CONSTRAINT LENGTH V = 8

| K | G | WS | # permutation equivalent codes | Note |
|---|---|---|---|---|
| 5 | (1, 407) | (4, 10, 20) | 3600 | ODS-FER/BER |
| 6 | (1, 423) | (4, 6, 12) | 1296 | ODS-FER/BER |
| 7 | (1, 415) | (4, 7, 14) | 1323 | ODS-FER/BER |
| 8 | (1, 426) | (5, 24, 56) | 624 | ODS-FER/BER |
| 9 | (1, 447) | (6, 102, 306) | 79 | ODS-FER/BER |
| 10 | (1, 476) | (6, 40, 120) | 4 | ODS-FER/BER |
| 11 | (1, 556) | (7, 176, 616) | 4 | ODS-FER/BER |
| 12 | (1, 573) | (8, 759, 3036) | 18 | ODS-FER/BER |
| 14 | (1, 727) | (8, 546, 2184) | 9 | ODS-FER/BER |
| 15 | (177, 412) | (8, 450, 2955) | 4 | ODS-FER/BER |
| 16 | (55, 727) | (8, 238, 1744) | 4 | ODS-FER |
| 16 | (1, 557) | (8, 372, 1456) | 18 | ODS-BER |
| 17 | (433, 473) | (8, 153, 952) | 2 | ODS-FER/BER |
| 18 | (647, 657) | (8, 54, 324) | 2 | ODS-FER |
| 18 | (537, 737) | (8, 63, 324) | 2 | ODS-BER |
| 19 | (357, 737) | (8, 19, 38) | 4 | ODS-FER/BER |
| 20 | (303, 433) | (9, 240, 2160) | 4 | ODS-FER/BER |
| 21 | (227, 615) | (10, 1680, 15729) | 4 | ODS-FER/BER |
| 22 | (133, 463) | (10, 1298, 11704) | 6 | ODS-BER |
| 24 | (475, 507) | (10, 456, 4320) | 2 | ODS-BER |
| 27 | (67, 745) | (10, 54, 162) | 8 | ODS-BER |
| 28 | (233, 635) | (11, 644, 7308) | 4 | ODS-BER |
| 29 | (233, 565) | (11, 319, 3277) | 4 | ODS-FER/BER |
| 32 | (235, 557) | (12, 1568, 15840) | 4 | ODS-BER |
| 38 | (457, 755) | (12, 380, 1520) | 2 | ODS-FER/BER |
| 39 | (463, 755) | (12, 429, 1482) | 2 | ODS-BER |
| 40 | (463, 755) | (12, 440, 1520) | 2 | ODS-BER |

TABLE 20

NEW ODS FEEDFORWARD TBCC WITH RATE ⅕ AND VARIOUS CONSTRAINT LENGTHS.

| K | V | G | WS | # permutation equivalent codes | Note |
|---|---|---|---|---|---|
| 12 | 2 | (5, 5, 7, 7, 7) | (13, 12, 12) | 1 | ODS-FER/BER |
| 12 | 3 | (54, 54, 64, 74, 74) | (16, 12, 24) | 2 | ODS-FER/BER |
| 12 | 4 | (52, 56, 66, 72, 76) | (20, 72, 216) | 1 | ODS-FER/BER |
| 12 | 5 | (37, 47, 55, 57, 65) | (22, 108, 504) | 4 | ODS-FER/BER |

TABLE 21

NEW ODS FEEDFORWARD TBCC WITH RATE ⅖ AND VARIOUS CONSTRAINT LENGTHS.

| K | V | G | WS | # permutation equivalent codes | Note |
|---|---|---|---|---|---|
| 12 | 3 | (54, 64, 74) p1 | (8, 51, 192) | 1 | ODS-FER/BER |
| 12 | 4 | (46, 56, 76) p1 (62, 72, 76) p1 | (8, 15, 66) | 1 1 | ODS-FER/BER |
| 12 | 5 | (43, 57, 64) p1 (13, 61, 75) p3 (32, 43, 57) p3 | (9, 78, 456) | 1 3 2 | ODS-FER/BER |
|  | 5 | (23, 55, 56) p2 | (8, 6, 36) | 4 | ODS-FER if p2 is used |
|  | 5 | (15, 57, 62) p2 | (8, 6, 6) | 3 | ODS-BER if p2 is used |

TABLE 21-continued

NEW ODS FEEDFORWARD TBCC WITH RATE ⅖ AND VARIOUS CONSTRAINT LENGTHS.

| K | V | G | WS | # permutation equivalent codes | Note |
|---|---|---|---|---|---|
| 12 | 6 | (464, 474, 670) p1 (544, 730, 744) p2 (334, 464, 474) p3 | (9, 72, 342) | 1 1 2 | ODS-FER/BER |
| 12 | 7 | (232, 236, 670) p1 (232, 334, 474) p2 (262, 730, 744) p2 (156, 232, 474) p3 (354, 362, 544) p3 | (9, 72, 342) | 5 3 1 6 1. | ODS-FER/BER |

13. The apparatus of claim 12, further comprising: plural shift register circuits, each of the shift register circuits being configured to implement a respective different one of plural optimum tail biting convolutional codes, each of the plural optimum tail biting convolutional codes being of a different rate and being expressed by a set of polynomials listed in any of Table 2-Table 21; a code activator configured to include one of the plural shift register circuits in a processing stream for a respective data transmission over the channel.

14. The apparatus of claim 13, wherein the shift register circuit comprises an encoder configured to append error correction information to data transmitted over the channel.

15. A method of operating a node of a communications network, the method comprising:

configuring a shift register circuit of the node to implement an optimum tail biting convolutional code expressed by a set of polynomials listed in any of Table 2-Table 21, the polynomials being shown in octal notation in column G of Table 2-Table 21:

TABLE 2

NEW ODS FEEDFORWARD TBCC WITH RATE ¼ AND CONSTRAINT LENGTH V = 2

| K | G | WS | # permutation equivalent codes | Note |
|---|---|---|---|---|
| 3 | (1, 1, 3, 5) | (6, 4, 6) | 30 | ODS-BER |
| 6 | (1, 3, 5, 7) | (8, 6, 6) | 6 | ODS-BER |
| 8 | (3, 5, 7, 7) | (10, 16, 24) | 2 | ODS-FER/BER |
| 9 | (3, 5, 7, 7) | (10, 18, 27) | 2 | ODS-FER/BER |

TABLE 3

NEW ODS FEEDFORWARD TBCC WITH RATE ¼ AND CONSTRAINT LENGTH V = 3

| K | G | WS | # permutation equivalent codes | Note |
|---|---|---|---|---|
| 3 | (4, 4, 14, 50) | (6, 4, 6) | 372 | ODS-BER |
| 9 | (44, 54, 64, 74) | (12, 12, 18) | 1 | ODS-BER |

TABLE 4

NEW ODS FEEDFORWARD TBCC WITH RATE ¼ AND CONSTRAINT LENGTH V = 4

| K | G | WS | # permutation equivalent codes | Note |
|---|---|---|---|---|
| 3 | (2, 2, 6, 42) | (6, 4, 6) | 5238 | ODS-BER |
| 5 | (2, 6, 16, 52) | (9, 10, 20) | 1058 | ODS-FER/BER |
| 6 | (2, 6, 26, 76) | (10, 9, 18) | 120 | ODS-FER/BER |
| 10 | (26, 36, 46, 56) | (14, 30, 60) | 8 | ODS-FER/BER |
| 11 | (46, 52, 56, 76) | (15, 22, 66) | 2 | ODS-BER |

TABLE 5

NEW ODS FEEDFORWARD TBCC WITH RATE 1/4 AND CONSTRAINT LENGTH V = 5

| K | G | WS | # permutation equivalent codes | Note |
|---|---|---|---|---|
| 3 | (1, 1, 3, 41) | (6, 4, 6) | 78273 | ODS-BER |
| 5 | (1, 3, 7, 52) | (9, 10, 20) | 17596 | ODS-FER/BER |
| 6 | (1, 3, 13, 57) | (10, 9, 18) | 2352 | ODS-FER/BER |
| 8 | (1, 23, 45, 77) | (12, 8, 16) | 72 | ODS-FER/BER |
| 9 | (13, 17, 23, 56) | (14, 72, 261) | 60 | ODS-FER/BER |
| 10 | (27, 47, 57, 61) | (16, 285, 1350) | 4 | ODS-FER/BER |
| 14 | (45, 53, 73, 77) | (18, 84, 364) | 2 | ODS-BER |
| 16 | (47, 53, 67, 75) | (18, 48, 96) | 2 | ODS-FER |
| 16 | (45, 53, 73, 77) | (18, 48, 80) | 2 | ODS-BER |
| 17 | (47, 53, 67, 75) | (18, 51, 102) | 2 | ODS-FER |
| 17 | (45, 53, 73, 77) | (18, 51, 85) | 2 | ODS-BER |
| 18 | (47, 53, 67, 75) | (18, 54, 108) | 2 | ODS-FER |
| 18 | (45, 53, 73, 77) | (18, 54, 90) | 2 | ODS-BER |
| 19 | (45, 57, 67, 75) | (18, 57, 95) | 2 | ODS-FER/BER |
| 20 | (45, 57, 67, 75) | (18, 60, 100) | 2 | ODS-FER/BER |
| 21 | (45, 57, 67, 75) | (18, 63, 105) | 2 | ODS-FER/BER |
| 24 | (45, 57, 67, 75) | (18, 72, 120) | 2 | ODS-FER/BER |

TABLE 6

NEW ODS FEEDFORWARD TBCC WITH RATE 1/4 AND CONSTRAINT LENGTH V = 6

| K | G | WS | # permutation equivalent codes | Note |
|---|---|---|---|---|
| 2 | (4, 4, 4, 410) | (5, 2, 2) | 1279360 | ODS-FER/BER |
| 3 | (4, 4, 14, 430) | (6, 3, 6) | 791712 | ODS-FER |
|  | (4, 4, 14, 410) | (6, 4, 6) | 1209060 | ODS-BER |
| 4 | (4, 14, 24, 414) | (8, 11, 24) | 460800 | ODS-FER/BER |
| 5 | (4, 14, 34, 444) | (9, 10, 20) | 281250 | ODS-FER/BER |
| 6 | (4, 14, 54, 570) | (10, 9, 18) | 36408 | ODS-FER/BER |
| 7 | (4, 34, 174, 524) | (12, 28, 84) | 6339 | ODS-FER/BER |
| 8 | (4, 34, 114, 674) | (12, 8, 16) | 1256 | ODS-FER/BER |
| 9 | (4, 274, 454, 764) | (14, 72, 234) | 112 | ODS-FER/BER |
| 10 | (4, 374, 454, 534) | (16, 285, 1140) | 28 | ODS-FER/BER |
| 11 | (204, 214, 724, 774) | (16, 66, 286) | 12 | ODS-FER/BER |
| 12 | (424, 474, 704, 724) | (17, 60, 324) | 2 | ODS-FER |
| 12 | (224, 324, 354, 554) | (17, 72, 312) | 16 | ODS-BER |
| 13 | (134, 564, 634, 724) | (19, 325, 1963) | 6 | ODS-FER/BER |
| 14 | (114, 534, 664, 764) | (19, 182, 1106) | 6 | ODS-FER/BER |

TABLE 6-continued

NEW ODS FEEDFORWARD TBCC WITH RATE 1/4 AND CONSTRAINT LENGTH V = 6

| K | G | WS | # permutation equivalent codes | Note |
|---|---|---|---|---|
| 15 | (464, 534, 564, 674) | (20, 285, 1815) | 2 | ODS-FER |
| 15 | (444, 654, 674, 734) | (20, 288, 1800) | 2 | ODS-BER |
| 16 | (454, 554, 724, 774) | (20, 64, 224) | 2 | ODS-FER/BER |
| 17 | (454, 474, 724, 754) | (20, 34, 51) | 2 | ODS-FER/BER |
| 18 | (474, 554, 624, 764) | (20, 36, 54) | 2 | ODS-FER |
| 18 | (454, 474, 724, 754) | (20, 36, 54) | 2 | ODS-BER |
| 20 | (474, 554, 624, 764) | (20, 40, 60) | 2 | ODS-FER/BER |

TABLE 7

NEW ODS FEEDFORWARD TBCC WITH RATE 1/3 AND CONSTRAINT LENGTH V = 2

| K | G | WS | # permutation equivalent codes | Note |
|---|---|---|---|---|
| 3 | (1, 1, 5) | (4, 3, 3) | 12 | ODS-FER/BER |

TABLE 8

NEW ODS FEEDFORWARD TBCC WITH RATE 1/3 AND CONSTRAINT LENGTH V = 3

| K | G | WS | # permutation equivalent codes | Note |
|---|---|---|---|---|
| 7 | (4, 54, 74) | (8, 35, 91) | 8 | ODS-BER |
| 9 | (34, 54, 74) | (8, 9, 18) | 4 | ODS-FER |
| 9 | (24, 54, 64) | (8, 9, 9) | 2 | ODS-BER |

TABLE 9

NEW ODS FEEDFORWARD TBCC WITH RATE 1/3 AND CONSTRAINT LENGTH V = 4

| K | G | WS | # permutation equivalent codes | Note |
|---|---|---|---|---|
| 6 | (2, 16, 56) | (8, 45, 120) | 30 | ODS-FER/BER |
| 7 | (2, 46, 76) | (8, 21, 56) | 10 | ODS-FER/BER |
| 8 | (2, 56, 66) | (8, 1, 8) | 10 | ODS-FER/BER |
| 9 | (16, 46, 56) | (10, 99, 405) | 6 | ODS-FER/BER |
|  | (26, 52, 56) |  | 4 |  |
| 10 | (46, 66, 72) | (10, 46, 240) | 2 | ODS-FER |
| 10 | (26, 36, 46) | (10, 52, 220) | 8 | ODS-BER |
| 11 | (46, 62, 76) | (10, 11, 22) | 1 | ODS-FER |
| 11 | (16, 56, 72) | (10, 11, 22) | 3 | ODS-BER |
| 12 | (46, 52, 72) | (10, 12, 12) | 2 | ODS-BER |
| 15 | (46, 56, 72) | (11, 15, 15) | 2 | ODS-FER/BER |

TABLE 10

NEW ODS FEEDFORWARD TBCC WITH RATE 1/3 AND CONSTRAINT LENGTH V = 5

| K | G | WS | # permutation equivalent codes | Note |
|---|---|---|---|---|
| 6 | (1, 7, 53) | (8, 45, 120) | 156 | ODS-FER/BER |
| 7 | (1, 7, 57) | (8, 21, 56) | 124 | ODS-FER/BER |
| 8 | (1, 27, 66) | (8, 1, 8) | 52 | ODS-FER/BER |
| 9 | (1, 47, 75) | (10, 99, 333) | 24 | ODS-FER/BER |
| 10 | (33, 43, 53) | (10, 21, 90) | 4 | ODS-FER/BER |
| 12 | (13, 37, 53) | (12, 202, 1008) | 12 | ODS-BER |
| 17 | (47, 57, 65) | (13, 34, 68) | 2 | ODS-BER |

TABLE 11

NEW ODS FEEDFORWARD TBCC WITH RATE 1/3 AND CONSTRAINT LENGTH V = 6

| K | G | WS | # permutation equivalent codes | Note |
|---|---|---|---|---|
| 3 | (4, 4, 410) | (4, 3, 3) | 42984 | ODS-FER/BER |
| 6 | (4, 34, 530) | (8, 45, 120) | 1326 | ODS-FER/BER |
| 7 | (4, 34, 534) | (8, 21, 56) | 751 | ODS-FER/BER |
| 8 | (4, 134, 614) | (8, 1, 8) | 314 | ODS-FER/BER |
| 9 | (4, 74, 554) | (10, 99, 306) | 112 | ODS-FER/BER |
| 10 | (154, 214, 530) | (10, 21, 90) | 40 | ODS-FER |
| 10 | (4, 314, 674) | (10, 26, 80) | 28 | ODS-BER |
| 13 | (434, 574, 664) | (12, 39, 338) | 2 | ODS-FER |
| 13 | (104, 554, 574) | (12, 39, 156) | 6 | ODS-BER |
| 17 | (474, 634, 654) | (14, 51, 306) | 2 | ODS-FER |
| 17 | (574, 654, 764) | (14, 51, 170) | 1 | ODS-BER |
| 21 | (464, 564, 674) | (15, 84, 210) | 2 | ODS-BER |
| 22 | (474, 564, 664) | (15, 66, 154) | 2 | ODS-BER |

TABLE 12

NEW ODS FEEDFORWARD TBCC WITH RATE 1/3 AND CONSTRAINT LENGTH V = 7

| K | G | WS | # permutation equivalent codes | Note |
|---|---|---|---|---|
| 4 | (2, 6, 406) | (6, 12, 24) | 200704 | ODS-FER/BER |
| 5 | (2, 16, 422) | (7, 15, 35) | 49000 | ODS-FER/BER |
| 6 | (2, 16, 452) | (8, 45, 120) | 10584 | ODS-FER/BER |
| 7 | (2, 16, 534) | (8, 21, 56) | 6318 | ODS-FER/BER |
| 8 | (2, 56, 432) | (8, 1, 8) | 1224 | ODS-FER/BER |
| 9 | (2, 36, 466) | (10, 99, 306) | 736 | ODS-FER/BER |
| 10 | (2, 216, 566) | (10, 21, 70) | 128 | ODS-FER/BER |
| 11 | (2, 456, 722) | (11, 33, 121) | 8 | ODS-FER/BER |
| 12 | (26, 126, 646) | (12, 178, 948) | 48 | ODS-FER |
| 12 | (2, 336, 516) | (12, 186, 732) | 32 | ODS-BER |
| 13 | (126, 232, 532) | (12, 39, 208) | 20 | ODS-FER |
| 13 | (276, 442, 776) | (12, 39, 130) | 4 | ODS-BER |
| 14 | (226, 422, 476) | (13, 112, 672) | 4 | ODS-FER |
| 14 | (566, 716, 736) | (13, 112, 616) | 2 | ODS-BER |
| 15 | (156, 332, 452) | (14, 330, 2535) | 12 | ODS-FER |
| 15 | (146, 316, 722) | (14, 375, 2280) | 12 | ODS-BER |
| 16 | (316, 336, 452) | (14, 64, 480) | 8 | ODS-FER/BER |
| 17 | (266, 512, 746) | (15, 238, 1700) | 4 | ODS-FER/BER |
| 18 | (256, 662, 746) | (15, 837, 7146) | 4 | ODS-FER/BER |
| 19 | (232, 632, 766) | (16, 342, 2090) | 4 | ODS-FER/BER |
| 20 | (452, 476, 756) | (16, 130, 1120) | 2 | ODS-FER |
| 20 | (456, 476, 666) | (16, 180, 920) | 2 | ODS-BER |
| 21 | (526, 572, 636) | (16, 63, 378) | 2 | ODS-FER |
| 21 | (422, 726, 736) | (16, 84, 273) | 2 | ODS-BER |
| 22 | (456, 626, 772) | (16, 22, 44) | 2 | ODS-FER |
| 22 | (476, 572, 632) | (16, 22, 44) | 2 | ODS-BER |
| 24 | (472, 562, 676) | (16, 24, 48) | 2 | ODS-FER |
| 24 | (462, 532, 736) | (16, 27, 48) | 2 | ODS-BER |
| 25 | (462, 532, 736) | (16, 25, 25) | 2 | ODS-FER/BER |
| 26 | (462, 532, 736) | (16, 26, 26) | 2 | ODS-FER/BER |

TABLE 13

NEW ODS FEEDFORWARD TBCC WITH RATE 1/2 AND CONSTRAINT LENGTH V = 2

| K | G | WS | # permutation equivalent codes | Note |
|---|---|---|---|---|
| 2 | (1, 4) | (2, 2, 2) | 5 | ODS-BER |
| 5 | (1, 7) | (4, 15, 30) | 3 | ODS-BER |
| 7 | (3, 7) | (4, 7, 14) | 2 | ODS-FER/BER |

TABLE 14

NEW ODS FEEDFORWARD TBCC WITH RATE 1/2 AND CONSTRAINT LENGTH V = 3

| K | G | WS | # permutation equivalent codes | Note |
|---|---|---|---|---|
| 2 | (4, 40) | (2, 2, 2) | 19 | ODS-BER |
| 5 | (4, 74) | (4, 10, 20) | 4 | ODS-FER/BER |
| 6 | (14, 70) | (4, 9, 24) | 2 | ODS-BER |
| 7 | (4, 74) | (4, 7, 14) | 4 | ODS-FER/BER |
| 12 | (34, 54) | (6, 64, 192) | 4 | ODS-BER |

TABLE 15

NEW ODS FEEDFORWARD TBCC WITH RATE 1/2 AND CONSTRAINT LENGTH V = 4

| K | G | WS | # permutation equivalent codes | Note |
|---|---|---|---|---|
| 2 | (2, 40) | (2, 2, 2) | 74 | ODS-BER |
| 5 | (2, 56) | (4, 10, 20) | 17 | ODS-FER/BER |
| 6 | (2, 56) | (4, 6, 12) | 10 | ODS-FER/BER |
| 7 | (2, 66) | (4, 7, 14) | 7 | ODS-FER/BER |
| 8 | (2, 56) | (5, 24, 56) | 10 | ODS-FER/BER |
| 9 | (16, 54) | (6, 102, 450) | 4 | ODS-FER/BER |
| 10 | (16, 54) | (6, 90, 390) | 4 | ODS-FER/BER |
| 16 | (46, 66) | (7, 64, 256) | 2 | ODS-BER |
| 18 | (46, 56) | (7, 54, 126) | 2 | ODS-FER/BER |
| 19 | (46, 66) | (7, 38, 76) | 2 | ODS-BER |
| 20 | (46, 66) | (7, 40, 80) | 2 | ODS-BER |
| 22 | (46, 66) | (7, 44, 88) | 2 | ODS-BER |
| 23 | (46, 66) | (7, 46, 92) | 2 | ODS-BER |

TABLE 16

NEW ODS FEEDFORWARD TBCC WITH RATE 1/2 AND CONSTRAINT LENGTH V = 5

| K | G | WS | # permutation equivalent codes | Note |
|---|---|---|---|---|
| 2 | (1, 40) | (2, 2, 2) | 292 | ODS-BER |
| 6 | (1, 53) | (4, 6, 12) | 16 | ODS-FER/BER |
| 7 | (1, 53) | (4, 7, 14) | 28 | ODS-FER/BER |
| 8 | (1, 53) | (5, 24, 56) | 16 | ODS-FER/BER |
| 9 | (7, 54) | (6, 102, 450) | 16 | ODS-FER/BER |
| 10 | (13, 53) | (6, 40, 180) | 6 | ODS-FER/BER |
| 12 | (23, 47) | (6, 20, 120) | 4 | ODS-FER/BER |
| 18 | (37, 53) | (8, 117, 684) | 4 | ODS-BER |
| 20 | (43, 73) | (8, 100, 340) | 2 | ODS-BER |
| 21 | (23, 67) | (8, 84, 189) | 4 | ODS-BER |
| 22 | (57, 63) | (8, 44, 132) | 2 | ODS-FER |
| 23 | (45, 77) | (8, 46, 92) | 2 | ODS-FER/BER |

TABLE 17

NEW ODS FEEDFORWARD TBCC WITH RATE 1/2 AND CONSTRAINT LENGTH V = 6

| K | G | WS | # permutation equivalent codes | Note |
|---|---|---|---|---|
| 5 | (4, 464) | (4, 10, 20) | 225 | ODS-FER/BER |
| 6 | (4, 530) | (4, 6, 12) | 82 | ODS-FER/BER |
| 7 | (4, 434) | (4, 7, 14) | 54 | ODS-FER/BER |
| 8 | (4, 434) | (5, 24, 56) | 50 | ODS-FER/BER |
| 9 | (4, 474) | (6, 102, 306) | 28 | ODS-FER/BER |
| 11 | (274, 574) | (7, 176, 880) | 4 | ODS-FER/BER |
| | (474, 674) | | 2 | |
| 13 | (134, 670) | (7, 117, 611) | 4 | ODS-FER/BER |
| 15 | (114, 714) | (8, 450, 3120) | 6 | ODS-FER/BER |
| 17 | (374, 444) | (8, 187, 1156) | 2 | ODS-BER |
| 19 | (464, 744) | (8, 19, 190) | 2 | ODS-FER |
| 19 | (634, 734) | (8, 38, 190) | 2 | ODS-BER |

TABLE 18

NEW ODS FEEDFORWARD TBCC WITH RATE 1/2 AND CONSTRAINT LENGTH V = 7

| K | G | WS | # permutation equivalent codes | Note |
|---|---|---|---|---|
| 2 | (2, 400) | (2, 2, 2) | 4624 | ODS-BER |
| 6 | (2, 452) | (4, 6, 12) | 324 | ODS-FER/BER |
| 7 | (2, 434) | (4, 7, 14) | 348 | ODS-FER/BER |
| 8 | (2, 426) | (5, 24, 56) | 68 | ODS-FER/BER |
| 9 | (2, 456) | (6, 102, 306) | 40 | ODS-FER/BER |
| 10 | (2, 476) | (6, 40, 120) | 16 | ODS-FER/BER |
| 11 | (2, 556) | (7, 176, 616) | 16 | ODS-FER/BER |
| 13 | (56, 670) | (7, 117, 611) | 6 | ODS-FER/BER |
| 14 | (76, 654) | (8, 546, 3640) | 2 | ODS-FER/BER |
| | (112, 472) | | 6 | |
| | (256, 626) | | 4 | |
| | (266, 602) | | 4 | |
| | (316, 412) | | 4 | |
| 15 | (376, 412) | (8, 450, 2955) | 4 | ODS-FER/BER |
| 16 | (36, 564) | (8, 238, 1776) | 2 | ODS-FER/BER |
| 17 | (146, 534) | (8, 153, 1190) | 4 | ODS-FER |
| 17 | (176, 444) | (8, 187, 1156) | 2 | ODS-BER |
| 18 | (336, 646) | (8, 54, 468) | 4 | ODS-FER |
| 18 | (336, 676) | (8, 81, 432) | 4 | ODS-FER |
| 19 | (556, 736) | (8, 19, 152) | 2 | ODS-FER |
| 21 | (326, 576) | (10, 1722, 15771) | 4 | ODS-BER |
| 22 | (236, 626) | (10, 1298, 13112) | 4 | ODS-FER |

TABLE 18-continued

NEW ODS FEEDFORWARD TBCC WITH RATE 1/2 AND CONSTRAINT LENGTH V = 7

| K | G | WS | # permutation equivalent codes | Note |
|---|---|---|---|---|
| 22 | (272, 634) | (10, 1364, 12914) | 4 | ODS-BER |
| 24 | (236, 652) | (10, 744, 6624) | 4 | ODS-BER |
| 26 | (276, 722) | (10, 143, 1118) | 4 | ODS-BER |
| 27 | (316, 466) | (10, 162, 567) | 4 | ODS-BER |
| 28 | (506, 772) | (10, 84, 224) | 2 | ODS-BER |
| 31 | (532, 746) | (10, 31, 124) | 2 | ODS-FER |
| 31 | (446, 756) | (10, 31, 62) | 2 | ODS-BER |
| 32 | (532, 746) | (10, 32, 128) | 2 | ODS-FER |
| 33 | (532, 746) | (10, 33, 132) | 2 | ODS-FER |
| 33 | (452, 766) | (10, 33, 66) | 2 | ODS-BER |
| 34 | (532, 746) | (10, 34, 136) | 2 | ODS-FER |
| 35 | (532, 746) | (10, 35, 140) | 2 | ODS-FER |
| 35 | (452, 766) | (10, 35, 70) | 2 | ODS-BER |
| 36 | (532, 746) | (10, 36, 144) | 2 | ODS-FER |
| 36 | (452, 766) | (10, 36, 72) | 2 | ODS-BER |
| 37 | (532, 746) | (10, 37, 148) | 2 | ODS-FER |
| 38 | (532, 746) | (10, 38, 152) | 2 | ODS-FER |

TABLE 19

NEW ODS FEEDFORWARD TBCC WITH RATE 1/2 AND CONSTRAINT LENGTH V = 8

| K | G | WS | # permutation equivalent codes | Note |
|---|---|---|---|---|
| 5 | (1, 407) | (4, 10, 20) | 3600 | ODS-FER/BER |
| 6 | (1, 423) | (4, 6, 12) | 1296 | ODS-FER/BER |
| 7 | (1, 415) | (4, 7, 14) | 1323 | ODS-FER/BER |
| 8 | (1, 426) | (5, 24, 56) | 624 | ODS-FER/BER |
| 9 | (1, 447) | (6, 102, 306) | 79 | ODS-FER/BER |
| 10 | (1, 476) | (6, 40, 120) | 4 | ODS-FER/BER |
| 11 | (1, 556) | (7, 176, 616) | 4 | ODS-FER/BER |
| 12 | (1, 573) | (8, 759, 3036) | 18 | ODS-FER/BER |
| 14 | (1, 727) | (8, 546, 2184) | 9 | ODS-FER/BER |
| 15 | (177, 412) | (8, 450, 2955) | 4 | ODS-FER/BER |
| 16 | (55, 727) | (8, 238, 1744) | 4 | ODS-FER |
| 16 | (1, 557) | (8, 372, 1456) | 18 | ODS-BER |
| 17 | (433, 473) | (8, 153, 952) | 2 | ODS-FER/BER |
| 18 | (647, 657) | (8, 54, 324) | 2 | ODS-FER |
| 18 | (537, 737) | (8, 63, 324) | 2 | ODS-BER |
| 19 | (357, 737) | (8, 19, 38) | 4 | ODS-FER/BER |
| 20 | (303, 433) | (9, 240, 2160) | 4 | ODS-FER/BER |
| 21 | (227, 615) | (10, 1680, 15729) | 4 | ODS-FER/BER |
| 22 | (133, 463) | (10, 1298, 11704) | 6 | ODS-BER |
| 24 | (475, 507) | (10, 456, 4320) | 2 | ODS-BER |
| 27 | (67, 745) | (10, 54, 162) | 8 | ODS-BER |
| 28 | (233, 635) | (11, 644, 7308) | 4 | ODS-BER |
| 29 | (233, 565) | (11, 319, 3277) | 4 | ODS-FER/BER |
| 32 | (235, 557) | (12, 1568, 15840) | 4 | ODS-BER |
| 38 | (457, 755) | (12, 380, 1520) | 2 | ODS-FER/BER |
| 39 | (463, 755) | (12, 429, 1482) | 2 | ODS-BER |
| 40 | (463, 755) | (12, 440, 1520) | 2 | ODS-BER |

TABLE 20

NEW ODS FEEDFORWARD TBCC WITH RATE ⅓ AND VARIOUS CONSTRAINT LENGTHS.

| K | V | G | WS | # permutation equivalent codes | Note |
|---|---|---|---|---|---|
| 12 | 2 | (5, 5, 7, 7,7) | (13, 12, 12) | 1 | ODS-FER/BER |
| 12 | 3 | (54, 54, 64, 74, 74) | (16, 12, 24) | 2 | ODS-FER/BER |
| 12 | 4 | (52, 56, 66, 72, 76) | (20, 72, 216) | 1 | ODS-FER/BER |
| 12 | 5 | (37, 47, 55, 57, 65) | (22, 108, 504) | 4 | ODS-FER/BER |

TABLE 21

NEW ODS FEEDFORWARD TBCC WITH RATE ⅔ AND VARIOUS CONSTRAINT LENGTHS.

| K | V | G | WS | # permutation equivalent codes | Note |
|---|---|---|---|---|---|
| 12 | 3 | (54, 64, 74) p1 | (8, 51, 192) | 1 | ODS-FER/BER |
| 12 | 4 | (46, 56, 76) p1 | (8, 15, 66) | 1 | ODS-FER/BER |
|  |  | (62, 72, 76) p1 |  | 1 |  |
| 12 | 5 | (43, 57, 64) p1 | (9, 78, 456) | 1 | ODS-FER/BER |
|  |  | (13, 61, 75) p3 |  | 3 |  |
|  |  | (32, 43, 57) p3 |  | 2 |  |
|  | 5 | (23, 55, 56) p2 | (8, 6, 36) | 4 | ODS-FER if p2 is used |
|  | 5 | (15, 57, 62) p2 | (8, 6, 6) | 3 | ODS-BER if p2 is used |
| 12 | 6 | (464, 474, 670) p1 | (9, 72, 342) | 1 | ODS-FER/BER |
|  |  | (544, 730, 744) p2 |  | 1 |  |
|  |  | (334, 464, 474) p3 |  | 2 |  |
| 12 | 7 | (232, 236, 670) p1 | (9, 72, 342) | 5 | ODS-FER/BER |
|  |  | (232, 334, 474) p2 |  | 3 |  |
|  |  | (262, 730, 744) p2 |  | 1 |  |
|  |  | (156, 232, 474) p3 |  | 6 |  |
|  |  | (354, 362, 544) p3 |  | 1 |  | and,
using the optimum tail biting convolutional code to operate on data transmitted over a channel of the communications network.

16. The method of claim 15, further comprising using the optimum tail biting convolutional code to perform error correction encoding of data transmitted over the channel of the communications network.

\* \* \* \* \*